(12) United States Patent
Jang

(10) Patent No.: US 9,851,937 B2
(45) Date of Patent: Dec. 26, 2017

(54) ELECTRONIC DEVICE, METHOD OF CONTROLLING VOLUME OF THE ELECTRONIC DEVICE, AND METHOD OF CONTROLLING THE ELECTRONIC DEVICE

(71) Applicant: SAMSUNG ELECTRONICS CO., LTD., Suwon-si (KR)

(72) Inventor: Sang-yoon Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 220 days.

(21) Appl. No.: 14/827,572

(22) Filed: Aug. 17, 2015

(65) Prior Publication Data
US 2016/0103653 A1    Apr. 14, 2016

(30) Foreign Application Priority Data
Oct. 14, 2014    (KR) .................... 10-2014-0138621

(51) Int. Cl.
G06F 3/16 (2006.01)
H03G 3/02 (2006.01)
H03G 3/30 (2006.01)

(52) U.S. Cl.
CPC .............. G06F 3/165 (2013.01); H03G 3/02 (2013.01); H03G 3/3005 (2013.01)

(58) Field of Classification Search
None
See application file for complete search history.

(56) References Cited

U.S. PATENT DOCUMENTS

| 6,678,362 | B2* | 1/2004 | Hong ............... H04M 1/215 |
| | | | 379/102.03 |
| 7,149,512 | B2* | 12/2006 | Connor ........... H04M 1/72533 |
| | | | 455/41.2 |
| 7,369,185 | B2* | 5/2008 | Kitamura .............. H04N 5/60 |
| | | | 348/738 |
| 8,181,218 | B2* | 5/2012 | Asmussen ............ H04N 7/147 |
| | | | 348/552 |
| 8,942,694 | B2 | 1/2015 | Woo |

(Continued)

FOREIGN PATENT DOCUMENTS

JP    2007214976 A    8/2007
KR    20000004279 A    1/2000
(Continued)

Primary Examiner — Paul Huber
(74) Attorney, Agent, or Firm — Sughrue Mion, PLLC

(57) ABSTRACT

Provided is a method of adjusting volume of an audio signal output from an electronic device, the method including: connecting the electronic device and a mobile terminal; receiving, by the electronic device, at least one of setting information regarding adjusting of the volume of the audio signal and usage history information of the at least one mobile terminal; receiving, by the electronic device, event generation information from the at least one mobile terminal; determining, by the electronic device, a volume adjusting operation to be performed on the audio signal based on the at least one of the setting information and the usage history information, and the event generation information; and adjusting the volume of the audio signal according to the volume adjusting operation.

46 Claims, 70 Drawing Sheets

(56) References Cited

U.S. PATENT DOCUMENTS

| | | | |
|---|---|---|---|
| 2004/0256474 A1* | 12/2004 | Park | ................. F24F 11/001 236/51 |
| 2007/0076131 A1* | 4/2007 | Li | ..................... H04N 5/60 348/738 |
| 2013/0010195 A1* | 1/2013 | Daioku | ............ H04N 21/4333 348/552 |
| 2013/0171981 A1 | 7/2013 | Woo | |

FOREIGN PATENT DOCUMENTS

| | | |
|---|---|---|
| KR | 20030069156 A | 8/2003 |
| KR | 1020040093782 A | 11/2004 |
| KR | 1020050063396 A | 6/2005 |
| KR | 200428033 Y1 | 10/2006 |
| KR | 101037397 B1 | 5/2011 |
| WO | 2012036475 A2 | 3/2012 |

* cited by examiner

| USER | WHETHER AUTOMATIC VOLUME ADJUSTING FUNCTION IS APPLIED | ADJUSTMENT LEVEL |
|---|---|---|
| FIRST USER | APPLIED | FIRST USER LEVEL (ex. 0) |
| SECOND USER | APPLIED | SECOND USER LEVEL (ex. 2) |
| THIRD USER | APPLIED | THIRD USER LEVEL (ex. 4) |
| UNREGISTERED USER | APPLIED | STANDARD LEVEL (ex. 6) |

| PROGRAM GENRE | WHETHER AUTOMATIC VOLUME ADJUSTING FUNCTION IS APPLIED | ADJUSTMENT LEVEL |
|---|---|---|
| NEWS | NOT APPLIED | - |
| SERIES | APPLIED | FIRST GENRE LEVEL (ex. 2) |
| VARIETY SHOWS | APPLIED | SECOND GENRE LEVEL (ex. 4) |
| SPORTS | NOT APPLIED | - |
| CARTOONS | APPLIED | THIRD GENRE LEVEL (ex. 2) |
| CURRENT AFFAIRS AND EDUCATION | NOT APPLIED | - |

| PROGRAM | WHETHER AUTOMATIC VOLUME ADJUSTING FUNCTION IS APPLIED | ADJUSTMENT LEVEL |
|---|---|---|
| CNN NEWSROOM | NOT APPLIED | – |
| THE WALKING DEAD | APPLIED | FIRST PROGRAM LEVEL (ex. 2) |
| SATURDAY NIGHT LIVE | APPLIED | SECOND PROGRAM LEVEL (ex. 4) |
| 2014 WORLD SERIES | NOT APPLIED | – |
| SPONGEBOB | APPLIED | THIRD PROGRAM LEVEL (ex. 2) |
| THE DEBATES | NOT APPLIED | – |

| CHANNEL | WHETHER AUTOMATIC VOLUME ADJUSTING FUNCTION IS APPLIED | ADJUSTMENT LEVEL |
| --- | --- | --- |
| Ch. 6 | NOT APPLIED | - |
| Ch. 7 | APPLIED | FIRST CHANNEL LEVEL (ex. 2) |
| Ch. 9 | APPLIED | SECOND CHANNEL LEVEL (ex. 4) |
| Ch. 10 | NOT APPLIED | - |
| Ch. 11 | APPLIED | THIRD CHANNEL LEVEL (ex. 2) |

| TIMESLOT | WHETHER AUTOMATIC VOLUME ADJUSTING FUNCTION IS APPLIED | ADJUSTMENT LEVEL |
| --- | --- | --- |
| 00:00 ~ 06:00 | NOT APPLIED | – |
| 06:00 ~ 12:00 | APPLIED | FIRST TIMESLOT LEVEL (ex. 2) |
| 12:00 ~ 18:00 | NOT APPLIED | – |
| 18:00 ~ 24:00 | APPLIED | SECOND TIMESLOT LEVEL (ex. 2) |

| TRANSMITTER | WHETHER AUTOMATIC VOLUME ADJUSTING FUNCTION IS APPLIED | ADJUSTMENT LEVEL |
| --- | --- | --- |
| FIRST TRANSMITTER | APPLIED | FIRST TRANSMITTER LEVEL (ex. 0) |
| SECOND TRANSMITTER | APPLIED | SECOND TRANSMITTER LEVEL (ex. 1) |
| THIRD TRANSMITTER | APPLIED | THIRD TRANSMITTER LEVEL (ex. 2) |
| FOURTH TRANSMITTER | APPLIED | FOURTH TRANSMITTER LEVEL (ex. 3) |

ELECTRONIC DEVICE, METHOD OF CONTROLLING VOLUME OF THE ELECTRONIC DEVICE, AND METHOD OF CONTROLLING THE ELECTRONIC DEVICE

CROSS-REFERENCE TO RELATED APPLICATION

This application claims priority from Korean Patent Application No. 10-2014-0138621, filed on Oct. 14, 2014, in the Korean Intellectual Property Office, the disclosure of which is incorporated herein by reference in its entirety.

BACKGROUND

1. Field

Apparatuses and methods consistent with exemplary embodiments relate to an electronic device and a method of automatically adjusting volume of the electronic device.

2. Description of the Related Art

A telephone ring or vibratory sound of a mobile phone may not be heard due to an audio signal output from other media reproducing apparatus, such as a television (TV), while content is being reproduced by the media reproducing apparatus, and also, even while a user is talking on the mobile phone, reception sound of the mobile phone may not be heard well due to the volume of the audio signal output from the media reproducing apparatus. At this time, the user has to adjust the volume of the audio signal output from the media reproducing apparatus by using a remote controller or the like. Also, if the user does not hear the telephone ring or vibratory sound and does not personally adjust the volume of the audio signal, the user may be unable to answer the mobile phone.

SUMMARY

One or more exemplary embodiments provide an electronic device for automatically adjusting volume of an audio signal output from the electronic device, and a method of adjusting volume of the electronic device.

One or more exemplary embodiments provide a mobile terminal capable of controlling an electronic device to automatically adjust volume of an audio signal output from the electronic device, and a method of controlling, by the mobile terminal, the electronic device.

According to an aspect of an exemplary embodiment, there is provided a method of adjusting volume of an audio signal output from an electronic device, the method including: connecting the electronic device and at least one mobile terminal; receiving at least one of setting information regarding adjusting of the volume of the audio signal and usage history information of the at least one mobile terminal; receiving event generation information from the at least one mobile terminal; determining a volume adjusting operation to be performed on the audio signal based on the at least one of the setting information and the usage history information, and the event generation information; and adjusting the volume of the audio signal according to the volume adjusting operation.

The event generation information may include at least one of a call reception notification, a message reception notification, and a notification from an application installed in at least one mobile terminal.

The setting information may include at least one of general volume adjusting information and individual volume adjusting information regarding the at least one mobile terminal.

The general volume adjusting information may include an adjustment level of the volume of the audio signal when the event generation information is received regardless of a type of the at least one mobile terminal.

The individual volume adjusting information may include at least one of information about whether to apply a situational automatic volume adjusting operation and a situational adjustment level. The individual volume adjusting information may include at least one of adjusting information per user, adjusting information per program, adjusting information per channel, adjusting information per program genre, adjusting information per timeslot, and adjusting information per transmitter.

The at least one mobile terminal may include a plurality of mobile terminals, and the adjusting information per user may include priority information about the volume adjusting operation with respect to a plurality of users respectively using the plurality of mobile terminals.

The determining of the volume adjusting operation may include, when the event generation information is received, determining to adjust the volume of the audio signal to a first user level for a first user having a higher priority and adjust the volume of the audio signal to a second user level lower than the first user level for a second user having a lower priority, based on the adjusting information per user.

The usage history information may include at least one of a call history list, a missed call list, a blocked call list, a contact list, and a favorites list of the at least one mobile terminal.

The determining of the volume adjusting operation may include: when the event generation information is received, storing the volume of the audio signal at a point of time when the event generation information is received as a first level; and adjusting the volume of the audio signal to a second level according to at least one of the setting information and the usage history information.

The adjusting of the volume may include: comparing the first level and the second level; when the first level is higher than the second level, changing the volume of the audio signal from the first level to the second level; and when the first level is lower than or equal to the second level, maintaining the volume of the audio signal at the first level.

The method may further include: receiving event termination information from the at least one mobile terminal; and re-adjusting the volume of the audio signal to the first level according to the event termination information.

The method may further include: receiving forced termination information commanding to terminate the volume adjusting operation; and re-adjusting the volume of the audio signal to the first level according to the forced termination information.

The method may further include, when a first time that has passed after the volume of the audio signal is adjusted to the second level is equal to or higher than a threshold time, re-adjusting the volume of the audio signal to the first level.

The method may further include displaying the event generation information based on at least one of the setting information and the usage history information.

The method may further include receiving a user input commanding to perform the volume adjusting operation according to the displayed event generation information, wherein the determining of the volume adjusting operation may include determining the volume adjusting operation according to the received user input.

The receiving of the event generation information may include receiving the event generation information and at least one of identification (ID) information of the at least one mobile terminal and transmitter information from the at least one mobile terminal, and the displaying of the event generation information may further include displaying the at least one of the ID information and the transmitter information.

The ID information may include at least one of a phone number of the at least one mobile terminal, an address assigned to the at least one mobile terminal, a name of a user using the at least one mobile terminal, and a nickname of the user, and the transmitter information may include at least one of a phone number of the transmitter, a photo, a name, and a nickname of the transmitter, which are stored in the at least one mobile terminal.

The method may further include: receiving a user input commanding to continue the volume adjusting operation according to the displayed event generation information; and re-adjusting the volume of the audio signal according to the received user input.

The connecting may include: receiving ID information from the at least one mobile terminal; and registering the at least one mobile terminal in a connection terminal list by storing the received ID information.

The ID information may include at least one of a phone number of the at least one mobile terminal, an address assigned to the at least one mobile terminal, a name of a user using the at least one mobile terminal, and a nickname of the user.

The determining of the volume adjusting operation may include, when the event generation information is received from a mobile terminal that is not registered in the connection terminal list, determining to adjust the volume of the audio signal to a standard level.

The adjusting of the volume may include: comparing a first level, which is the volume of the audio signal at a point of time when the event generation information is received, with the standard level; when the first level is higher than the standard level, changing the volume of the audio signal from the first level to the standard level; and when the first level is lower than or equal to the standard level, maintaining the volume of the audio signal at the first level.

The method may further include estimating a distance between the electronic device and the at least one mobile terminal, wherein the determining of the volume adjusting operation may include determining the volume adjusting operation to be performed on the audio signal based on at least one of the setting information and the usage history, the event generation information, and the estimated distance.

The connecting of the electronic device and the at least one mobile terminal may include connecting the electronic device and the at least one mobile terminal via Bluetooth or Wi-Fi.

According to an aspect of another exemplary embodiment, there is provided a method of controlling, by a mobile terminal, at least one electronic device to adjust volume of an audio signal output from the at least one electronic device, the method including: when an event is generated, determining a volume adjusting operation to be performed on the audio signal based on usage history information of the mobile terminal; connecting the mobile terminal and the at least one electronic device; and transmitting information about the volume adjusting operation and event generation information to the at least one electronic device.

The event generation information may include at least one of a call reception notification, a message reception notification, and a notification from an application installed in the mobile terminal.

The usage history information may include at least one of a call history list, a missed call list, a blocked call list, a contact list, and a favorites list of the mobile terminal.

The method may further include transmitting at least one of identification (ID) information of the mobile terminal and transmitter information to the at least one electronic device.

The ID information may include at least one of a phone number of the mobile terminal, an address assigned to the mobile terminal, a name of a user using the mobile terminal, and a nickname of the user.

The method may further include transmitting at least one of event termination information and information commanding to re-adjust the volume of the audio signal to the at least one electronic device.

The method may further include receiving setting information regarding adjusting of the volume of the audio signal, wherein the determining of the volume adjusting operation may include determining the volume adjusting operation based on at least one of the usage history information and the setting information.

The setting information may include at least one of general volume adjusting information and individual volume adjusting information.

According to an aspect of another exemplary embodiment, there is provided a method of controlling, by a server, at least one electronic device to adjust volume of an audio signal output from the at least one electronic device, the method including: receiving at least one of setting information regarding adjusting of the volume of the audio signal and usage history information of at least one mobile terminal; receiving event generation information from the at least one mobile terminal; determining a volume adjusting operation to be performed on the audio signal based on at least one of the setting information and the usage history information, and the event generation information; and transmitting information about the volume adjusting operation to the at least one electronic device.

According to an aspect of another exemplary embodiment, there is provided an electronic device including: a communication unit that receives event generation information from at least one mobile terminal by communicating with the at least one mobile terminal; a user input unit that receives setting information regarding adjusting of volume of an audio signal; and a controller that determines a volume adjusting operation to be performed on the audio signal based on the setting information and the event generation information; and an audio output unit that outputs the audio signal according to the volume adjusting operation.

The communication unit may further receive usage history information from the at least one mobile terminal, and when the event generation information is received, the controller may determine the volume adjusting operation based on the setting information and the usage history information.

When the event generation information is received, the controller may store the volume of the audio signal at a point of time when the event generation information is received as a first level and adjusts the volume of the audio signal to a second level according to the setting information.

The controller may re-adjust the volume of the audio signal to the first level when event termination information is received from the at least one mobile terminal or forced termination information is received from a user.

The controller may re-adjust the volume of the audio signal to the first level when a first time that has passed after the volume of the audio signal is adjusted to the second level is equal to or higher than a threshold time.

The electronic device may further include a display unit that displays the event generation information.

The user input unit may further receive a user input commanding to perform the volume adjusting operation according to the event generation information, and the controller may determine the volume adjusting operation based on the setting information, the event generation information, and the user input.

The communication unit may further receive identification (ID) information of the at least one mobile terminal and transmitter information from the at least one mobile terminal, and the display unit may display at least one of the ID information and the transmitter information, and the event generation information.

The communication unit may register the at least one mobile terminal in a connection terminal list by receiving ID information from the at least one mobile terminal and storing the received ID information.

When the event generation information is received from a mobile terminal that is not registered in the connection terminal list, the controller may adjust the volume of the audio signal to a standard level.

According to an aspect of another exemplary embodiment, there is provided a mobile terminal which controls at least one electronic device to adjust volume of an audio signal output from the at least one electronic device, the mobile terminal including: a controller that determines a volume adjusting operation to be performed on the audio signal based on usage history information of the mobile terminal when an event is generated; and a communication unit that transmits information about the volume adjusting operation and event generation information to the at least one electronic device.

The mobile terminal may further include a user input unit that receives setting information regarding adjusting of the volume of the audio signal, wherein, when the event is generated, the controller may determine the volume adjusting operation based on at least one of the usage history information and the setting information.

The communication unit may further transmit at least one of identification (ID) information of the mobile terminal, the usage history information, and event termination information.

According to one or more exemplary embodiments, a non-transitory computer-readable recording medium has recorded thereon a program, which when executed by a computer, performs the method of adjusting the volume of the audio signal.

According to one or more exemplary embodiments, a non-transitory computer-readable recording medium has recorded thereon a program, which when executed by a computer, performs the method of controlling the electronic device.

According to an aspect of another exemplary embodiment, there is provided a method of adjusting volume of an audio signal output from an electronic device, the method including: connecting the electronic device and a mobile terminal; receiving, by the electronic device, at least one of setting information regarding adjusting of the volume of the audio signal and usage history information of the mobile terminal; receiving, by the electronic device, event generation information from the mobile terminal; determining, by the electronic device, a volume adjusting operation to be performed on the audio signal based on the at least one of the setting information and the usage history information, and the event generation information; and adjusting the volume of the audio signal according to the volume adjusting operation.

The event generation information may include at least one of a call reception notification, a message reception notification, and a notification from an application installed in the mobile terminal.

The setting information may include at least one of general volume adjusting information and individual volume adjusting information.

The general volume adjusting information may include information regarding an adjustment level of the volume of the audio signal in response to the electronic device receiving the event generation information regardless of a type of the mobile terminal.

The individual volume adjusting information may include at least one of information about whether to apply the volume adjusting operation and a situational adjustment level to be applied in the volume adjusting operation.

The individual volume adjusting information may include at least one of adjusting information per user of the mobile device, adjusting information per program of the electronic device, adjusting information per channel of the electronic device, adjusting information per program genre of the electronic device, adjusting information per timeslot, and adjusting information per transmitter.

The mobile terminal may include a plurality of mobile terminals, and the adjusting information per user may include priority information with respect to a plurality of users respectively using the plurality of mobile terminals and the volume adjusting operation based on the priority information.

The determining the volume adjusting operation may include, in response to the event generation information being received, determining priority amongst the plurality of users based on the priority information of the adjusting information per user and adjusting the volume of the audio signal to a first user level corresponding to an adjustment level for a first user having a higher priority than remaining users of the plurality of users.

The usage history information may include at least one of a call history list, a missed call list, a blocked call list, a contact list, and a favorites list of the mobile terminal.

The determining the volume adjusting operation may include: in response to the event generation information being received, storing the volume of the audio signal at a point of time when the event generation information is received as a first level; and setting the volume of the audio signal to be adjusted to as a second level according to at least one of the setting information and the usage history information.

The adjusting of the volume may include: comparing the first level and the second level; in response to the first level being higher than the second level, changing the volume of the audio signal from the first level to the second level; and in response to the first level being lower than or equal to the second level, maintaining the volume of the audio signal at the first level.

The method may further include: receiving event termination information from the mobile terminal; and re-adjusting the volume of the audio signal to the first level in response to receiving the event termination information.

The method may further include: receiving forced termination information commanding to terminate the volume adjusting operation; and re-adjusting the volume of the audio signal to the first level in response to receiving the forced termination information.

The method may further include, in response to a duration of time that has passed after the volume of the audio signal is adjusted to the second level from the first level being greater than or equal to a threshold time, re-adjusting the volume of the audio signal to the first level.

The method may further include displaying the event generation information, by the electronic device, based on at least one of the setting information and the usage history information.

The method may further include receiving, by the electronic device, a user input commanding to perform the volume adjusting operation based on the displayed event generation information, wherein the determining the volume adjusting operation may include determining the volume adjusting operation according to the received user input.

The receiving the event generation information may include receiving the event generation information and at least one of identification (ID) information of the mobile terminal and transmitter information from the mobile terminal, and the displaying the event generation information may further include displaying, by the electronic device, the at least one of the ID information and the transmitter information.

The ID information may include at least one of a phone number of the mobile terminal, an address assigned to the mobile terminal, a name of a user using the mobile terminal, and a nickname of the user, and the transmitter information may include at least one of a phone number of the transmitter, a photo, a name, and a nickname of the transmitter, which are stored in the mobile terminal.

The method may further include: receiving a user input commanding to perform the volume adjusting operation according to the displayed event generation information; and adjusting the volume of the audio signal according to the received user input.

The connecting may include: receiving, by the electronic device, ID information from the mobile terminal; and registering, by the electronic device, the mobile terminal in a connection terminal list by storing the received ID information.

The ID information may include at least one of a phone number of the mobile terminal, an address assigned to the mobile terminal, a name of a user using the mobile terminal, and a nickname of the user.

The determining the volume adjusting operation may include, in response to the event generation information being received from a mobile terminal that is not registered in the connection terminal list, determining to adjust the volume of the audio signal to a standard level.

The adjusting of the volume may include: comparing a first level, which is the volume of the audio signal at a point of time when the event generation information is received by the electronic device, with the standard level; in response to the first level being higher than the standard level, changing the volume of the audio signal from the first level to the standard level; and in response to the first level being lower than or equal to the standard level, maintaining the volume of the audio signal at the first level.

The method may further include estimating a distance between the electronic device and the mobile terminal, wherein the determining the volume adjusting operation may include determining the volume adjusting operation to be performed on the audio signal based on at least one of the setting information and the usage history, the event generation information, and the estimated distance.

The connecting the electronic device and the mobile terminal may include connecting the electronic device and the mobile terminal via Bluetooth or Wi-Fi.

According to an aspect of another exemplary embodiment, there is provided a method of controlling, by a mobile terminal, an electronic device to adjust volume of an audio signal output from the electronic device, the method including: in response to an event occurring in the mobile terminal, determining a volume adjusting operation to be performed on the audio signal of the electronic device based on usage history information of the mobile terminal; connecting the mobile terminal and the electronic device; and transmitting information about the volume adjusting operation and event generation information to the electronic device.

The event generation information may include at least one of a call reception notification in the mobile terminal, a message reception notification in the mobile terminal, and a notification from an application installed in the mobile terminal.

The usage history information may include at least one of a call history list, a missed call list, a blocked call list, a contact list, and a favorites list of the mobile terminal.

The method may further include transmitting at least one of identification (ID) information of the mobile terminal and transmitter information to the electronic device.

The ID information may include at least one of a phone number of the mobile terminal, an address assigned to the mobile terminal, a name of a user using the mobile terminal, and a nickname of the user.

The method may further include transmitting at least one of event termination information and information commanding to re-adjust the volume of the audio signal to the electronic device.

The method may further include receiving setting information regarding adjusting of the volume of the audio signal, wherein the determining the volume adjusting operation may include determining the volume adjusting operation based on at least one of the usage history information and the setting information.

The setting information may include at least one of general volume adjusting information and individual volume adjusting information.

According to an aspect of another exemplary embodiment, there is provided a method of controlling, by a server, an electronic device to adjust volume of an audio signal output from the electronic device, the method including: receiving, by the server, at least one of setting information regarding adjusting of the volume of the audio signal and usage history information of a mobile terminal; receiving, by the server, event generation information from the mobile terminal; determining, by the server, a volume adjusting operation to be performed on the audio signal to be output from the electronic device based on at least one of the setting information and the usage history information, and the event generation information; and transmitting, by the server, information about the volume adjusting operation to the electronic device.

According to an aspect of another exemplary embodiment, there is provided an electronic device including: a communicator configured to be in communication with a mobile terminal and to receive event generation information from the mobile terminal; a user input receiver configured to receive setting information regarding adjusting of volume of an audio signal of the electronic device; and a controller configured to determine a volume adjusting operation to be performed on the audio signal based on the setting information and the event generation information; and an audio outputter configured to output the audio signal according to the volume adjusting operation.

The communicator may further be configured to receive usage history information from the mobile terminal, and in response to the event generation information being received by the electronic device, the controller is configured to determine the volume adjusting operation based on the setting information and the usage history information.

In response to the event generation information being received, the controller is configured to store the volume of the audio signal at a point of time when the event generation information is received as a first level and configured to adjust the volume of the audio signal to a second level according to the setting information.

The controller may be configured to re-adjust the volume of the audio signal to the first level in response to event termination information being received by the electronic device from the mobile terminal or forced termination information is received by the electronic device from a user.

The controller may be configured to re-adjust the volume of the audio signal to the first level in response to a time duration that has passed after the volume of the audio signal is adjusted to the second level being greater than or equal to a threshold time.

The electronic device may further include a display configured to display the event generation information.

The user input receiver may be further configured to receive a user input commanding to perform the volume adjusting operation according to the event generation information, and wherein the controller may be configured to determine the volume adjusting operation based on the setting information, the event generation information, and the user input.

The communicator may be further configured to receive identification (ID) information of the mobile terminal and transmitter information from the mobile terminal, and wherein the display may be configured to display at least one of the ID information and the transmitter information, and the event generation information.

The communicator may be configured to register the mobile terminal in a connection terminal list by receiving ID information from the mobile terminal and storing the received ID information.

In response to the event generation information being received from a mobile terminal that is not registered in the connection terminal list, the controller may be configured to adjust the volume of the audio signal to a standard level.

According to an aspect of another exemplary embodiment, there is provided a mobile terminal which controls an electronic device to adjust volume of an audio signal output from the electronic device, the mobile terminal including: a controller configured to determine a volume adjusting operation to be performed on the audio signal based on usage history information of the mobile terminal in response to an event being generated; and a communicator configured to transmit information about the volume adjusting operation and event generation information to the electronic device.

The mobile terminal may further include a user input receiver configured to receive setting information regarding adjusting of the volume of the audio signal, wherein, in response to the event being generated, the controller may be configured to determine the volume adjusting operation based on at least one of the usage history information and the setting information.

The communicator may further be configured to transmit at least one of identification (ID) information of the mobile terminal, the usage history information, and event termination information.

BRIEF DESCRIPTION OF THE DRAWINGS

The above and/or other aspects of the disclosure will become apparent and more readily appreciated from the following description of the exemplary embodiments, taken in conjunction with the accompanying drawings in which:

FIG. 8 illustrates an example of setting information of FIG. 4;

FIG. 10 illustrates an example of setting information of FIG. 4;

FIG. 12 illustrates an example of setting information of FIG. 4;

FIG. 14 illustrates an example of setting information of FIG. 4;

FIG. 16 illustrates an example of setting information of FIG. 4;

FIG. 18 illustrates an example of setting information of FIG. 4;

DETAILED DESCRIPTION

Figure 1:
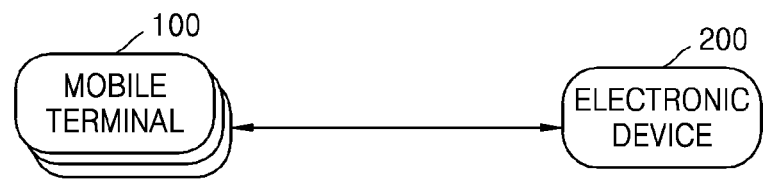
FIG. 1 is a diagram of a system for adjusting volume, according to an exemplary embodiment.

Terms used herein will now be briefly described and then one or more exemplary embodiments will be described in detail.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

When a part "includes" or "comprises" an element, unless there is a particular description contrary thereto, the part can further include other elements, not excluding the other elements. In the following description, terms such as "unit" and "module" indicate a unit for processing at least one function or operation, wherein the unit and the block may be embodied as hardware or software or embodied by combining hardware and software.

Expressions such as "at least one of," when preceding a list of elements, modify the entire list of elements and do not modify the individual elements of the list.

Hereinafter, one or more exemplary embodiments will be described more fully with reference to the accompanying drawings to be easily executed by one of ordinary skill in the art. The one or more exemplary embodiments may, however, be embodied in many different forms and should not be construed as limited thereto. In drawings, elements irrelevant to description are not shown for clear description, and like elements denote like reference numerals throughout the specification.

FIG. 1 is a diagram of a system 10 for adjusting volume according to an exemplary embodiment.

Referring to FIG. 1, the system 10 may include at least one mobile terminal 100 and an electronic device 200. Although not shown in FIG. 1, according to an exemplary embodiment, the system 10 may further include a server.

The at least one mobile terminal 100 may be connected to the electronic device 200 via a wireless communication. In the exemplary embodiment, the at least one mobile terminal 100 may be connected to the electronic device 200 via Bluetooth or wireless fidelity (Wi-Fi). However, the exemplary embodiment is not limited thereto, and according to an exemplary embodiment, the at least one mobile terminal 100 may be connected to the electronic device 200 via a wireless communication, such as home radio frequency (RF), high rate wireless personal area network (HR WPAN), ultra wideband (UWB), low rate WPAN (LR WPAN), or IEEE 1394.

The electronic device 200 may output an audio signal. Specifically, the electronic device 200 may reproduce various types of content including an audio signal, and may be referred to as a media reproducing apparatus. For example, the electronic device 200 may reproduce video content (such as a TV program image or video-on-demand (VOD)), a personal image (such as user-created content (UCC), a music video, or YouTube image), still image content (such as a photo or a drawing), music content (such as music, a musical program, or a radio broadcast), an application (such as a game or a video call), or text content (such as a map, an electronic book, a letter, a business file, or a webpage).

According to the exemplary embodiment, the electronic device 200 may automatically adjust volume of an audio signal when the at least one mobile terminal 100 receives event generation information, such as a call reception notification. According to an exemplary embodiment, the electronic device 200 may automatically adjust the volume of the audio signal based on setting information regarding adjusting of the volume of the audio signal. According to an exemplary embodiment, the electronic device 200 may automatically adjust the volume of the audio signal based on usage history information of the at least one mobile terminal 100. According to an exemplary embodiment, the electronic device 200 may display event generation information and automatically adjust the volume of the audio signal based on a user input received based on the event generation information.

Figure 2:
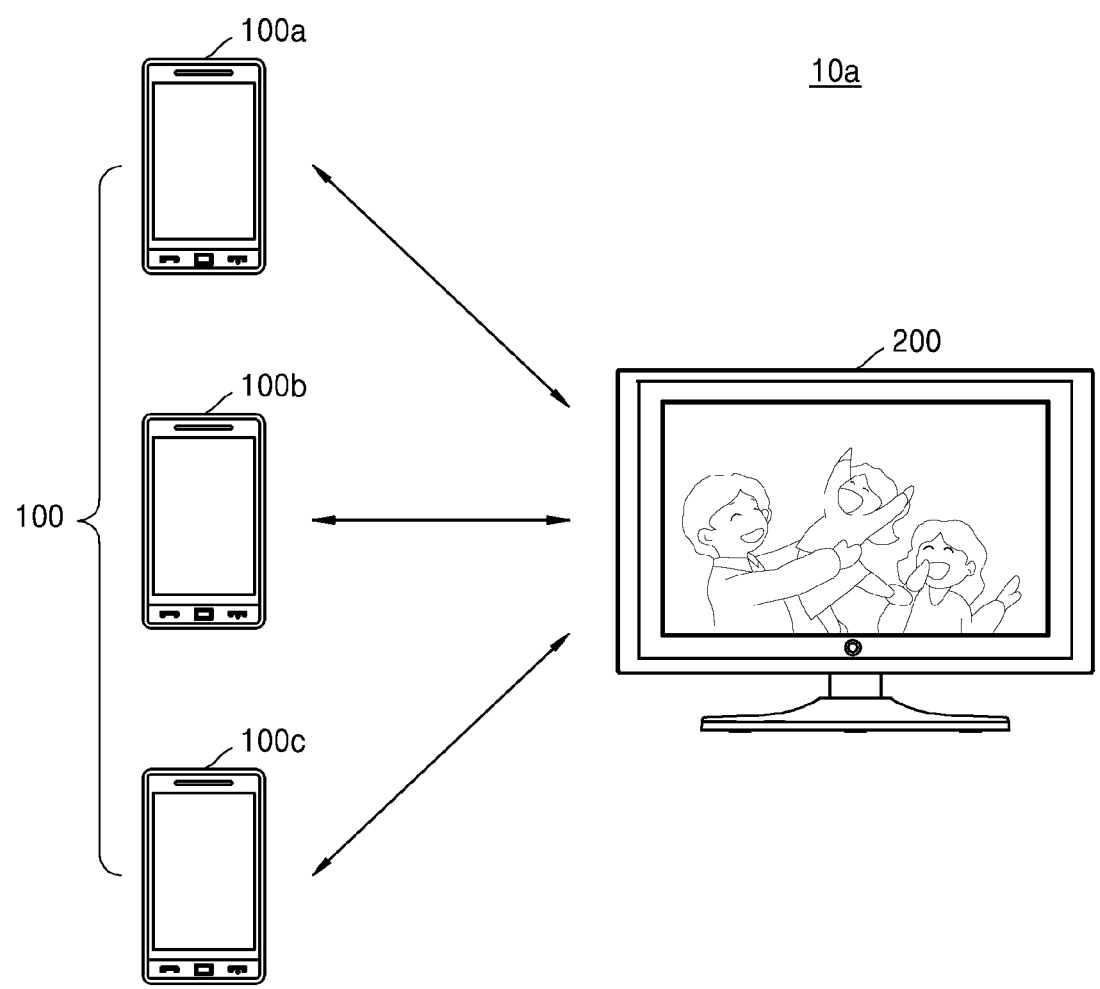
FIG. 2 is a diagram of a system for adjusting volume, as an example of the system of FIG. 1.

FIG. 2 is a diagram of a system 10a for adjusting volume as an example of the system 10 of FIG. 1.

Referring to FIG. 2, the system 10a may include first through third mobile terminals 100a through 100c and the electronic device 200.

The first through third mobile terminals 100a through 100c may each be a smart phone or a tablet personal computer (PC). However, the types of the mobile terminals 100a through 100c are not limited thereto, and according to an exemplary embodiment, the mobile terminals 100a through 100c may each be an arbitrary terminal for providing event generation information. Also, a number of mobile terminals is not limited to three (3) as in FIG. 2, and the system 100a may include any number of mobile terminals.

The electronic device 200 may be a smart television (TV), an internet protocol TV (IPTV), a digital TV (DTV), a computer, a digital broadcasting terminal, an audio reproducing apparatus, a tablet PC, or a navigation. In the exemplary embodiment, the smart TV is a multifunctional TV in which an internet accessing function is combined to a TV and various applications are installed in the TV such that various functions, such as web surfing, VOD watching, social networking service (SNS), and games, are usable. However, the type of the electronic device 200 is not limited thereto, and according to an exemplary embodiment, the electronic device 200 may be an arbitrary device capable of outputting an audio signal. Also, a number of electronic devices is not limited to one, and according to an exemplary embodiment, the system 10a may include one or more electronic devices.

Figure 3:
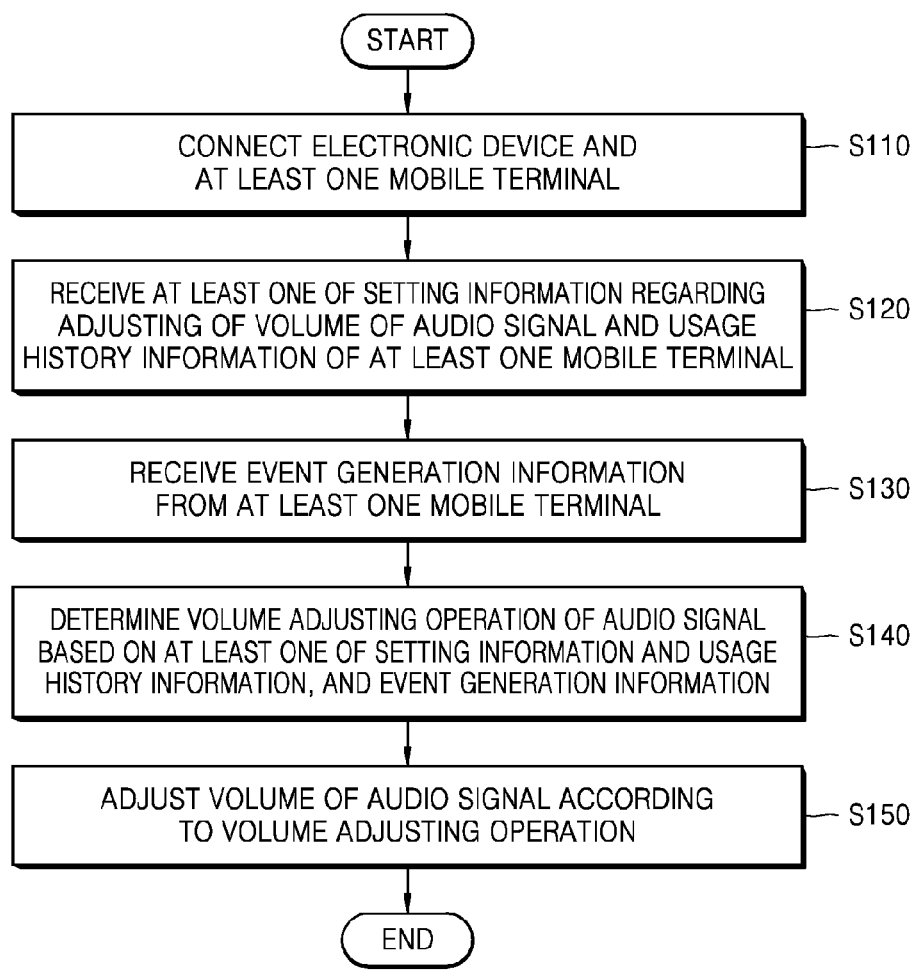
FIG. 3 is a flowchart of a method of adjusting volume, according to an exemplary embodiment.

FIG. 3 is a flowchart of a method of adjusting volume according to an exemplary embodiment.

Referring to FIG. 3, the method according to the exemplary embodiment is a method of adjusting volume of an audio signal output from an electronic device, and the method includes following operations that are performed by the electronic device. For example, the method according to the exemplary embodiment may include operations that are performed in time-series by the electronic device 200 included in the system 10 of FIG. 1. Hereinafter, unless stated otherwise, the mobile terminal 100 may be any one of the first through third mobile terminals 100a through 100c disclosed in FIG. 2.

In operation S110, an electronic device and at least one mobile terminal are connected to each other. That is, the mobile terminal 100 and the electronic device establish connection (e.g., communication connection) between each other. For example, the electronic device 200 may be connected to the mobile terminal 100 via wireless communication, such as connection via Bluetooth or Wi-Fi.

In operation S120, at least one of setting information regarding adjusting of volume of an audio signal and usage history information of the at least one mobile terminal is received by the electronic device 200. For example, the electronic device 200 may receive the setting information through a user interface (UI). Alternatively, the electronic device 200 may receive the setting information from a server. Also, the electronic device 200 may receive the usage history information from the mobile terminal 100.

In operation S130, event generation information is received from the at least one mobile terminal. For example, the electronic device 200 may receive the event generation information including, for example, a call reception notification, a message reception notification, or a notification from an application installed in the mobile terminal 100, from the mobile terminal 100.

In operation S140, a volume adjusting operation of the audio signal is determined based on at least one of the setting information and the usage history information, and the event generation information. For example, when the event generation information is received, the electronic device 200 may determine an adjustment level of the audio signal such that the volume of the audio signal is reduced from the current volume based on at least one of the setting information and the usage history information.

In operation S150, the volume of the audio signal is adjusted according to the determined volume adjusting operation. For example, the electronic device 200 may reduce the volume of the audio signal according to the determined adjustment level. Accordingly, the electronic device 100 may detect generation of an event in the mobile terminal 100 and automatically adjust volume the output of the audio signal without a user having to directly control the electronic device 200 by using, for example, a remote controller.

Figure 4:
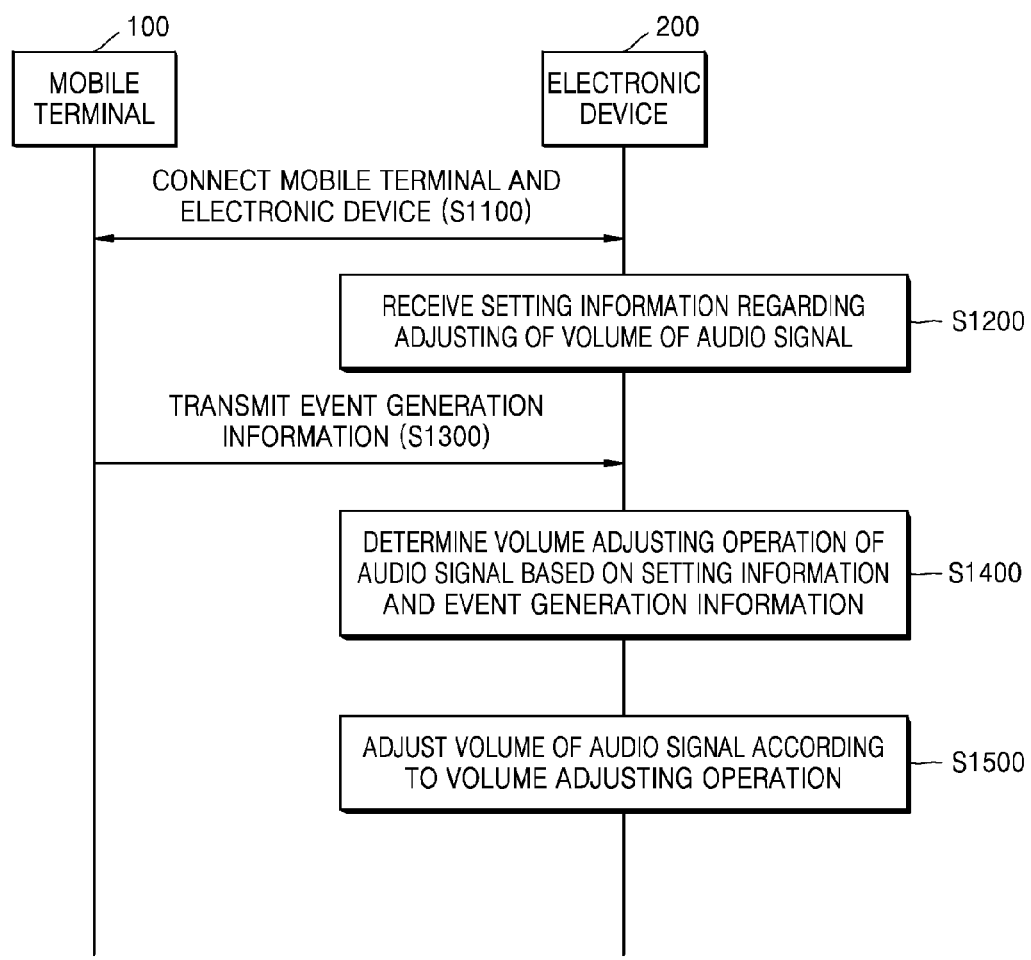
FIG. 4 is a flowchart of an example of operations of a system for adjusting volume according to the method of FIG. 3.

FIG. 4 is a flowchart of an example of operations of a system for adjusting volume according to the method of FIG. 3.

Referring to FIG. 4, the method according to the exemplary embodiment is a method of adjusting volume of an audio signal of an electronic device 200 based on setting information, and includes operations that are performed in time-series by the mobile terminal 100 and the electronic device 200 included in the system 10 of FIG. 1. Accordingly, even if omitted, details about the system 10 of FIG. 1 may also be applied to the method according to the exemplary embodiment.

In operation S1100, the mobile terminal 100 and the electronic device 200 are connected to each other. That is, the mobile terminal 100 and the electronic device establish connection (e.g., communication connection) between each other. For example, the mobile terminal 100 and the electronic device 200 may be connected to each other via Bluetooth or Wi-Fi.

In operation S1200, the electronic device 200 receives setting information regarding adjusting of volume of an audio signal. In the exemplary embodiment, the setting information may include one of general volume adjusting information and individual volume adjusting information of the mobile terminal 100. The general volume adjusting information may include information regarding an adjustment level of volume of an audio signal when event generation information is received regardless of a type of the mobile terminal 100. The individual volume adjusting information may include at least one of information about whether to apply a situational automatic volume adjusting operation and a situational adjustment level. For example, the individual volume adjusting information may include at least one of adjusting information per (i.e., based on) user, adjusting information per (i.e., based on) program, adjusting information per (i.e., based on) channel, adjusting information per (i.e., based on) program, adjusting information per (i.e., based on) timeslot, and adjusting information per (i.e., based on) transmitter.

In operation S1300, the mobile terminal 100 transmits event generation information to the electronic device 200. According to an exemplary embodiment, the mobile terminal 100 may further transmit at least one of identification (ID) information of the mobile terminal 100 and transmitter information to the electronic device 200. In the exemplary embodiment, the ID information may include at least one of a phone number of the mobile terminal 100, an address assigned to the mobile terminal 100, a name of a user using the mobile terminal 100, and a nickname of the user. Also, the transmitter information may include at least one of a phone number of a transmitter, a photo, a name, and a nickname of the transmitter, which are stored in the mobile terminal 100.

In operation S1400, the electronic device 200 determines a volume adjusting operation of the audio signal based on the setting information and the event generation information. For example, when the event generation information is received, the electronic device 200 stores the volume of the audio signal at a point of time when the event generation information is received as a first level, and adjusts the volume of the audio signal to a second level based on at least one of the setting information and usage history information.

In operation S1500, the electronic device 200 adjusts the volume of the audio signal according to the volume adjusting operation. For example, the electronic device 200 compares the first and second levels, and change the volume of the audio signal from the first level to the second level when the first level is higher than the second level, and maintain the volume of the audio signal to the first level when the first level is lower than or equal to the second level.

Figure 5:
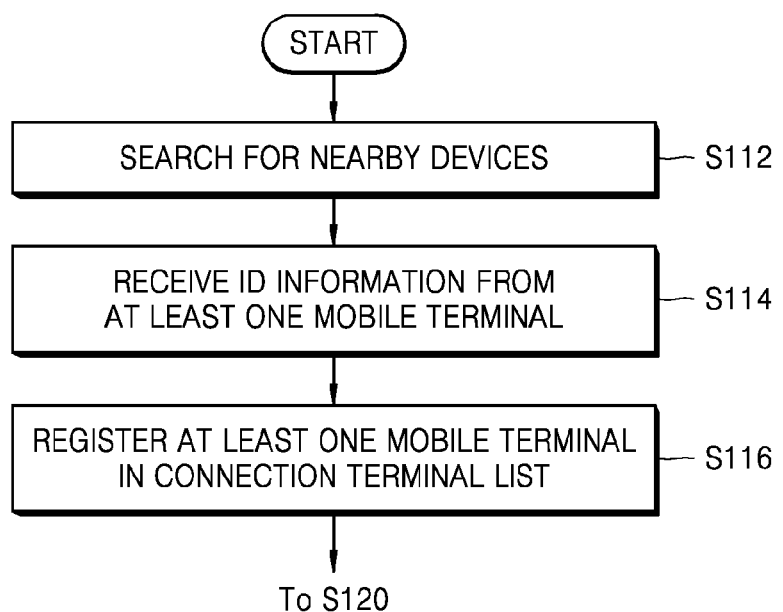
FIG. 5 is a flowchart illustrating in detail an example of connecting of FIG. 4.

FIG. 5 is a flowchart illustrating in detail an example of a method of connecting mobile terminal 100 and the electronic device 200 as shown in FIG. 4.

Referring to FIG. 5, the method of connecting the mobile terminal 100 and the electronic device 200 according to the exemplary embodiment includes following operations performed by an electronic device 200. For example the method of connecting the mobile terminal 100 and the electronic device 200 according to the exemplary embodiment may include operations that are performed in time-series by the electronic device 200 of the system 10 of FIG. 1.

In operation S112, the electronic device 200 searches for nearby devices. In operation S114, the electronic device 200 receives ID information from the at least one mobile terminal 100. In the exemplary embodiment, the ID information may include at least one of a phone number of the at least one mobile terminal 100, an address assigned to the at least one mobile terminal 100, a name of a user using the at least one mobile terminal 100, and a nickname of the user.

In operation S116, the electronic device 200 registers the at least one mobile terminal 100 in a connection terminal list. Operations S112 through S116 of the exemplary embodiment may also be referred to as a pairing operation.

Figure 6:
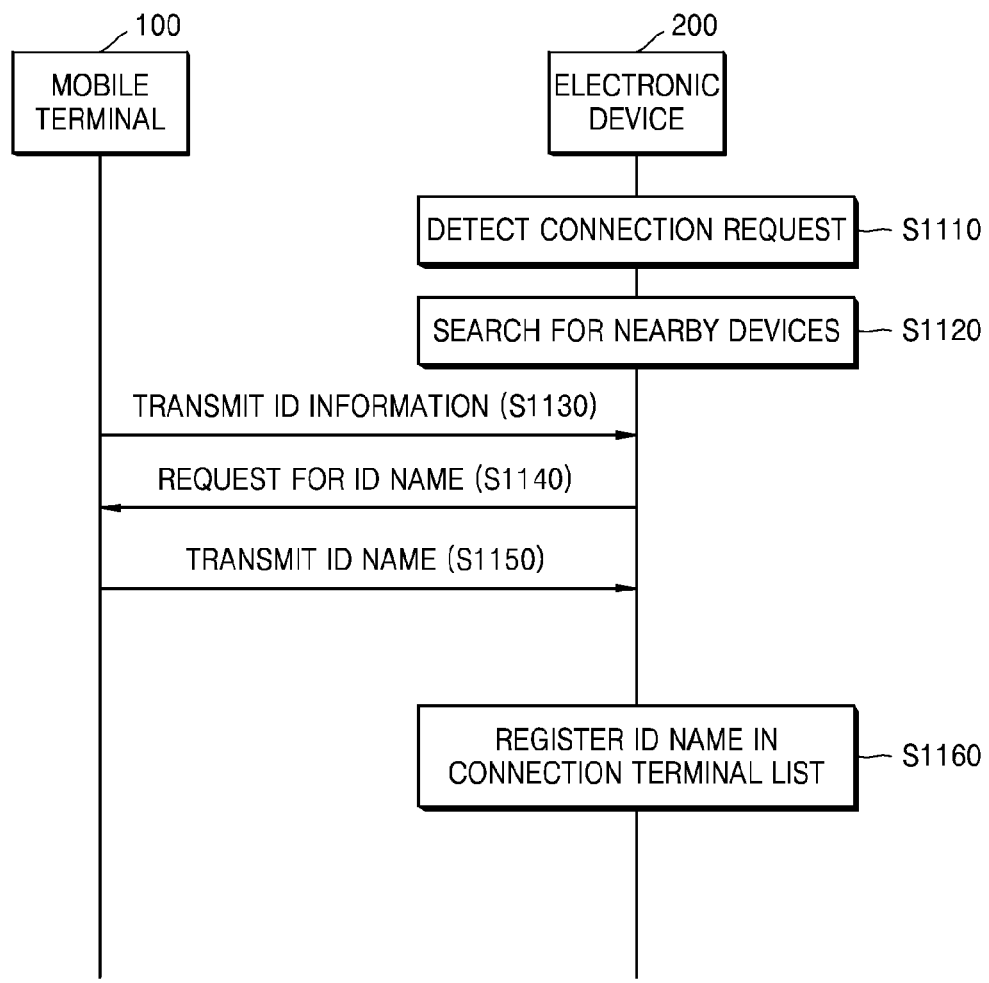
FIG. 6 is a flowchart of an example of operations of a system for adjusting volume according to the connecting of FIG. 5.

FIG. 6 is a flowchart of an example of operations of a system for adjusting volume according to the method of connecting of the mobile terminal 100 and the electronic device 200 as described in FIG. 5.

Referring to FIG. 6, the method of connecting according to the exemplary embodiment includes operations that are processed in time-series by the mobile terminal 100 and the electronic device 200 included in the system 10 of FIG. 1.

In operation S1110, the electronic device 200 detects a connection request. For example, the electronic device 200 may receive the connection request input through a UI. In operation S1120, the electronic device 200 searches for nearby devices. In operation S1130, the mobile terminal 100 transmits ID information to the electronic device 200.

In operation S1140, the electronic device 200 requests the mobile terminal 100 for an ID name. In operation S1150, the mobile terminal 100 transmits the ID name to the electronic device 200. In operation S1160, the electronic device 200 registers the ID name in a connection terminal list. For example, the electronic device 200 may store the connection terminal list in a partial region of a memory (not shown), and register the mobile terminal 100 by storing the ID name received from the mobile terminal 100 in the connection terminal list.

Figure 7:
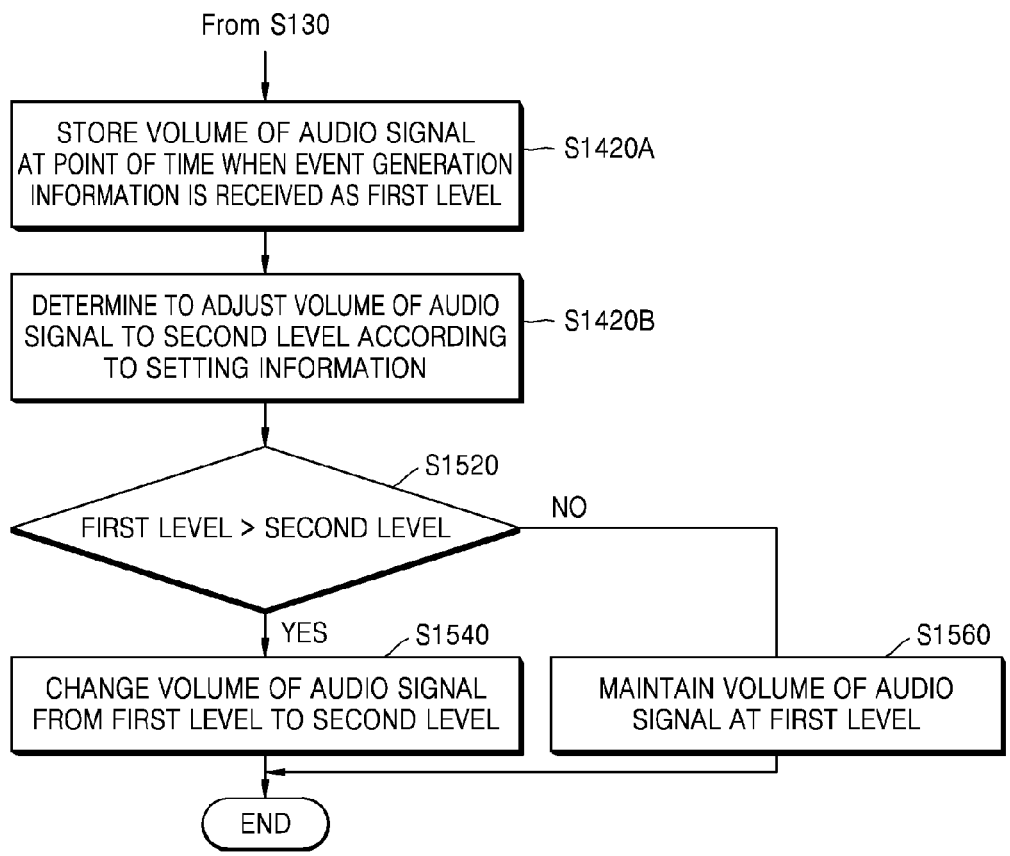
FIG. 7 is a flowchart illustrating in detail an example of determining a volume adjusting operation and adjusting of volume of FIG. 4.

FIG. 7 is a flowchart illustrating in detail an example of the determining the volume adjusting operation (S140) and the adjusting of the volume (S150) of FIG. 4.

Referring to FIG. 7, the determining of the volume adjusting operation (S140 of FIG. 4) and the adjusting of the volume (S150 of FIG. 4) according to the exemplary embodiment may include following operations performed by an electronic device 200. For example, the determining of the volume adjusting operation and the adjusting of the volume, according to the exemplary embodiment, may include operations that are processed in time-series by the electronic device 200 of the system 10 of FIG. 1.

In operation S1420A, the electronic device 200 stores the volume of the audio signal at the point of time when the event generation information is received as the first level. For example, the electronic device 200 may store the first level that is the volume of the audio signal currently output, in the memory of the electronic device 200.

In operation S1420B, the electronic device 200 determines to adjust the volume of the audio signal to the second level according to the setting information. For example, the electronic device 200 may determine the second level based on a situational volume adjustment level stored in the setting information.

In operation S1520, the electronic device 200 determines whether the first level is higher than the second level. When the first level is higher than the second level, operation S1540 is performed. When the first level is lower than or equal to the second level, operation S1560 is performed.

In operation S1540, the volume of the audio signal is changed from the first level to the second level. For example, the electronic device 200 may reduce the volume of the audio signal to the second level. Accordingly, a user may detect an event generation notification, such as a call reception notification, a message reception notification, or a notification from an application, from the mobile terminal 100.

In operation S1560, the volume of the audio signal is maintained at the first level. For example, when the first level that is the volume of the audio signal currently output (i.e., at the time of the event generation information is received) is not higher than an adjustment level, the electronic device 200 may not separately adjust the volume of the audio signal and maintain the first level that is the current volume. At this time, because the first level that is the current volume is sufficiently low, the user may be able to detect the event generation notification, such as the call reception notification, the message reception notification, or the notification from the application, from the mobile terminal 100.

FIG. 8 illustrates an example of setting information SI1 of the setting information described in FIG. 4.

Referring to FIG. 8, the setting information SI1 may correspond to adjusting information per user, and may include priority information about adjusting volume of a plurality of users respectively using a plurality of mobile terminals. In the exemplary embodiment, the setting information SI1 may include information about whether to apply an automatic volume adjusting function to each of the plurality of users. Also, the setting information SI1 may include an adjustment level for each of the plurality of users.

In the exemplary embodiment, a first user, a second user and a third user are users stored in a connection terminal list of the electronic device 200. As described above, the electronic device 200 may be pre-connected/pre-paired to the first, second and third mobile terminals 100a, 100b and 100c, for example, and may store ID information of the first, second and third mobile terminals 100a, 100b and 100c in the connection terminal list. In the exemplary embodiment, the first, second and third users may be classified and stored according to names, nicknames, or phone numbers.

For example, the first user may be a user who receives a lot of important calls, and at this time, the first user may be determined to be a user having the highest priority. Accordingly, in the setting information SI1 of the first user, the automatic volume adjusting function may be applied and the adjustment level may be determined to be a first user level. In the exemplary embodiment, the first user level (i.e., an adjustment level for the first user) may be predetermined to be 0, and the electronic device 200 may be in a mute mode such that the audio signal is not output from the electronic device 200 when the first mobile terminal 100a transmits event generation information. That is, when the event generation information is received, the electronic device 200 determines priority amongst the plurality of users based on the priority information of the adjusting information per user and the electronic device 200 adjusts the volume of the audio signal to a first user level corresponding to an adjustment level for a first user having a higher priority than remaining users of the plurality of users.

For example, the second user may be a user who considerably receives important calls, and at this time, the second user may be determined to be a user having the second highest priority. Accordingly, in the setting information SI1 of the second user, the automatic volume adjusting function may be applied and the adjustment level may be determined to be a second user level. In the exemplary embodiment, the second user level (i.e., an adjustment level for the second user) may be 2, and the volume of the audio signal output from the electronic device 200 may be very low.

For example, the third user may be a user who does not receive important calls much, and at this time, the third user may be determined to be a user having the third highest priority. Accordingly, in the setting information SI1 of the third user, the automatic volume adjusting function may be applied and the adjustment level may be determined to be a third user level (i.e., an adjustment level for the second user). In the exemplary embodiment, the third user level may be 4, and the volume of the audio signal output from the electronic device 200 may be low.

Also, in the exemplary embodiment, an unregistered user is a user who is not stored in the connection terminal list of the electronic device 200. Because an unregistered mobile terminal used by the unregistered user is not pre-connected to the electronic device 200, the electronic device 200 may not store ID information of the unregistered mobile terminal in the connection terminal list.

For example, the unregistered user may be a user who does not resides in a place, such as a house or an office, where the electronic device 200 is located. Alternatively, the unregistered user may be a user who resides in the space where the electronic device 200 is located, but uses the unregistered mobile terminal that is not pre-connected to the electronic device 200. Accordingly, in the setting information SI1 of the pre-registered user, the automatic volume adjusting function may be applied and the adjustment level may be determined to be a standard level. In the exemplary embodiment, the standard level may be 6, and the volume of the audio signal output from the electronic device 200 may be a little low. However, if ambient noise is quite loud or a notification sound of the unregistered mobile terminal of the unregistered user is small, the unregistered user may not hear an event generation notification from the unregistered mobile terminal.

Figure 9:
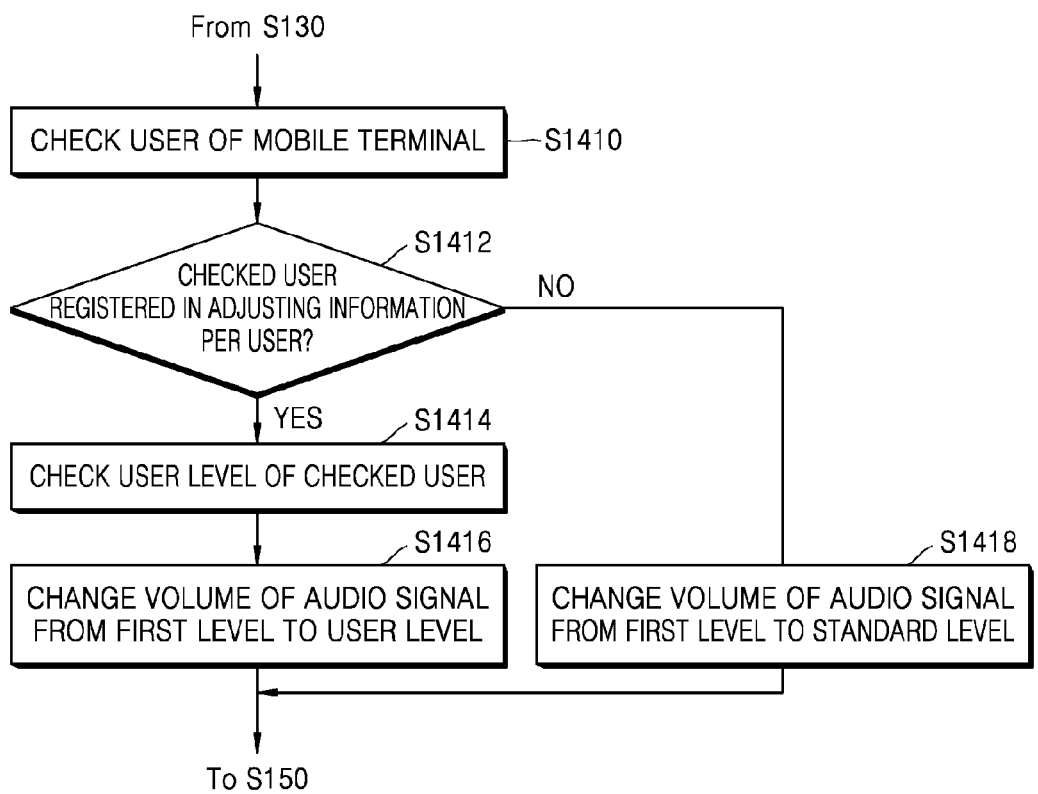
FIG. 9 is a flowchart illustrating in detail an example of the determining of the volume adjusting operation based on the setting information of FIG. 8.

FIG. 9 is a flowchart illustrating in detail an example of the determining of the volume adjusting operation based on the setting information SI1 of FIG. 8.

Referring to FIG. 9, the determining of the volume adjusting operation according to the exemplary embodiment includes following operations performed by an electronic device. For example, the determining of the volume adjusting operation according to the exemplary embodiment may include operations that are performed in time-series by the electronic device 200 of the system 10 of FIG. 1

In operation 1410, a user of a mobile terminal is checked. For example, the electronic device 200 may check a user of a mobile terminal that transmitted event generation information. The electronic device 200 may receive ID information from the mobile terminal, thereby obtaining user information of the mobile terminal.

In operation S1412, it is determined whether the checked user of the mobile terminal is registered in adjusting information per user. For example, the electronic device 200 may determine whether the checked user is registered in the adjusting information per user by referring to the adjusting information per user. When the checked user is registered in the adjusting information per user, operation S1414 is performed. When the checked user is not registered in the adjusting information per user, operation S1418 is performed.

In operation S1414, a user level (i.e., an adjustment level of a specific user) of the checked user is checked or determined. For example, the electronic device 200 may determine the user level of the checked user by referring to the adjusting information per user. For example, the electronic device 200 determines that the checked user is a first user, the electronic device 200 may determine a first user level of the first user.

In operation S1416, volume of an audio signal is changed from a first level to the user level. For example, when the checked user is the first user, the electronic device 200 may change the volume of the audio signal from the first level to the first user level.

In operation S1418, when the checked user is not registered in adjusting information per user, the volume of the audio signal is changed from the first level to a standard level. For example, when the checked user is not registered in a connection terminal list, the electronic device 200 may change the volume of the audio signal from the first level to a standard level of an unregistered user, which is predetermined and included in the adjusting information per user.

FIG. 10 illustrates an example of setting information S12 of the setting information described in FIG. 4.

Referring to FIG. 10, the setting information S12 may correspond to adjusting information per program genre. For example, the setting information S12 may include information about whether to apply an automatic volume adjusting function for each of a plurality of program genres. Also, the setting information S12 may include an adjustment level for each of the plurality of program genres.

In the exemplary embodiment, when a program genre of content being reproduced in the electronic device 200 is news, sports, or current affairs and education, the automatic volume adjusting function may not be applied. Also, when a program genre of content being reproduced in the electronic device 200 is series, variety shows, or cartoons, the automatic volume adjusting function ma be applied.

Also, in the exemplary embodiment, in the setting information S12 of the series, the automatic volume adjusting function may be applied and an adjustment level may be determined to be a first genre level, for example, 2. In the setting information S12 of the variety shows, the automatic volume adjusting function may be applied and an adjustment level may be determined to be a second genre level, for example, 4. In the setting information S12 of the cartoons, the automatic volume adjusting function may be applied and an adjustment level may be determined to be a third genre level, for example, 2, FIG. 11 is a flowchart illustrating in detail an example of the determining of the volume adjusting operation based on the setting information S12 of FIG. 10.

Figure 11:
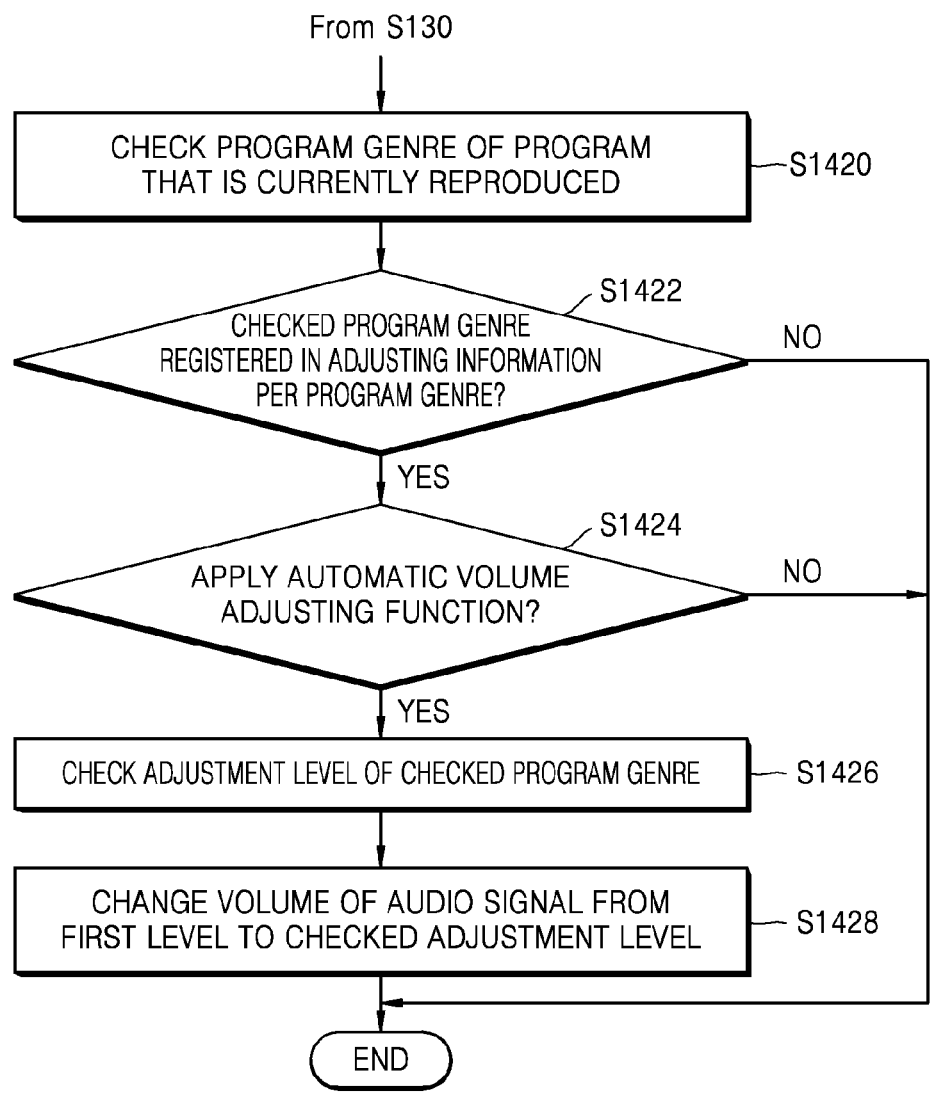
FIG. 11 is a flowchart illustrating in detail an example of the determining of the volume adjusting operation based on the setting information of FIG. 10.

Referring to FIG. 11, the determining of the volume adjusting operation according to the exemplary embodiment includes following operations performed by an electronic device 200. For example, the determining of the volume adjusting operation according to the exemplary embodiment may include operations that are processed in time-series by the electronic device 200 of the system 10 of FIG. 1

In operation S1420, the electronic device 200 checks/determines a program genre of a program that is currently reproduced.

In operation S1422, the electronic device 200 determines whether the checked program genre is a program genre registered in adjusting information per program genre. When the checked program genre is registered in the adjusting information per program genre, operation S1424 is performed. When the checked program genre is not registered in the adjusting information per program genre, the determining of the volume adjusting operation is ended and the electronic device 200 may determine whether to perform an automatic volume adjusting function based on different setting information.

In operation S1424, the electronic device 200 determines whether to apply an automatic volume adjusting function on the checked program genre. When it is determined that the automatic volume adjusting function is to be applied, operation S1426 is performed. When it is determined that the automatic volume adjusting function is not to be applied, the determining of the volume adjusting operation is ended and the electronic device 200 may determine whether to perform an automatic volume adjusting function based on different setting information.

In operation S1426, the electronic device 200 checks/determines an adjustment level of the checked program genre. The electronic device 200 may check the adjustment level to be a first genre level when, for example, the checked program genre is series, by referring to the adjusting information per program genre.

In operation S1428, the electronic device 200 changes the volume of the audio signal from the first level to the checked adjustment level. For example, when the program genre is series, the electronic device 200 may change the volume of the audio signal from the first level to the first genre level according to the information stored in the adjusting information per program genre.

FIG. 12 illustrates an example of setting information S13 of FIG. 4.

Referring to FIG. 12, the setting information S13 may correspond to adjusting information per program. For example, the setting information S13 may include information about whether to apply an automatic volume adjusting function to each of a plurality of programs. Also, the setting information S13 may include an adjustment level for each of the plurality of programs.

In the exemplary embodiment, the setting information S13 may include information about whether to apply an automatic volume adjusting function and an adjustment level for programs, such as 'CNN Newsroom', 'The Walking Dead', 'Saturday Night Live', '2014 World Series', 'Spongebob', and 'The Debates'. Here, types of the programs are changeable, whether to apply an automatic volume adjusting function per program is changeable, and an adjustment level per program is also changeable.

For example, an automatic volume adjusting function may not be applied to 'CNN Newsroom', '2014 World Series', and 'The Debates', an automatic volume adjusting function may be applied to 'The Walking Dead', 'Saturday Night Live', and 'Spongebob', and an adjustment level may be determined to one of a first program level, a second program level and a third program level as shown in the last column of FIG. 12.

Figure 13:
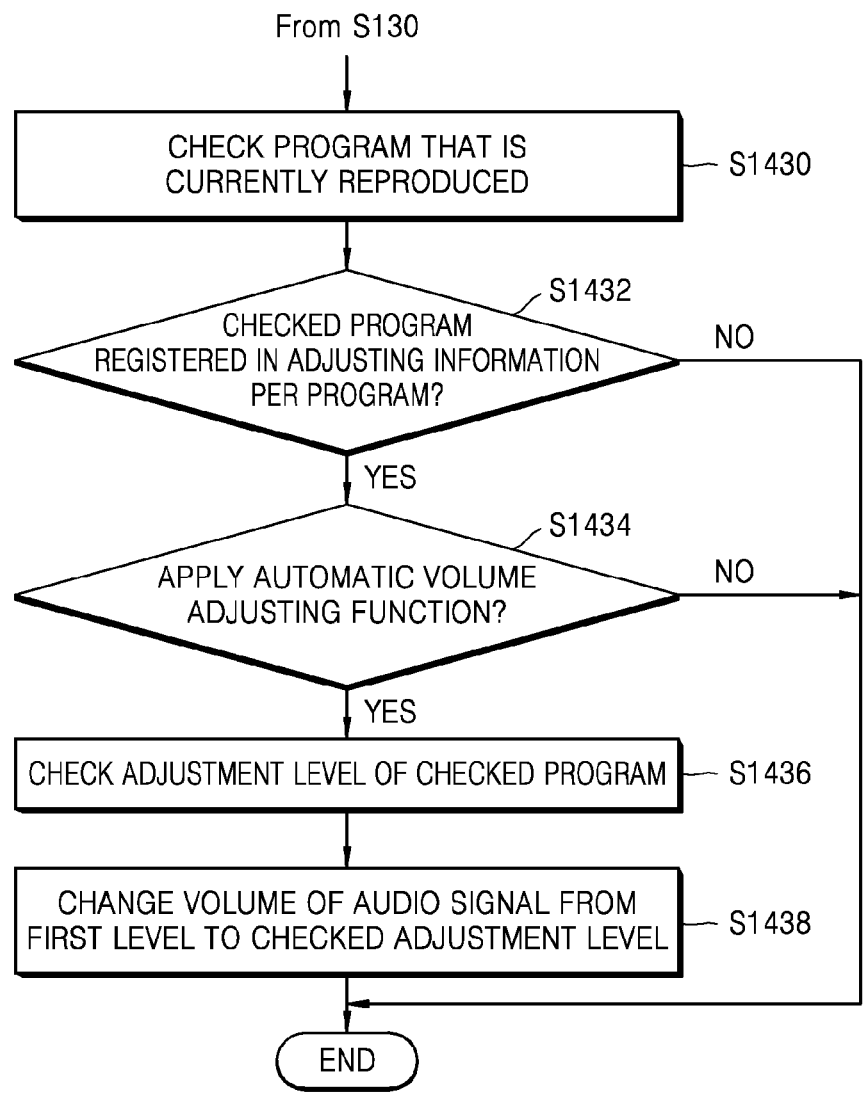
FIG. 13 is a flowchart illustrating in detail an example of the determining of the volume adjusting operation based on the setting information of FIG. 12.

FIG. 13 is a flowchart illustrating in detail an example of the determining of the volume adjusting operation based on the setting information SI3 of FIG. 12.

Referring to FIG. 13, the determining of the volume adjusting operation according to the exemplary embodiment includes following operations performed by an electronic device 200. For example, the determining of the volume adjusting operation according to the exemplary embodiment may include operations that are performed in time-series by the electronic device 200 of the system 10 of FIG. 1.

In operation S1430, the electronic device 200 checks or determines a program that is currently reproduced in the electronic device 200.

In operation S1432, the electronic device 200 determines whether the checked program is registered in adjusting information per program. When the checked program is determined to be registered in the adjusting information per program, operation S1434 is performed. When the checked program is determined to be not registered in the adjusting information per program, the determining of the volume adjusting operation is ended and the electronic device 200 may determine whether to perform an automatic volume adjusting function based on different setting information.

In operation S1434, the electronic device 200 determines whether to apply an automatic volume adjusting function to the checked program. When the automatic volume adjusting function is to be applied, operation S1436 is performed. When the automatic volume adjusting function is not to be applied, the determining of the volume adjusting operation is ended and the electronic device 200 may determine whether to perform an automatic volume adjusting function based on different setting information.

In operation S1436, the electronic device 200 checks for or determines an adjustment level of the checked program. For example, when the checked program is 'The Walking Dead', the electronic device 200 may determine the adjustment level to be a first program level by referring to the adjusting information per program.

In operation S1438, the electronic device 200 changes the volume of the audio signal from the first level to the checked adjustment level. For example, when the checked program is 'The Walking Dead', the electronic device 200 may change the volume of the audio signal from the first level to the first program level according to the information stored in the adjusting information per program.

FIG. 14 illustrates an example of setting information S14 of FIG. 4.

Referring to FIG. 14, the setting information S14 may correspond to adjusting information per channel. For example, the setting information S14 may include information about whether to apply an automatic volume adjusting function to each of a plurality of channels. Also, the setting information S14 may include an adjustment level for each of the plurality of channels.

In the exemplary embodiment, the setting information S14 may include information about whether to apply an automatic volume adjusting function and an adjustment level for channels, such as Ch. 6, Ch. 7, Ch. 9, Ch. 10, and Ch. 11. Here, whether to apply an automatic volume adjusting function per channel is changeable, and an adjustment level per channel is changeable.

For example, an automatic volume adjusting function may not be applied to Ch. 6 and Ch. 10, an automatic volume adjusting function may be applied to Ch. 7, Ch, 9, and Ch. 11, and an adjustment level may be determined to one of a first channel level, a second channel level and a third channel level.

Figure 15:
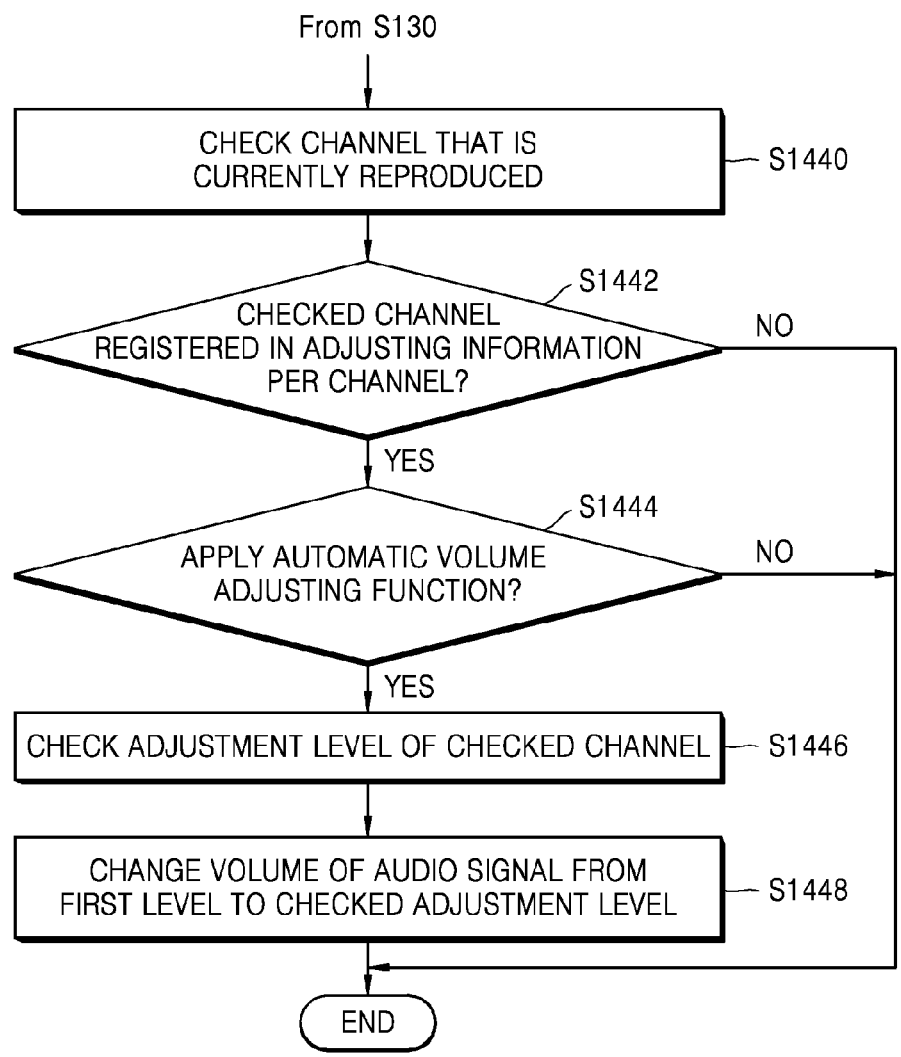
FIG. 15 is a flowchart illustrating in detail an example of the determining of the volume adjusting operation based on the setting information of FIG. 14.

FIG. 15 is a flowchart illustrating in detail an example of the determining of the volume adjusting operation based on the setting information SI4 FIG. 14.

Referring to FIG. 15, the determining of the volume adjusting operation according to the exemplary embodiment includes following operations performed by an electronic device 200. For example, the determining of the volume adjusting operation according to the exemplary embodiment may include operations that are processed in time-series by the electronic device 200 of the system 10 of FIG. 1

In operation S1440, the electronic device 200 checks or determines a channel that is currently reproduced.

In operation S1442, the electronic device 200 determines whether the checked channel is registered in adjusting information per channel. When the checked channel is determined to be registered, operation S1444 is performed. When the checked channel is determined to be not registered, the determining of the volume adjusting operation is ended and the electronic device 200 may determine whether to perform an automatic volume adjusting function based on different setting information.

In operation S1444, the electronic device 200 determines whether to apply an automatic volume adjusting function to the checked channel. When the automatic volume adjusting function is to be applied, operation S1446 is performed. When the automatic volume adjusting function is not to be applied, the determining of the volume adjusting operation is ended and the electronic device 200 may determine whether to perform an automatic volume adjusting function based on different setting information.

In operation S1446, the electronic device 200 checks or determines an adjustment level of the checked channel. For example, when the checked channel is Ch. 7, the electronic device 200 may check that the adjustment level is a first channel level by referring to the adjusting information per channel.

In operation S1448, the electronic device 200 changes the volume of the audio signal from the first level to the checked adjustment level. For example, when the checked channel is Ch. 7, the electronic device 200 may change the volume of the audio signal from the first level to the first channel level according to the adjusting information per channel.

FIG. 16 illustrates an example of setting information S15 of FIG. 4.

Referring to FIG. 16, the setting information S15 may correspond to adjusting information per timeslot. For example, the setting information S15 may include information about whether to apply an automatic volume adjusting function to each of a plurality of timeslots. Also, the setting information S15 may include an adjustment level for each of the plurality of timeslots.

In the exemplary embodiment, the setting information S15 may include information about whether to apply an automatic volume adjusting function and an adjustment level for each of timeslots, such as 00:00 to 06:00, 06:00 to 12:00, 12:00 to 18:00, and 18:00 to 24:00. In the exemplary embodiment, sections of the timeslots are changeable, whether to apply an automatic volume adjusting function per timeslot is changeable, and an adjustment level per timeslot is changeable.

For example, an automatic volume adjusting function may not be applied to 00:00 to 06:00 and 12:00 to 18:00, an automatic volume adjusting function may be applied to 06:00 to 12:00 and 18:00 to 24:00, and an adjustment level may be determined to be one of first and second timeslot levels.

Figure 17:
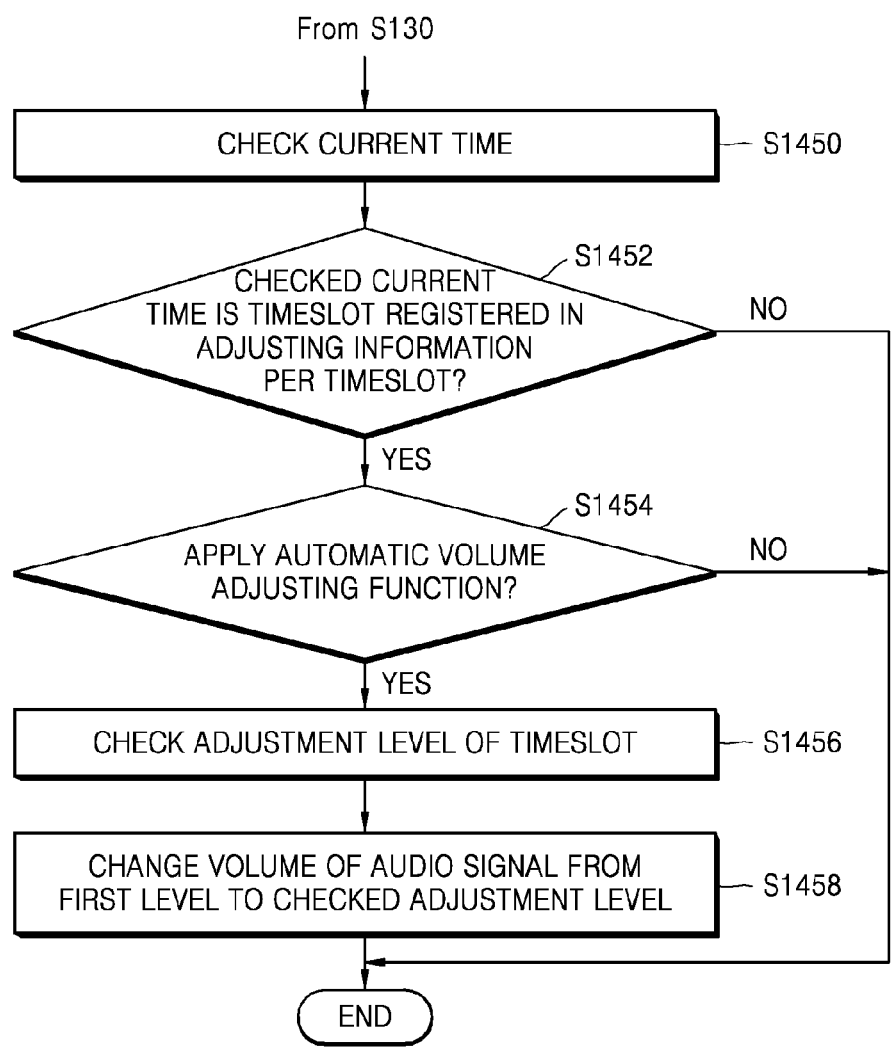
FIG. 17 is a flowchart illustrating in detail an example of the determining of the volume adjusting operation based on the setting information of FIG. 16.

FIG. 17 is a flowchart illustrating in detail an example of the determining of the volume adjusting operation based on the setting information SI5 of FIG. 16.

Referring to FIG. 17, the determining of the volume adjusting operation according to the exemplary embodiment includes following operations performed by an electronic device. For example, the determining of the volume adjusting operation according to the exemplary embodiment may include operations that are processed in time-series by the electronic device 200 of the system 10 of FIG. 1.

In operation S1450, the electronic device 200 checks or determines the current time.

In operation S1452, the electronic device 200 determines whether the current time is a timeslot registered in adjusting information per timeslot. When the timeslot is determined to be registered, operation S1454 is performed. When the timeslot is determined to be not registered, the determining of the volume adjusting operation is ended and the electronic device 200 may determine whether to perform an automatic volume adjusting function based on different setting function.

In operation S1454, the electronic device 200 determines whether an automatic volume adjusting function is to be applied to the timeslot. When the automatic volume adjusting function is to be applied, operation S1456 is performed. When the automatic volume adjusting function is not to be applied, the determining of the volume adjusting operation is ended and the electronic device 200 determines whether to perform an automatic volume adjusting function based on different setting information.

In operation S1456, the electronic device 200 checks or determines an adjustment level of the timeslot. For example, when the timeslot is 06:00 to 12:00, the electronic device 200 may determine a first timeslot level corresponding to the timeslot by referring to the adjusting information per timeslot.

In operation S1458, the electronic device 200 changes the volume of the audio signal from the first level to the checked adjustment level. For example, when the timeslot is 06:00 to 12:00, the electronic device 200 may change the volume of the audio signal from the first level to the first timeslot level.

FIG. 18 illustrates an example of setting information SI6 of FIG. 4.

Referring to FIG. 18, the setting information SI6 may correspond to adjusting information per transmitter. For example, the setting information SI6 may include information about whether to apply an automatic volume adjusting function to each of a plurality of transmitters. Also, the setting information SI6 may include an adjustment level for each of the plurality of transmitters.

In the exemplary embodiment, the setting information SI6 may include information about whether to apply an automatic volume adjusting function and an adjustment level for each of first, second, third and fourth transmitters. In the exemplary embodiment, the transmitters may be changed, added, or deleted, whether to apply an automatic volume adjusting function per transmitter is changeable, and an adjustment level per transmitter is changeable.

For example, an automatic volume adjusting function may be applied to the first through fourth transmitters, and the first through fourth transmitters may respectively have first through fourth transmitter levels. For example, when a call from the first transmitter must be answered, the first transmitter may be determined to have highest priority and the first transmitter level may be determined to be lowest.

Figure 19:
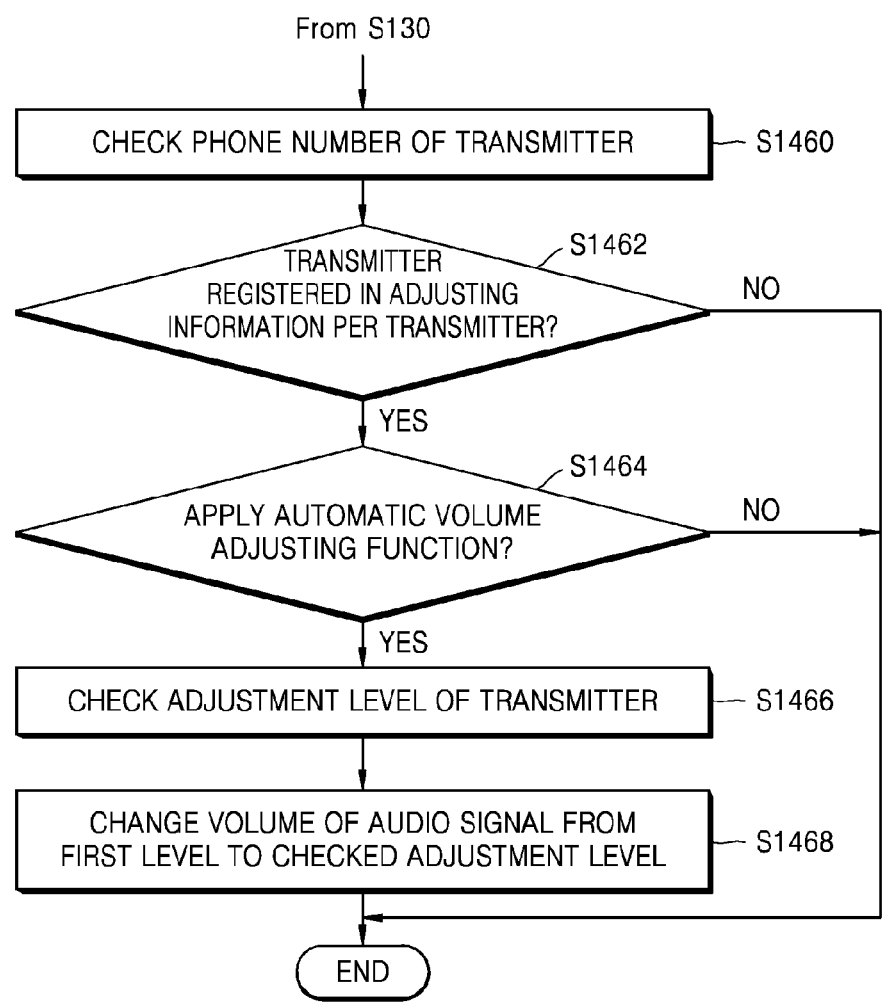
FIG. 19 is a flowchart illustrating in detail an example of the determining of the volume adjusting operation based on the setting information of FIG. 18.

FIG. 19 is a flowchart illustrating in detail an example of the determining of the volume adjusting operation based on the setting information SI6 of FIG. 18.

Referring to FIG. 19, the determining of the volume adjusting operation according to the exemplary embodiment includes following operations performed by an electronic device 200. For example, the determining of the volume adjusting operation according to the exemplary embodiment may include operations that are processed in time-series by the electronic device 200 of the system 10 of FIG. 1.

In operation S1460, the electronic device 200 checks or determines a phone number of a transmitter.

In operation S1462, the electronic device 200 determines whether the transmitter is registered in adjusting information per transmitter. When the transmitter is determined to be registered, operation S1464 is performed. When the transmitter is determined to be not registered, the determining of the volume adjusting operation is ended and the electronic device 200 may determine whether to perform an automatic volume adjusting function based on different setting information.

In operation S1464, the electronic device 200 determines whether to apply an automatic volume adjusting function to the transmitter. When the automatic volume adjusting function is to be applied, operation S1446 is performed. When the automatic volume adjusting function is not to be applied, the determining of the volume adjusting operation is ended and the electronic device 200 may determine whether to perform an automatic volume adjusting function based on different setting information.

In operation S1466, the electronic device 200 checks or determines an adjustment level of the corresponding transmitter. For example, when the transmitter is determined to be the first transmitter, the electronic device 200 may check or determine the first transmitter level corresponding to the first transmitter by referring to the adjusting information per transmitter.

In operation S1468, the electronic device 200 changes the volume of the audio signal from the first level to the checked adjustment level. For example, when the transmitter is the first transmitter, the electronic device 200 may change the volume of the audio signal from the first level to the first transmitter level.

Figure 20:
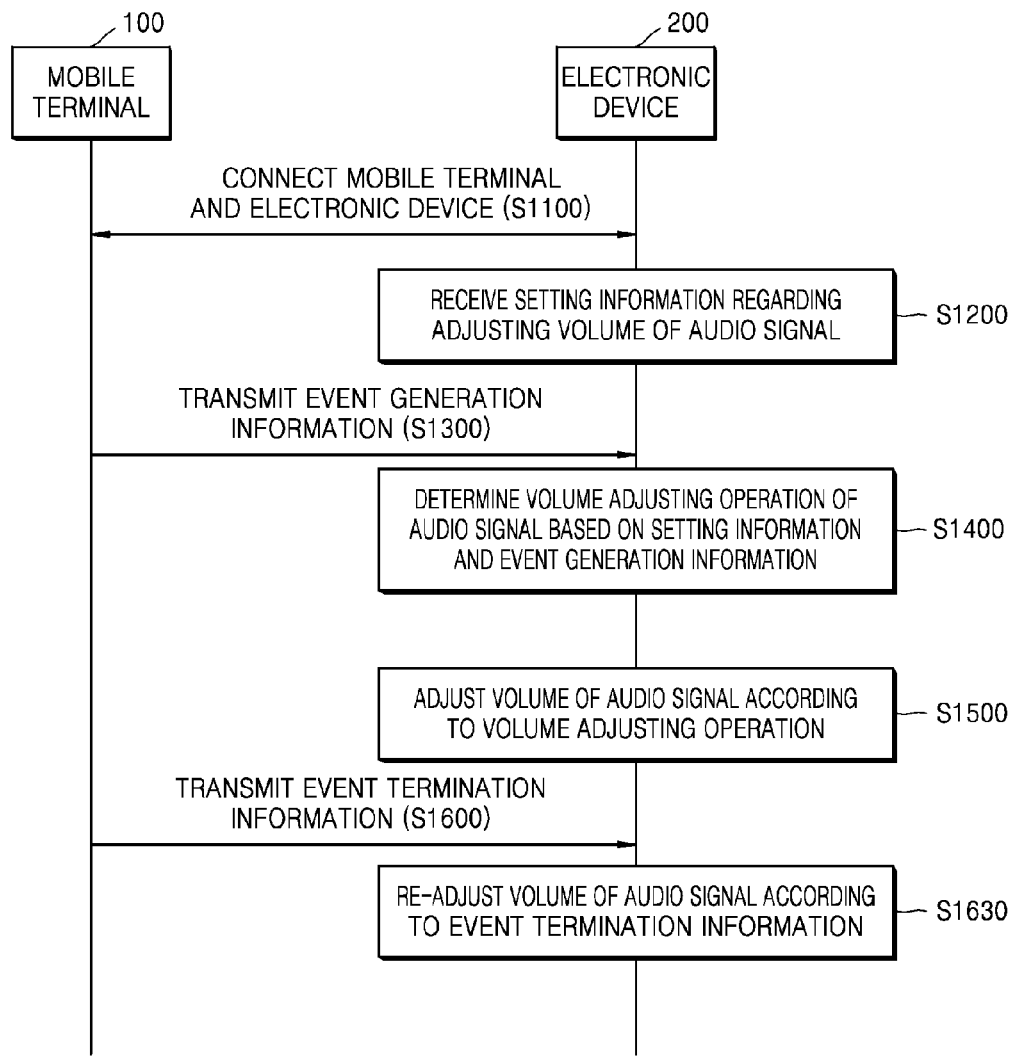
FIG. 20 is a flowchart illustrating a modified example of the operations of the system of FIG. 4.

FIG. 20 is a flowchart illustrating a modified example of the operations of the system of FIG. 4.

Referring to FIG. 20, the operations according to the exemplary embodiment correspond to a method of adjusting volume of an audio signal based on setting information, and further include operations S1600 and S1630 compared to the operations of FIG. 4.

In operation S1100, the mobile terminal 100 and the electronic device 200 are connected to each other. That is, the mobile terminal 100 and the electronic device establish connection (e.g., communication connection) between each other. In operation S1200, the electronic device 200 receives the setting information regarding adjusting of the volume of the audio signal. In operation S1300, the mobile terminal 100 transmits the event generation information to the electronic device 200. In operation S1400, the electronic device 200 determines the volume adjusting operation of the audio signal based on the setting information and the event generation information. In operation S1500, the electronic device 200 adjusts the volume of the audio signal according to the volume adjusting operation.

In operation S1600, the mobile terminal 100 transmits event termination information to the electronic device 200. For example, when a call reception sound is no longer ringing or a call is ended, the mobile terminal 100 may generate the event termination information and transmit the event termination information to the electronic device 200.

In operation S1630, the electronic device 200 re-adjusts the volume of the audio signal according to the event termination information. For example, the electronic device 200 may re-adjust the volume of the audio signal to the first level that is the volume at the point of time when the event generation information is received, according to the event termination information. Accordingly, for example, when the call is ended or the call reception sound is stopped, the volume of the audio signal may be automatically restored or reverted back to a previous level (i.e., the first level), and thus a control operation of the user by a remote control or the like is not required and user convenience is increased.

Figure 21:
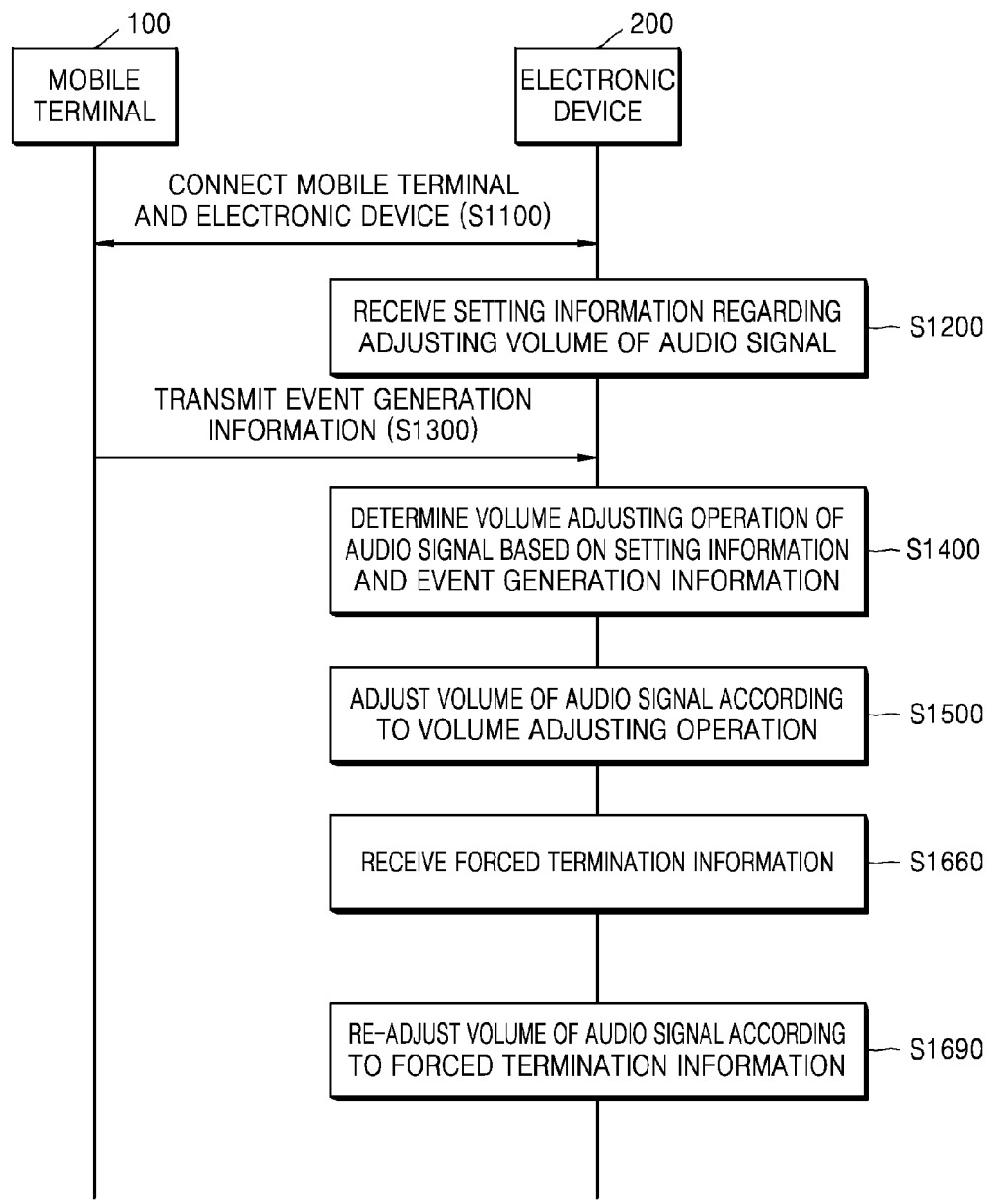
FIG. 21 is a flowchart illustrating an modified example of the operations of the system of FIG. 4.

FIG. 21 is a flowchart illustrating a modified example of the operations of the system of FIG. 4.

Referring to FIG. 21, the operations according to the exemplary embodiment correspond to a method of adjusting volume of an audio signal based on setting information, and further include operations S1660 and S1690 compared to the operations of FIG. 4.

In operation S1100, the mobile terminal 100 and the electronic device 200 are connected to each other. That is, the mobile terminal 100 and the electronic device establish connection (e.g., communication connection) between each other. In operation S1200, the electronic device 200 receives the setting information regarding adjusting of the volume of the audio signal. In operation S1300, the mobile terminal 100 transmits the event generation information to the electronic device 200. In operation S1400, the electronic device 200 determines the volume adjusting operation of the audio signal based on the setting information and the event generation information. In operation S1500, the electronic device 200 adjusts the volume of the audio signal according to the volume adjusting operation.

In operation S1660, the electronic device 200 receives forced termination information. In the exemplary embodiment, the forced termination information may be information commanding to end the volume adjusting operation. For example, the electronic device 200 may receive the forced termination information via a UI. For example, when event generation information is generated by a mobile terminal of the first user, a second user may input the forced termination information to the electronic device 200. Alternatively, if a user does not want to take a call and ignores the event generation information, the user may input the forced termination information to the electronic device 200.

In operation S1690, the electronic device 200 re-adjusts the volume of the audio signal according to the forced termination information. For example, the electronic device 200 may re-adjust the volume of the audio signal to the first level that is the volume at the point of time when the event generation information is received, according to the forced termination information.

Figure 22:
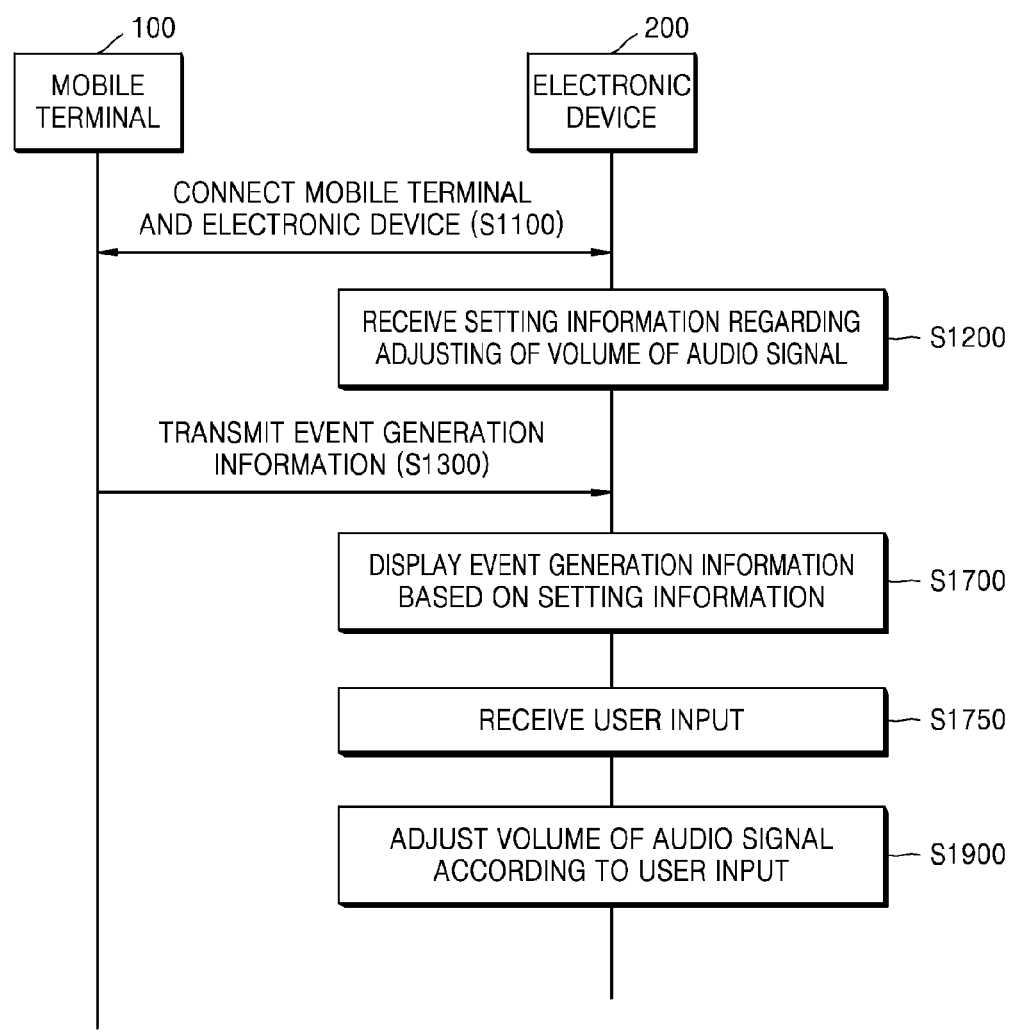
FIG. 22 is a flowchart illustrating an modified example of the operations of the system of FIG. 4.

FIG. 22 is a flowchart illustrating a modified example of the operations of the system of FIG. 4.

Referring to FIG. 22, the operations according to the exemplary embodiment correspond to a method of adjusting volume of an audio signal based on setting information, and further include displaying of the event generation information instead of operations S1400 and S1500 compared to the operations of FIG. 4.

In operation S1100, the mobile terminal 100 and the electronic device 200 are connected to each other. That is, the mobile terminal 100 and the electronic device establish connection (e.g., communication connection) between each other. In operation S1200, the electronic device 200 receives the setting information regarding adjusting of the volume of the audio signal.

In operation S1300, the mobile terminal 100 transmits the event generation information to the electronic device 200. Also, the mobile terminal 100 may further transmit at least one of ID information of the mobile terminal 100 and transmitter information to the electronic device 200. In the exemplary embodiment, the ID information may include at least one of a phone number of the mobile terminal 100, an address assigned to the mobile terminal 100, a name of a user using the mobile terminal 100, and a nickname of the user, and the transmitter information may include at least one of a phone number of a transmitter, and a photo, a name, and a nickname of the transmitter, which are stored in the mobile terminal 100.

Thereafter, in operation S1700, the electronic device 200 displays the event generation information based on the setting information. For example, the electronic device 200 may determine whether to display the event generation information based on the setting information, and when it is determined to display the event generation information, may display the event generation information. Also, the electronic device 200 may further display at least one of the ID information and the transmitter information.

In operation S1750, a user input is received. For example, the electronic device 200 may receive a user input of commanding to perform a volume adjusting operation through a UI.

In operation S1900, the volume of the audio signal is adjusted according to the user input. For example, when the user input includes a command or request to reduce the volume, the electronic device 200 may adjust the volume to a pre-set adjustment level. Alternatively, when the user input includes a command or request to maintain the volume, the electronic device 200 may not perform the volume adjusting operation.

Figure 23:
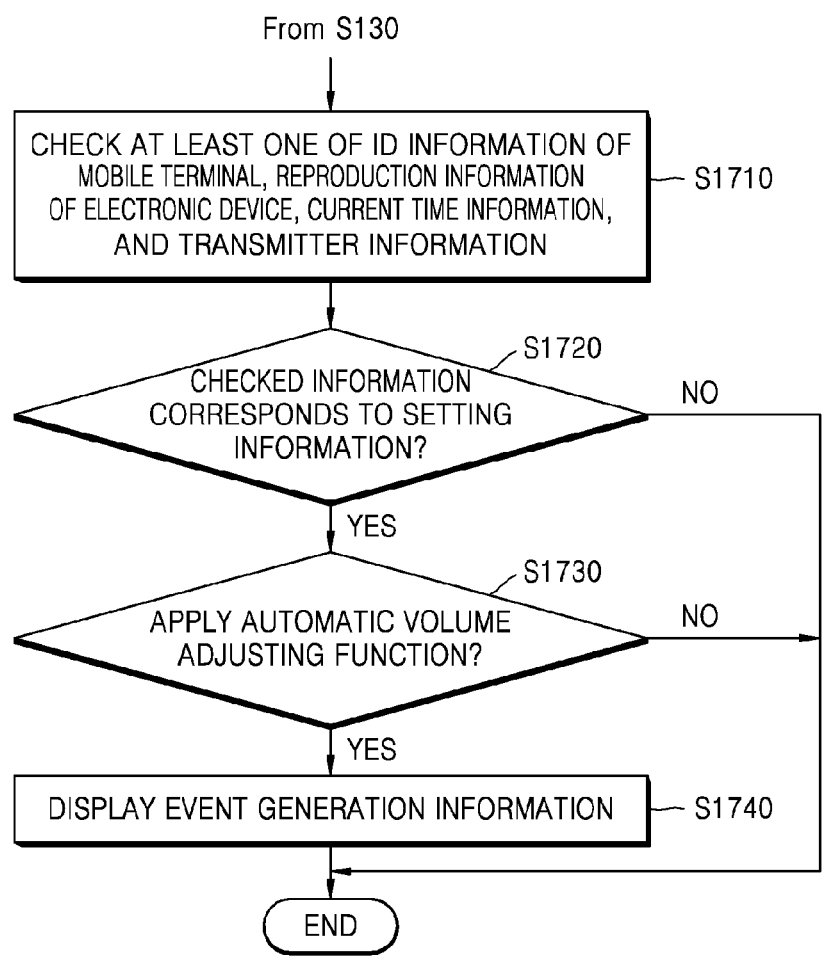
FIG. 23 is a flowchart illustrating in detail an example of displaying of FIG. 22.

FIG. 23 is a flowchart illustrating in detail an example of the displaying (S1700) of FIG. 22.

Referring to FIG. 23, in operation S1710, the electronic device 200 checks or determines at least one of ID information of a mobile terminal, reproduction information of the electronic device 200, current time information, and transmitter information.

In operation S1720, the electronic device 200 determines whether information checked in operation S1710 corresponds to setting information. In the exemplary embodiment, the setting information may be the setting information SI1 of FIG. 8, the setting information SI2 of FIG. 10, the setting information SI3 of FIG. 12, the setting information SI4 of FIG. 14, the setting information SI5 of FIG. 16, or the setting information SI6 of FIG. 18. When the checked information corresponds to the setting information, operation S1730 is performed. When the checked information does not correspond to the setting information, the displaying is ended and the automatic volume adjusting function may not be performed.

In operation S1730, the electronic device 200 determines whether to apply the automatic volume adjusting function to the checked information. When the automatic volume adjusting function is to be applied, operation S1740 is performed. When the automatic volume adjusting function is not to be applied, the displaying is ended and the automatic volume adjusting function may not be performed. In operation S1740, the electronic device 200 displays the event generation information.

Figure 24:
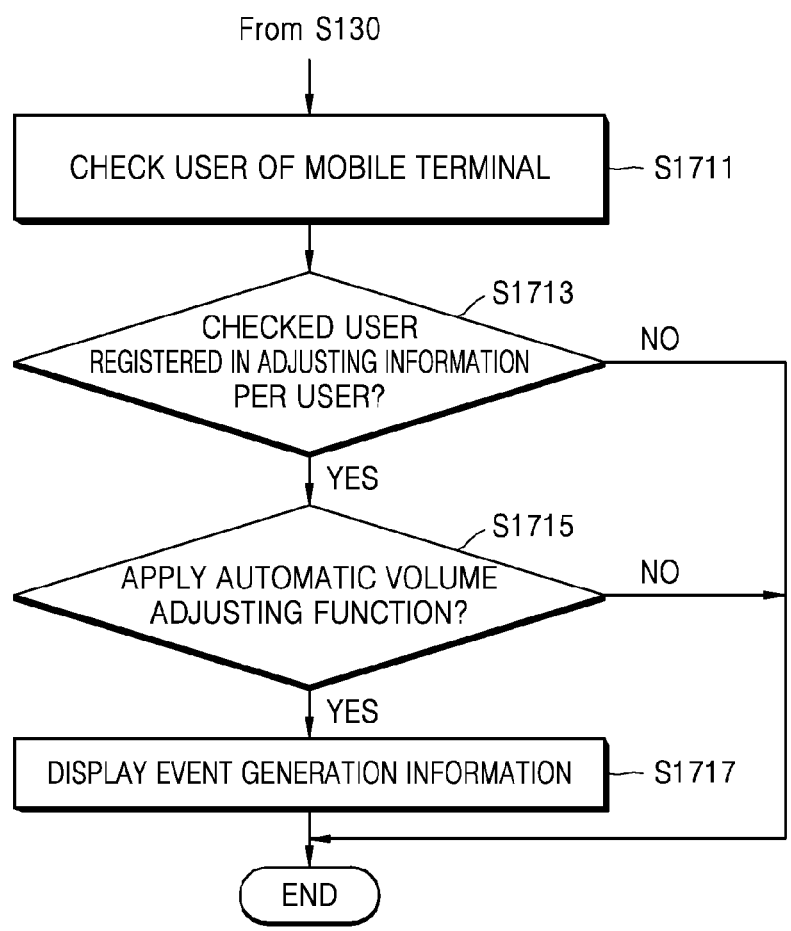
FIG. 24 is a flowchart illustrating in detail an example of the displaying of FIG. 22.

FIG. 24 is a flowchart illustrating in detail an example of the displaying (S1700) of FIG. 22.

Referring to FIG. 24, in operation S1711, the electronic device 200 checks or determines a user of a mobile terminal. In operation S1713, the electronic device 200 determines whether the checked user is a user registered in the adjusting information per user. When the checked user is determined to be registered, operation S1715 is performed. When the checked user is not determined to be registered, the displaying is ended and the automatic volume adjusting function may not be performed.

In operation S1715, the electronic device 200 determines whether to apply the automatic volume adjusting function to the checked user. When the automatic volume adjusting function is determined to be applied, operation S1717 is performed. When the automatic volume adjusting function is determined not to be applied, the displaying is ended and the automatic volume adjusting function may not be performed. In operation S1717, the electronic device 200 displays the event generation information.

Figure 25:
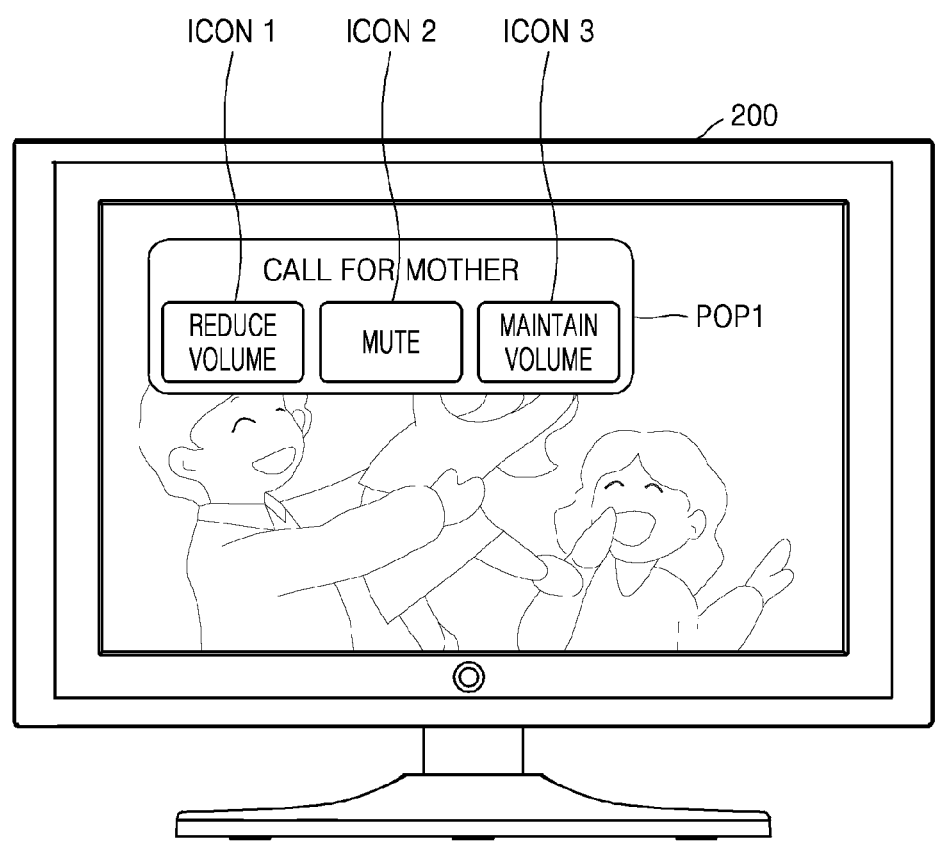
FIG. 25 illustrates an example of a screen displayed on an electronic device according to the displaying of FIG. 24.

FIG. 25 illustrates an example of a screen displayed on the electronic device 200 according to the displaying (S1700) of FIG. 24.

Referring to FIG. 25, the event generation information is displayed, for example, in a form of a pop-up window POP1, on a partial region of a screen of the electronic device 200 that is reproducing content. The pop-up window POP1 may include a plurality of selection icons, such as a volume reducing icon ICON1, a mute icon ICON2, and a volume maintaining icon ICON3.

The electronic device 200 may check or determine a user of a mobile terminal, determine whether to apply the automatic volume adjusting function for the checked user based on the adjusting information per user, and display the event generation information in the form of the pop-up window POP1 if the automatic volume adjusting function is to be applied for the checked user. For example, when the checked user is the first user, for example, mother, the electronic device 200 may display the pop-up window POP1 including a message "call for mother" on the partial region of the screen.

Figure 26:
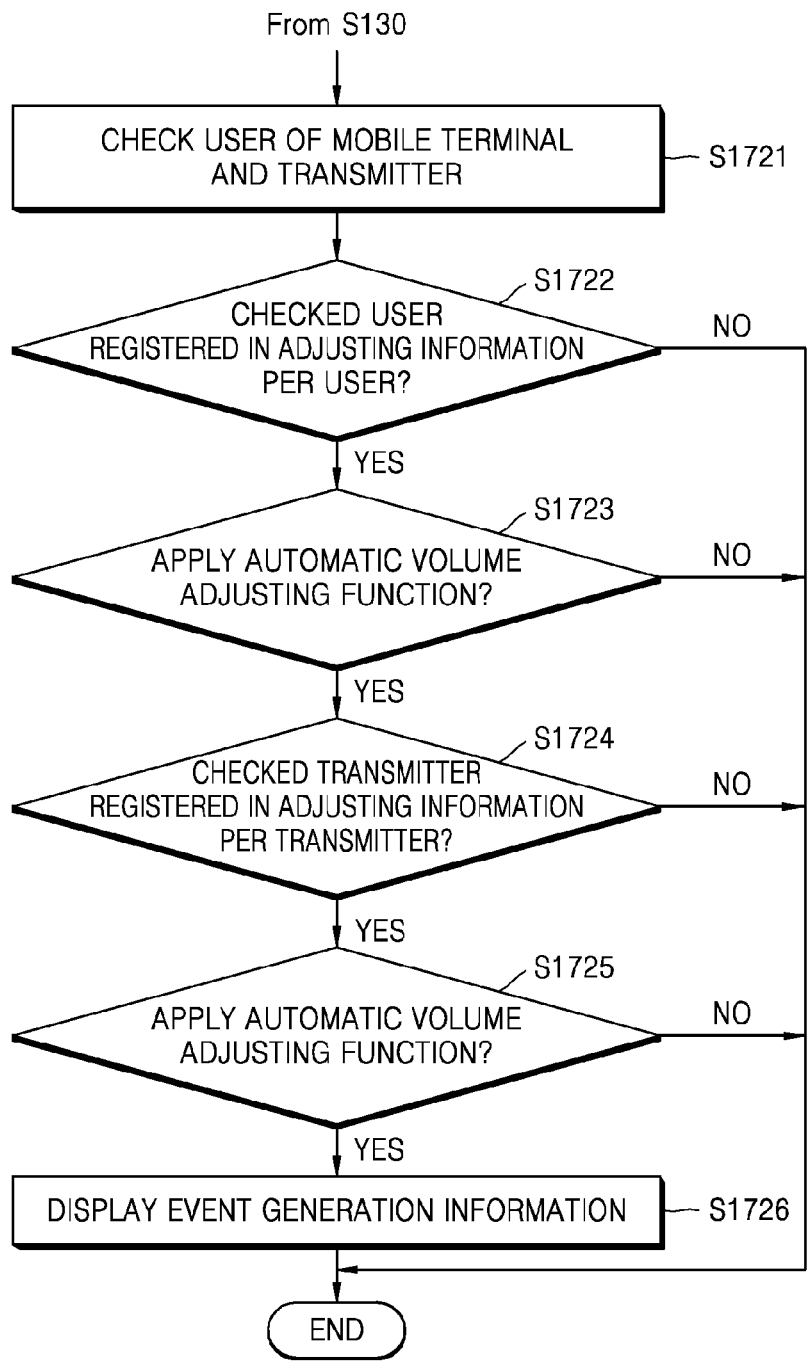
FIG. 26 is a flowchart illustrating in detail an example of the displaying of FIG. 22.

FIG. 26 is a flowchart illustrating in detail an example of the displaying (S1700) of FIG. 22.

Referring to FIG. 26, in operation S1721, the electronic device 200 checks or determines a user of a mobile terminal 100 and a transmitter (i.e., a party contacting the user of the mobile terminal 100 via the mobile terminal 100). In operation S1722, the electronic device 200 determines whether the checked user is registered in the adjusting information per user. In operation S1723, the electronic device 200 determines whether to apply the automatic volume adjusting function to the checked user. In operation S1724, the electronic device 200 determines whether the checked transmitter is registered in the adjusting information per transmitter. In operation S1725, the electronic device 200 determines whether to apply the automatic volume adjusting function to the checked transmitter. In operation S1726, the electronic device 200 displays the event generation information.

Figure 27:
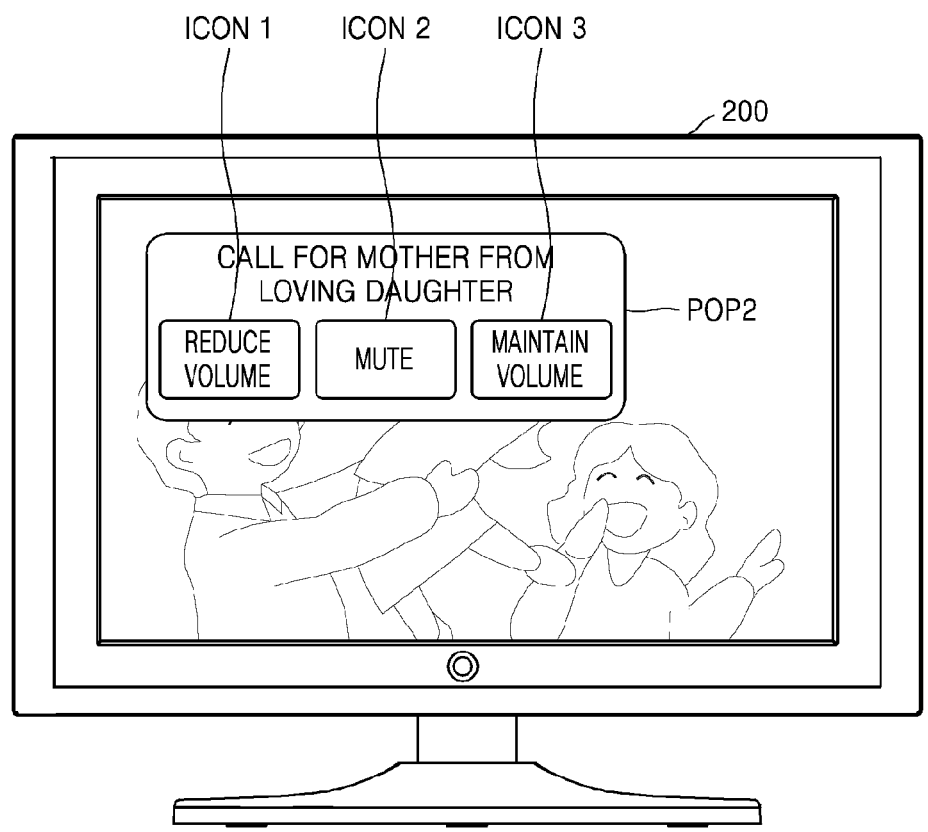
FIG. 27 illustrates an example of a screen displayed on an electronic device according to the displaying of FIG. 26.

FIG. 27 illustrates an example of a screen displayed on the electronic device 200 according to the displaying (S1726) of FIG. 26.

Referring to FIG. 27, the event generation information is displayed, for example, in a form of a pop-up window POP2, on a partial region of the screen of the electronic device 200 that is reproducing content. The pop-up window POP2 may include a plurality of selection icons, such as the volume reducing icon ICON1, the mute icon ICON2, and the volume maintaining icon ICON3.

The electronic device 200 may check or determined a user of a mobile terminal and a transmitter, determine whether to apply the automatic volume adjusting function to the checked user based on the checked user being registered in the adjusting information per user, determine whether to apply the automatic volume adjusting function to the checked transmitter based on the checked transmitter being registered in the adjusting information per transmitter, and display the event generation information in the form of the pop-up window POP2 if it is determined that the automatic volume adjusting function is applied to the checked user and the checked transmitter. For example, when the checked user is the first user, for example, mother, and the checked transmitter is the second user, for example, loving daughter, the electronic device 200 may display the pop-up window POP2 including a message "call for mother from loving daughter" on the partial region of the screen.

Figure 28:
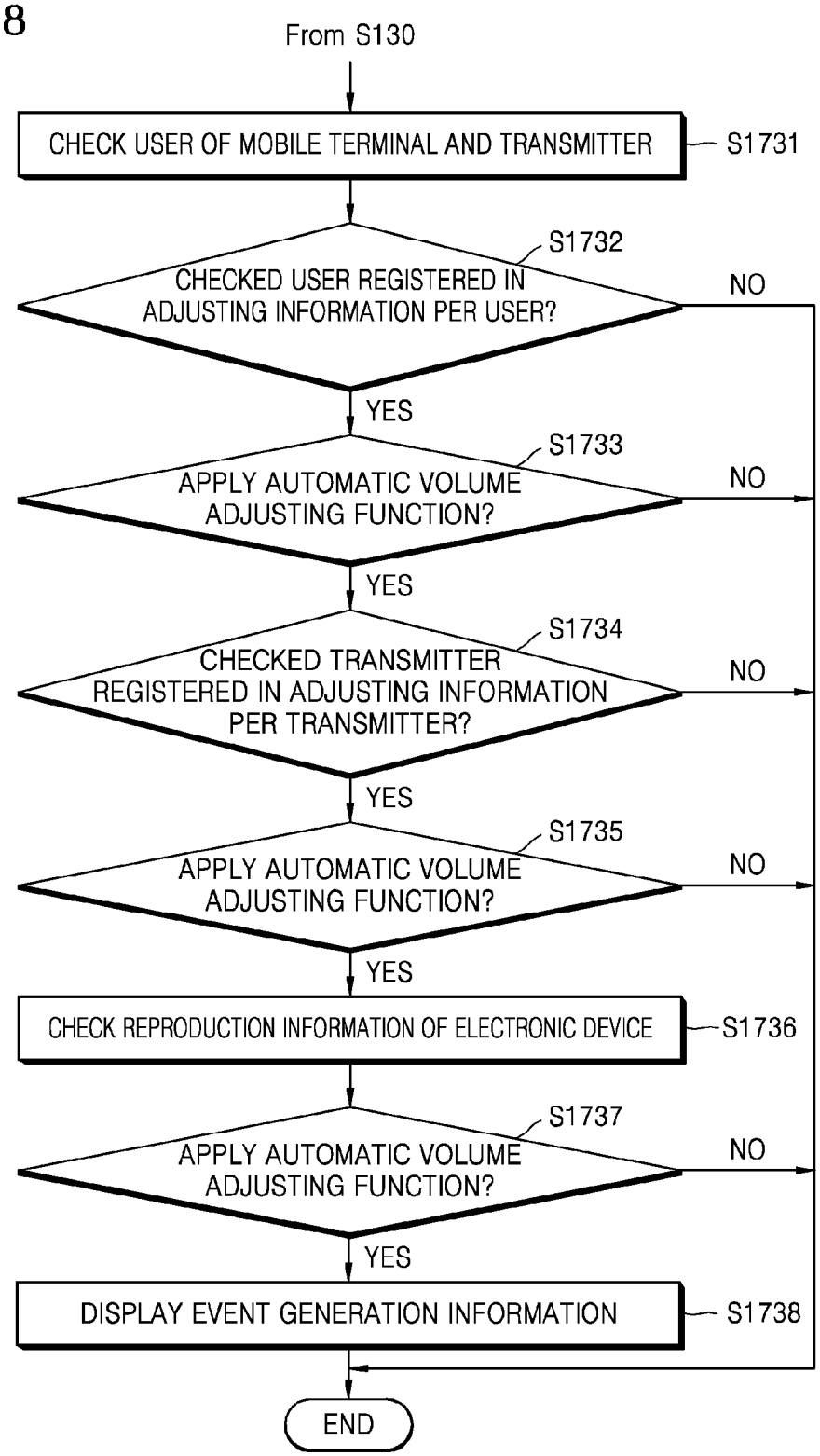
FIG. 28 is a flowchart illustrating in detail an example of the displaying of FIG. 22.

FIG. 28 is a flowchart illustrating in detail an example of the displaying of FIG. 22.

Referring to FIG. 28, in operation S1731, the electronic device 200 checks or determines a user of a mobile terminal and a transmitter (i.e., a party contacting the user of the mobile terminal 100 via the mobile terminal 100).

In operation S1732, the electronic device 200 determines whether the checked user is registered in the adjusting information per user. When the checked user is determined to be registered, operation S1733 is performed. When the checked user is determined to be not registered, the displaying is ended and the electronic device 200 may determine whether to perform the automatic volume adjusting function based on different setting information.

In operation S1733, the electronic device 200 determines whether to apply the automatic volume adjusting function to the checked user. When the automatic volume adjusting function is determined to be applied, operation S1734 is performed. When the automatic volume adjusting function is determined to be not applied, the displaying is ended and the electronic device 200 may determine whether to perform the automatic volume adjusting function based on different setting information.

In operation S1734, the electronic device 200 determines whether the checked transmitter is registered in the adjusting information per transmitter. When the checked transmitter is determined to be registered, operation S1735 is performed. When the checked transmitter is determined to be not registered, the displaying is ended and the electronic device 200 may determine whether to perform the automatic volume adjusting function based on different setting information.

In operation S1735, the electronic device 200 determines whether to apply the automatic volume adjusting function to the checked transmitter. When the automatic volume adjusting function is determined to be applied, operation S1734 is performed. When the automatic volume adjusting function is determined to be not performed, the displaying is ended and the electronic device 200 may determine whether to perform the automatic volume adjusting function based on different setting information.

In operation S1736, the electronic device 200 checks reproduction information. For example, the reproduction information may be about a title of a program currently reproduced, a genre of the program, a channel, or a current time.

In operation S1737, the electronic device 200 determines whether to apply the automatic volume adjusting function to the checked reproduction information. When the automatic volume adjusting function is determined to be applied, operation S1738 is performed. When the automatic volume adjusting function is determined to be not applied, the displaying is ended and the electronic device 200 may determine whether to perform the automatic volume adjusting function based on different setting information.

In operation S1738, the electronic device 200 displays the event generation information.

Figure 29:
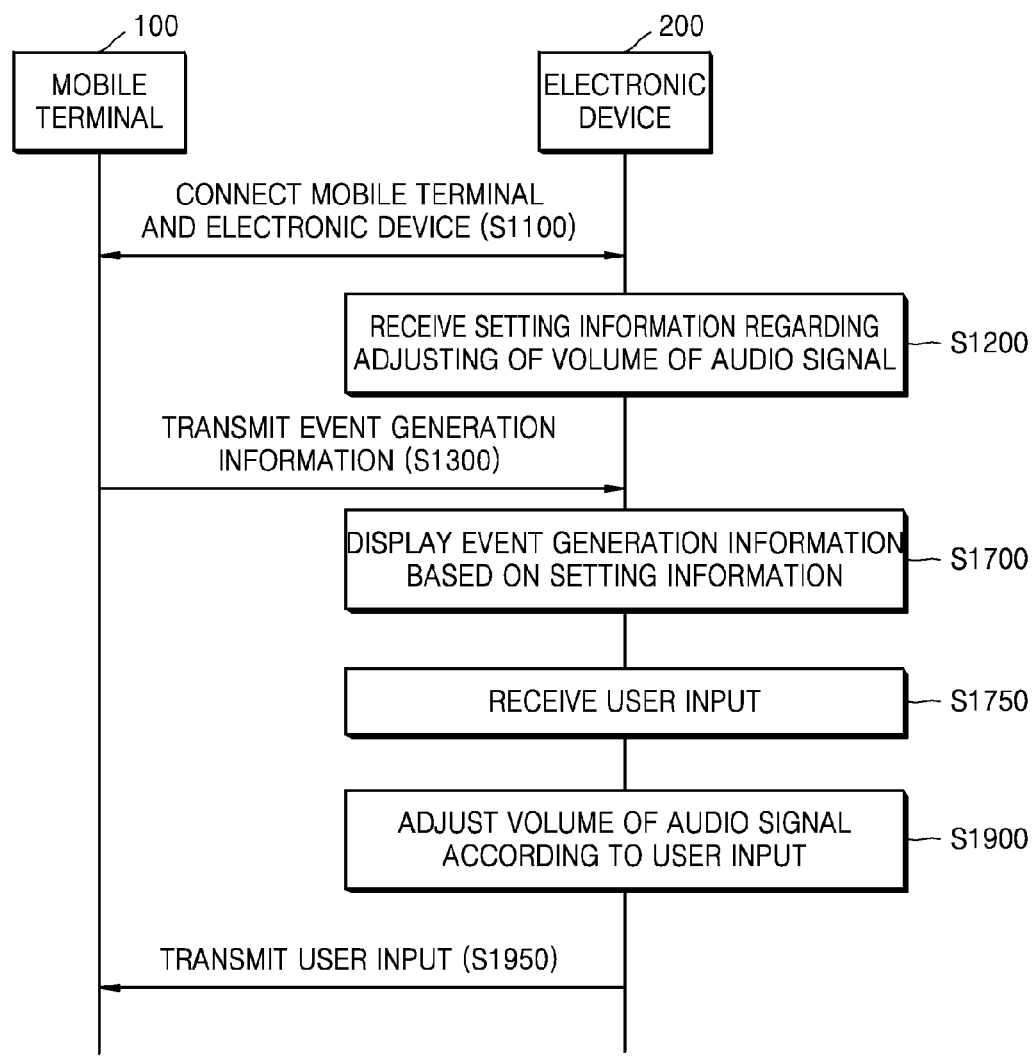
FIG. 29 is a flowchart illustrating a modified example of the operations of the system of FIG. 22.

FIG. 29 is a flowchart illustrating a modified example of the operations of the system of FIG. 22.

Referring to FIG. 29, the operations according to the exemplary embodiment further include operation S1950 compared to the operations of FIG. 22.

In operation S1100, the mobile terminal 100 and the electronic device 200 are connected to each other. That is, the mobile terminal 100 and the electronic device establish connection (e.g., communication connection) between each other. In operation S1200, the electronic device 200 receives the setting information regarding the adjusting of the volume of the audio signal. In operation S1300, the mobile terminal 100 transmits the event generation information to the electronic device 200.

In operation S1700, the electronic device 200 displays the event generation information based on the setting information. For example, the electronic device 200 may determine whether to display the event generation information based on the setting information, and when it is determined to display the event generation information, display the event generation information.

In operation S1750, the user input is received. For example, the electronic device 200 may receive a user input of commanding to perform the volume adjusting operation via a UI. Alternatively, the electronic device 200 may receive a user input of commanding to answer or reject a call via a UI.

In operation S1900, the volume of the audio signal is adjusted according to the user input. For example, when the user input includes a command/request to reduce the volume, the electronic device 200 may adjust the volume to a pre-set adjustment level. Alternatively, when the user input includes a command/request to maintain the volume, the electronic device 200 may not perform the volume adjusting operation.

In operation S1950, the electronic device 200 transmits the user input to the mobile terminal 100. For example, when the user input of commanding to answer or reject a call is received from the user, the electronic device 200 may transmit the user input to the mobile terminal 100, and thus the user may answer or reject the call without having to personally manipulate the mobile terminal 100, for example, touch the mobile terminal 100.

Figure 30:
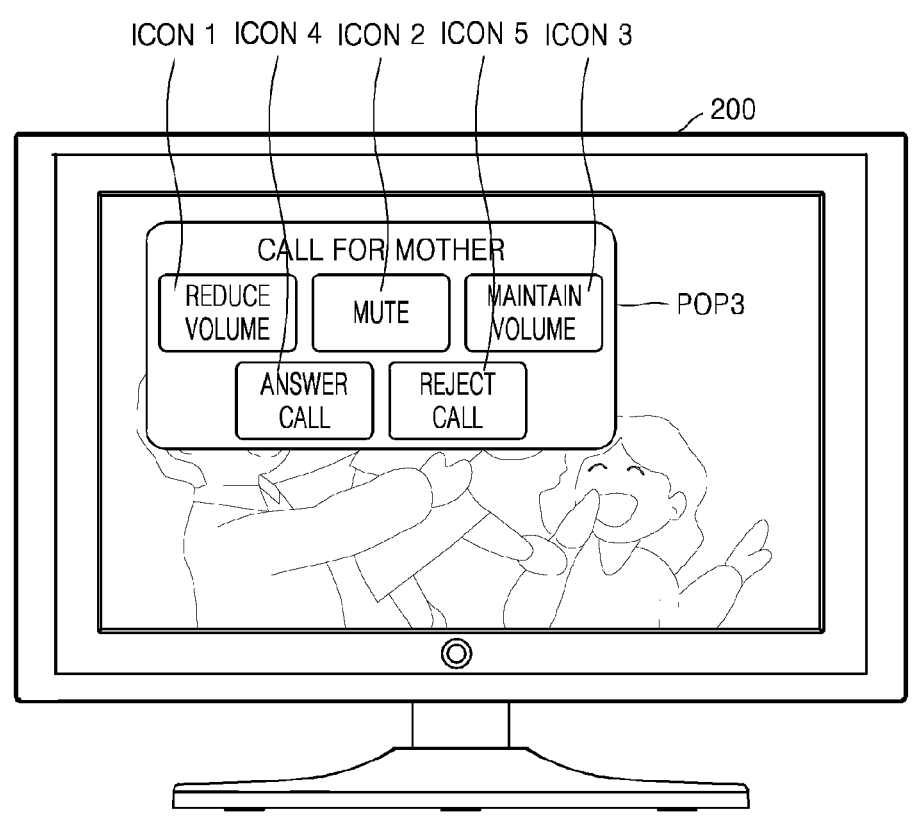
FIG. 30 illustrates an example of a screen displayed on an electronic device according to displaying of FIG. 29.

FIG. 30 illustrates an example of a screen displayed on the electronic device 200 according to displaying (S1700) of FIG. 29.

Referring to FIG. 30, the event generation information is displayed, for example, in a form of a pop-up window POP3, on a partial region of the screen of the electronic device 200 that is reproducing content. The pop-up window POP3 may include a plurality of selection icons, such as the volume reducing icon ICON1, the mute icon ICON2, the volume maintaining icon ICON3, a call answering icon ICON4, and a call rejecting icon ICON5.

The electronic device 200 may check or determine a user of a mobile terminal, determine whether to apply the automatic volume adjusting function to the checked user when the checked user is registered in adjusting information per user, and display the event generation information in the form of the pop-up window POP3 when the automatic volume adjusting function is determined to be applied. For example, when the user is the first user, for example, mother, the electronic device 200 may display the pop-up window POP3 including a message "call for mother" on the partial region of the screen of the electronic device 200.

Furthermore, for example, when the first user presses the call answering icon ICON4 or the call rejecting icon ICON5, the electronic device 200 may transmit a relevant user input to the mobile terminal 100. Accordingly, the first user may answer or reject the call through the electronic device 200 without having to control the mobile terminal 100.

Figure 31:
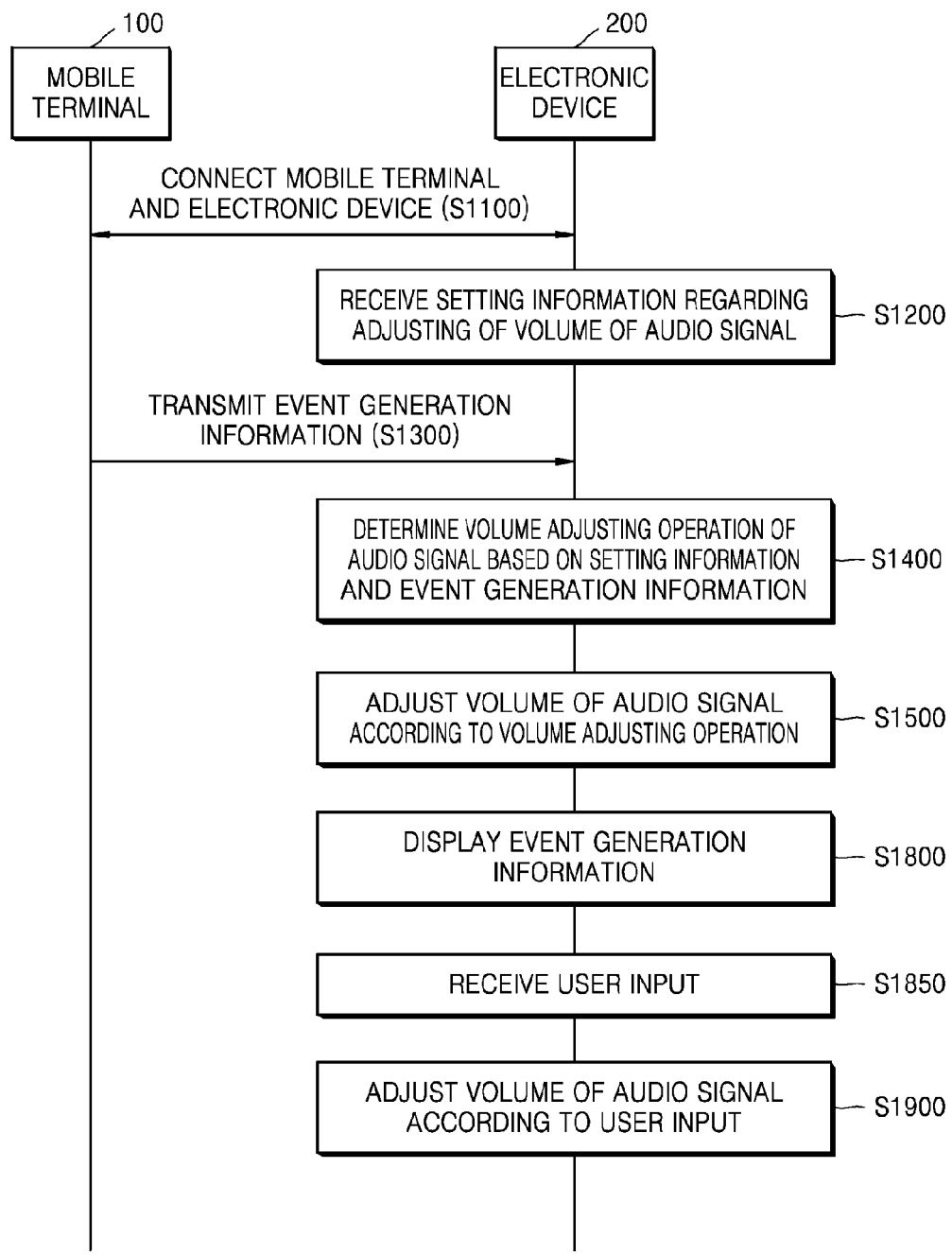
FIG. 31 is a flowchart illustrating an modified example of the operations of the system of FIG. 4.

FIG. 31 is a flowchart illustrating a modified example of the operations of the system of FIG. 4.

Referring to FIG. 31, the operations according to the exemplary embodiment correspond to a method of adjusting volume of an audio signal based on setting information, and further include displaying the volume adjusting operation compared to the operations of FIG. 4.

In operation S1100, the mobile terminal 100 and the electronic device 200 are connected to each other. That is, the mobile terminal 100 and the electronic device establish connection (e.g., communication connection) between each other. In operation S1200, the electronic device 200 receives the setting information regarding the adjusting of the volume of the audio signal. In operation S1300, the mobile terminal 100 transmits the event generation information to the electronic device 200. In operation S1400, the electronic device 200 determines the volume adjusting operation of the audio signal based on the setting information and the event generation information. In operation S1500, the electronic device 200 adjusts the volume of the audio signal according to the volume adjusting operation.

In operation S1800, the electronic device 200 displays the event generation information. In operation S1850, the electronic device 200 receives the user input. In operation S1900, the electronic device 200 re-adjusts the volume of the audio signal according to the user input.

Figure 32:
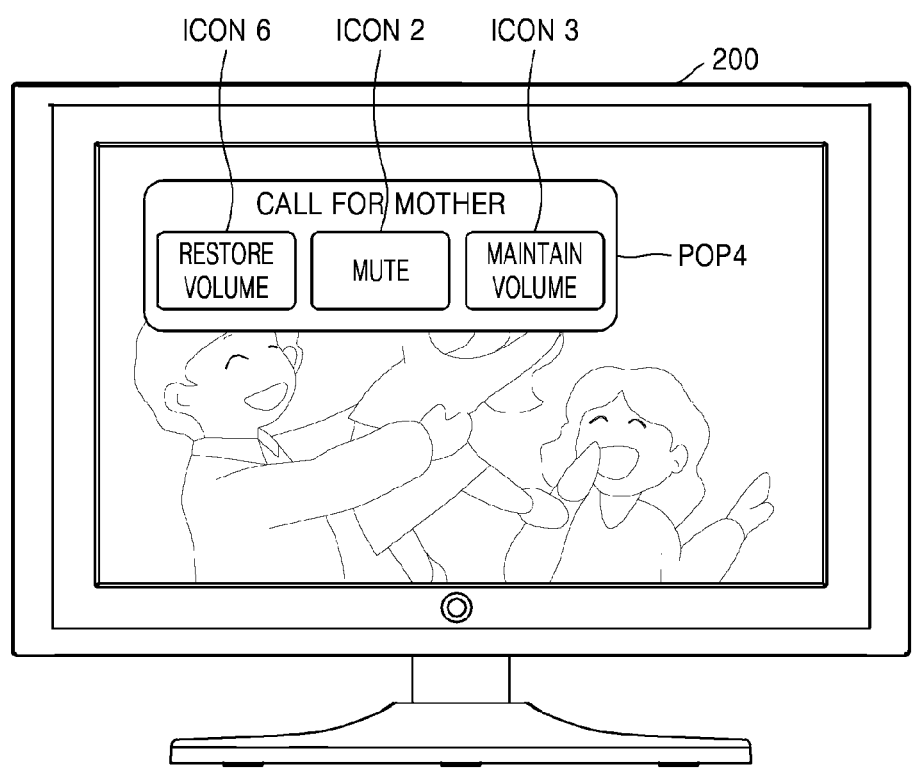
FIG. 32 illustrates an example of a screen displayed on an electronic device according to displaying of FIG. 31.

FIG. 32 illustrates an example of a screen displayed on the electronic device 200 according to displaying (S1800) of FIG. 31.

Referring to FIG. 32, the event generation information is displayed, for example, in a form of a pop-up window POP4, on a partial region of the screen of the electronic device 200 that is reproducing content. The pop-up window POP4 may include a plurality of selection icons, such as a volume restoring icon ICON6, the mute icon ICON2, and the volume maintaining icon ICON3.

When the event generation information is received, the electronic device 200 may determine the volume adjusting operation according to the setting information, adjust the volume of the audio signal according to the volume adjusting operation, and display the event generation information in the form of the pop-up window POP4. For example, when a user of a mobile terminal 100 that transmitted the event generation information is the first user, for example, mother, the electronic device 200 may display the pop-up window POP4 including a message "call for mother" on the partial region of the screen. At this time, the first or second user may select the volume restoring icon ICON6 when it is determined that the volume is not required to be reduced according to the volume adjusting operation. When the volume restoring icon ICON6 is selected, the electronic device 200 may restore the volume of the audio signal to the original volume, i.e., the volume at the point of time when the event generation information is received.

Figure 33:
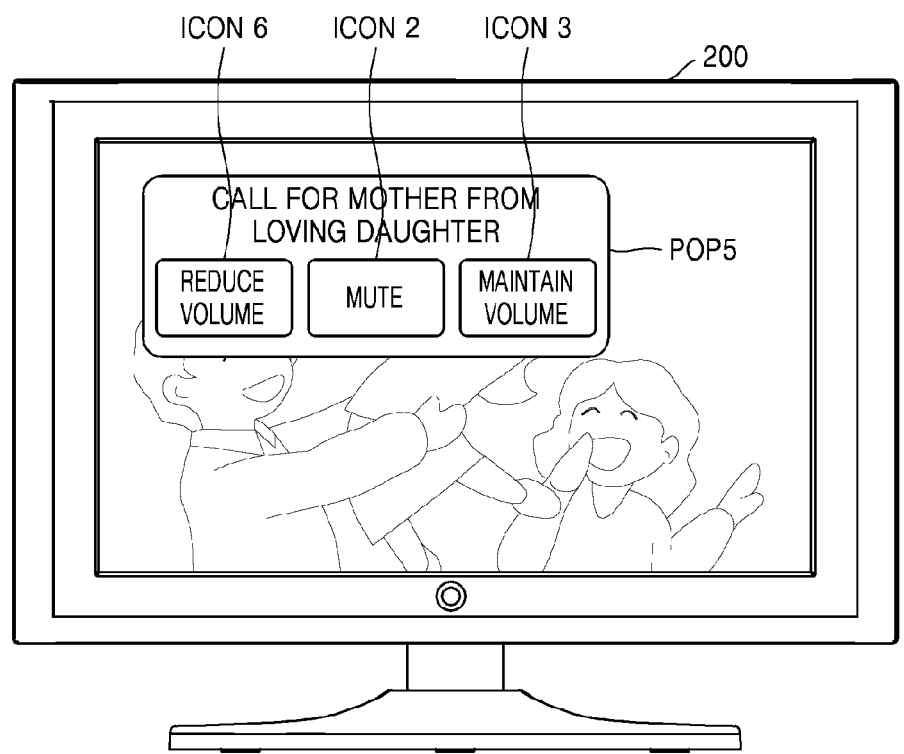
FIG. 33 illustrates an example of a screen displayed on an electronic device according to the displaying of FIG. 31.

FIG. 33 illustrates an example of a screen displayed on the electronic device 200 according to the displaying (S1800) of FIG. 31.

Referring to FIG. 33, the event generation information is displayed, for example, in a form of a pop-up window POP5, on a partial region of the screen of the electronic device 200 that is reproducing content. The pop-up window POP5 may include a plurality of selection icons, such as the volume restoring icon ICON6, the mute icon ICON2, and the volume maintaining icon ICON3.

When the event generation information is received, the electronic device 200 may determine the volume adjusting operation of the audio signal according to the setting information, adjust the volume of the audio signal according to the volume adjusting operation, and display the event generation information in the form of the pop-up window POP5. For example, when a user of a mobile terminal that transmitted the event generation information is the first user, for example, mother, and the transmitter is the second user, for example, loving daughter, the electronic device 200 may display the pop-up window POP5 including a message "call for mother from loving daughter" on the partial region of the screen. At this time, it is determines that the volume is not required to be reduced according to the volume adjusting operation, the first or second user may select the volume restoring icon ICON6. When the volume restoring icon ICON6 is selected, the electronic device 200 may restore the volume of the audio signal to the original volume, i.e., the volume at the point of time when the event generation information is received.

Figure 34:
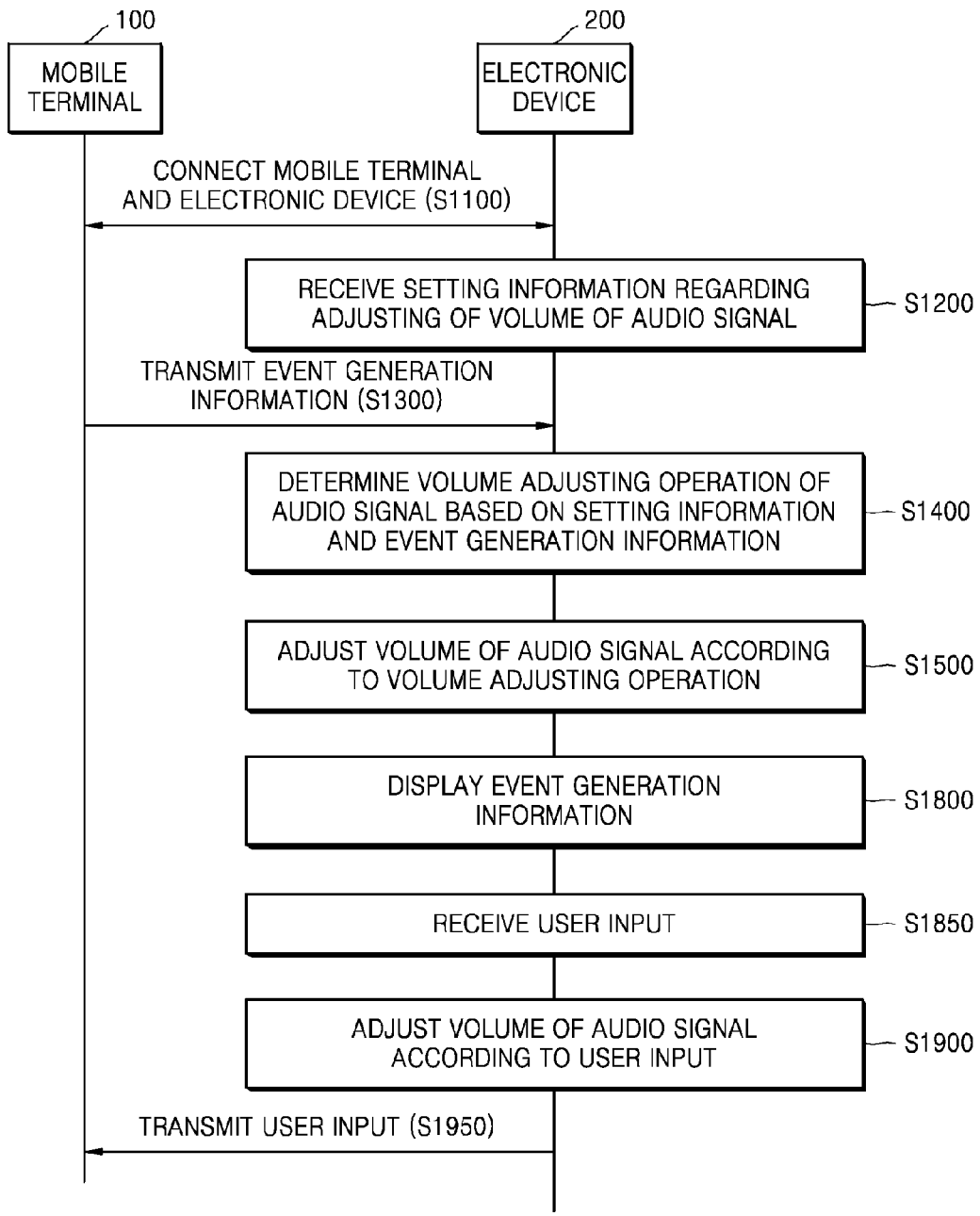
FIG. 34 is a flowchart illustrating a modified example of the operations of the system of FIG. 31.

FIG. 34 is a flowchart illustrating a modified example of the operations of the system of FIG. 31.

Referring to FIG. 34, the operations according to the exemplary embodiment correspond to a method of adjusting volume of an audio signal based on setting information, and further include transmitting of the user input compared to the operations of FIG. 31.

In operation S1100, the mobile terminal 100 and the electronic device 200 are connected to each other. That is, the mobile terminal 100 and the electronic device establish connection (e.g., communication connection) between each other. In operation S1200, the electronic device 200 receives the setting information regarding the adjusting of the volume of the audio signal. In operation S1300, the mobile terminal 100 transmits the event generation information to the electronic device 200. In operation S1400, the electronic device 200 determines the volume adjusting operation based on the setting information and the event generation information. In operation S1500, the electronic device 200 adjusts the volume of the audio signal according to the volume adjusting operation.

In operation S1800, the electronic device 200 displays the event generation information. In operation S1850, the electronic device 200 receives the user input. In operation S1900, the electronic device 200 re-adjusts the volume of the audio signal according to the user input. In operation S1950, the electronic device 200 transmits the user input to the mobile terminal 100.

Figure 35:
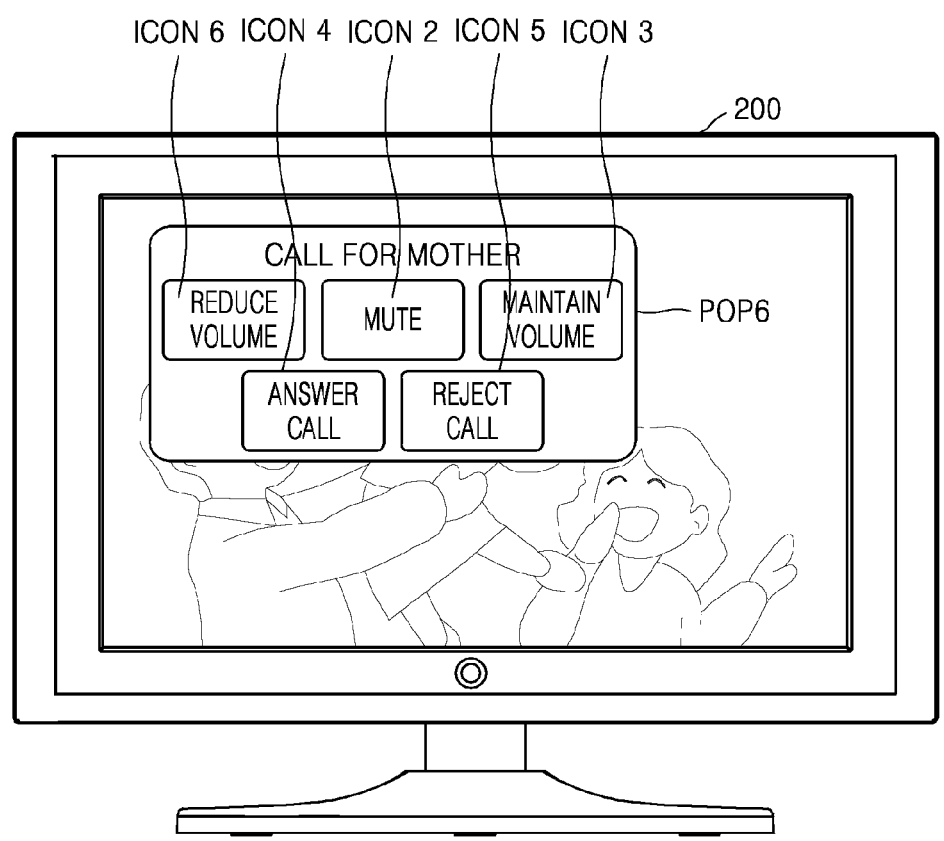
FIG. 35 illustrates an example of a screen displayed on an electronic device according to displaying of FIG. 34.

FIG. 35 illustrates an example of a screen displayed on the electronic device 200 according to displaying (S1800) of FIG. 34.

Referring to FIG. 35, the event generation information is displayed, for example, in a form of a pop-up window POP6, on a partial region of the screen of the electronic device 200 that is reproducing content. The pop-up window POP6 may include a plurality of selection icons, such as the volume restoring icon ICON6, the mute icon ICON2, the volume maintaining icon ICON3, the call answering icon ICON4, and the call rejecting icon ICON5.

When the event generation information is received, the electronic device 200 may determine the volume adjusting operation according to the setting information, adjust the volume of the audio signal according to the volume adjusting operation, and display the event generation information in the form of the pop-up window POP6. For example, when a user of a mobile terminal 100 that transmitted the event generation information is the first user, for example, mother, the electronic device 200 may display the popup window POP6 including a message "call for mother from loving daughter" on the partial region of the screen.

Furthermore, for example, when the first user presses the call answering icon ICON4 or the call rejecting icon ICON5, the electronic device 200 may transmit a relevant user input to the mobile terminal 100. Accordingly, the first user may answer or reject a call through the electronic device 200 without having to personally control the mobile terminal 100.

Figure 36:
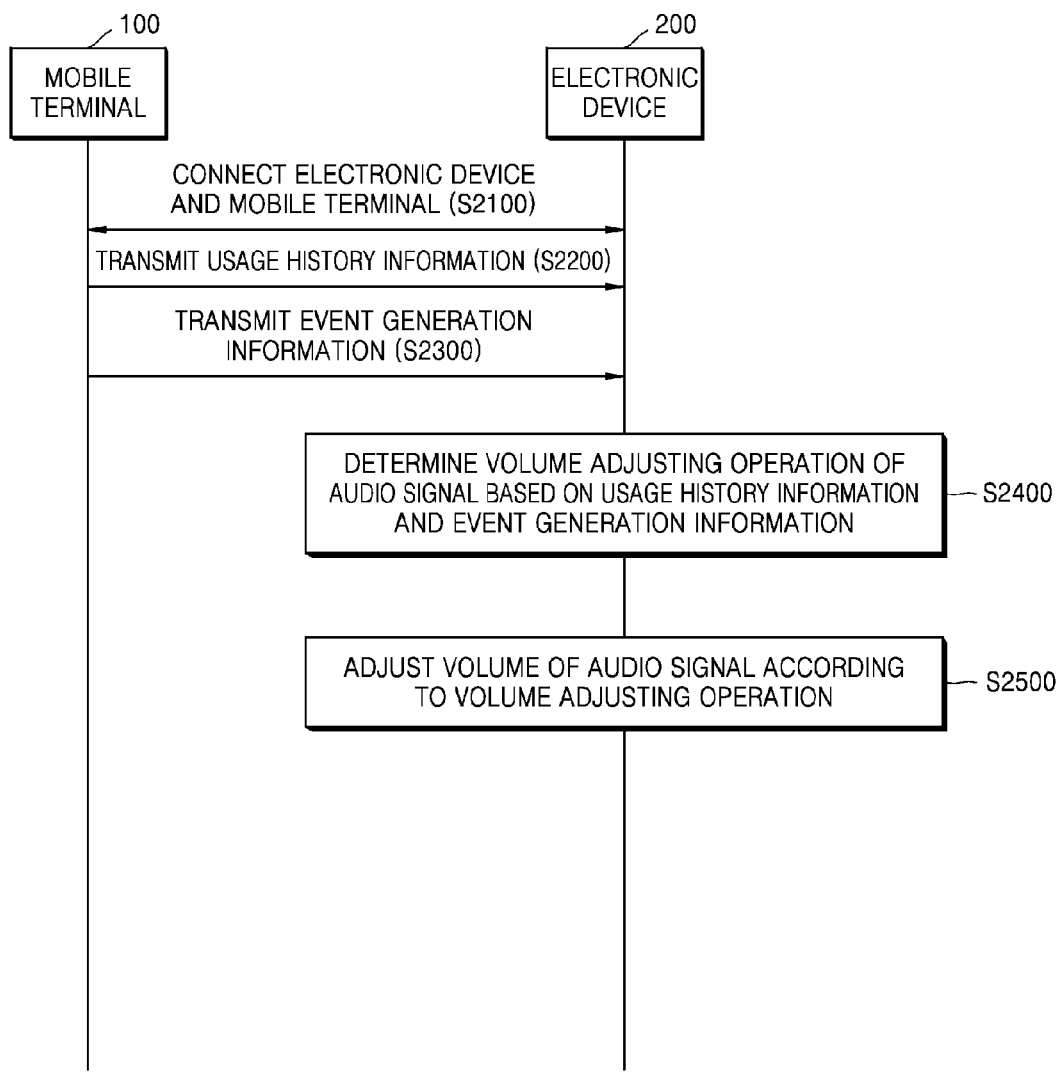
FIG. 36 is a flowchart illustrating an example of the operations of the system according to the method of FIG. 3.

FIG. 36 is a flowchart illustrating an example of the operations of the system according to the method of FIG. 3.

Referring to FIG. 36, the method according to the exemplary embodiment is a method of adjusting volume of an audio signal based on the usage history information, and includes operations that are performed in time-series by the mobile terminal 100 and the electronic device 200 included in the system 100 of FIG. 1. Thus, details described above with reference to the system 10 of FIG. 1 are applied to the method according to the exemplary embodiment even if omitted.

In operation S2100, the mobile terminal 100 and the electronic device 200 are connected to each other. That is, the mobile terminal 100 and the electronic device establish connection (e.g., communication connection) between each other.

In operation S2200, the mobile terminal 100 transmits the usage history information to the electronic device 200. In the exemplary embodiment, the usage history information may include at least one of a call history list, a missed call list, a blocked call list, a contact list, and a favorites list of the mobile terminal 100.

In operation S2300, the mobile terminal 100 transmits the event generation information to the electronic device 200.

In operation S2400, the electronic device 200 determines the volume adjusting operation of the audio signal based on the usage history information and the event generation information.

In operation S2500, the electronic device 200 adjusts the volume of the audio signal according to the volume adjusting operation.

Figure 37:
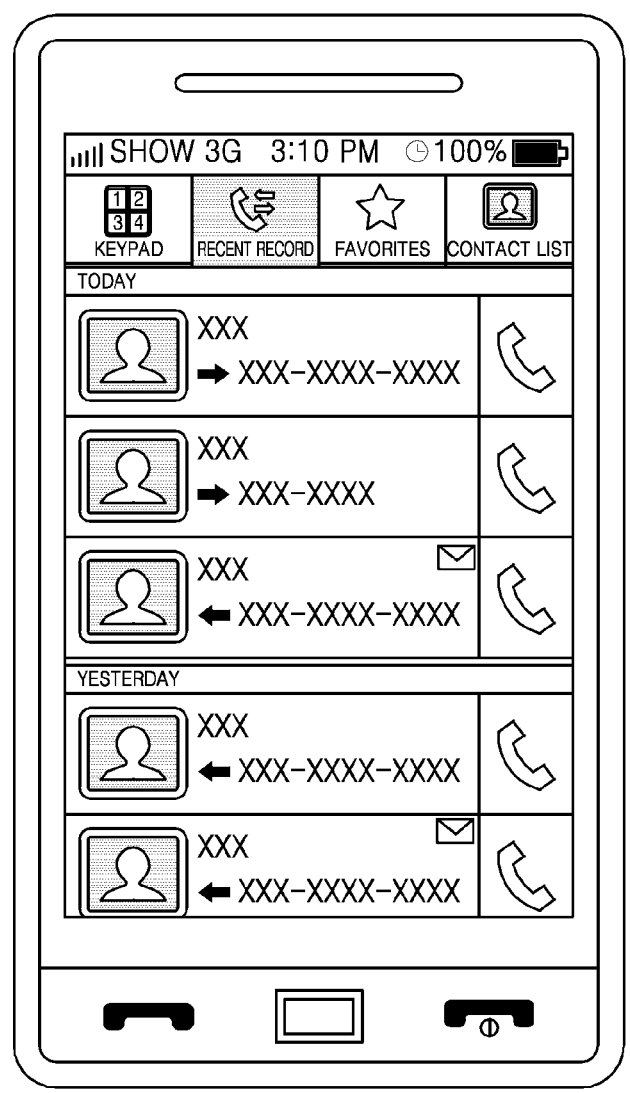
FIG. 37 illustrates an example of usage history information of FIG. 36.

FIG. 37 illustrates an example of usage history information UI1 of FIG. 36.

Referring to FIG. 37, the usage history information UI1 may correspond to the call history list of the mobile terminal 100, for example, an entire call history list or a partial call history list. According to an exemplary embodiment, the usage history information UI1 may include an outgoing call history. According to an exemplary embodiment, the usage history information UI1 may include an incoming call history. According to an exemplary embodiment, the usage history information UI1 may include an outgoing call history and an incoming call history.

Figure 38:
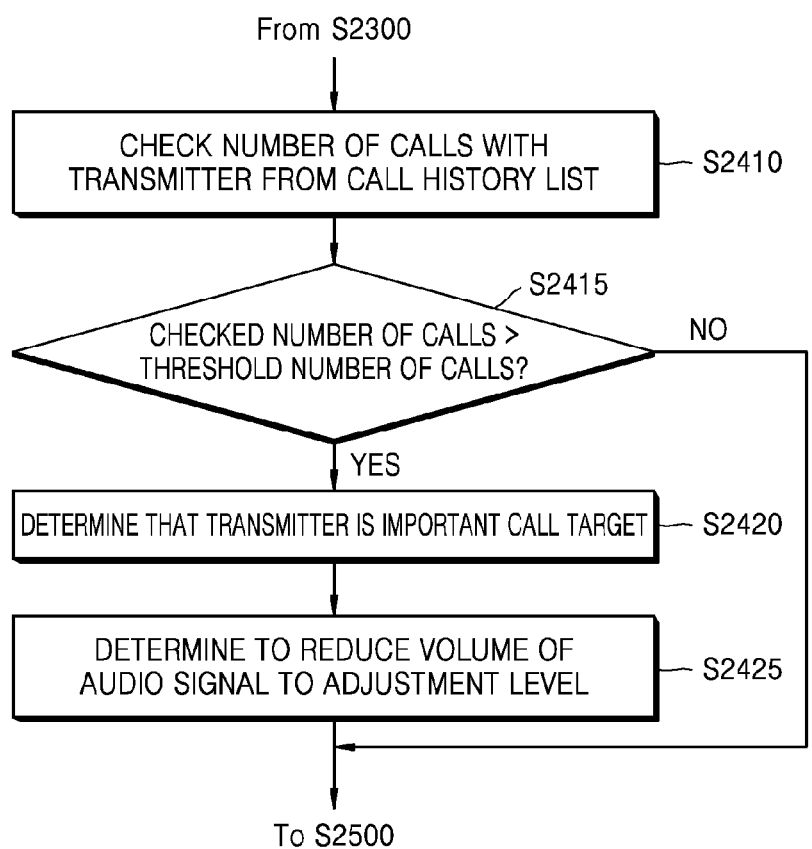
FIG. 38 is a flowchart illustrating in detail the determining of the volume adjusting operation based on the usage history information of FIG. 37.

FIG. 38 is a flowchart illustrating in detail the determining of the volume adjusting operation based on the usage history information UI1 of FIG. 37.

Referring to FIG. 38, in operation S2410, the electronic device 200 checks a number of calls with a transmitter from the call history list. In operation S2415, the electronic device 200 determines whether the checked number of calls is equal to or higher than a threshold number of calls. When the checked number of calls is equal to or higher than the threshold number of calls, operation S2420 is performed. When the checked number of calls is lower than the threshold number of calls, the determining is ended and the electronic device 200 may determine whether to perform the automatic volume adjusting function based on different setting information.

In operation S2420, the electronic device 200 determines that the transmitter is an important call target. In operation S2425, the electronic device 200 determines to reduce the volume of the audio signal to the adjustment level.

Figure 39:
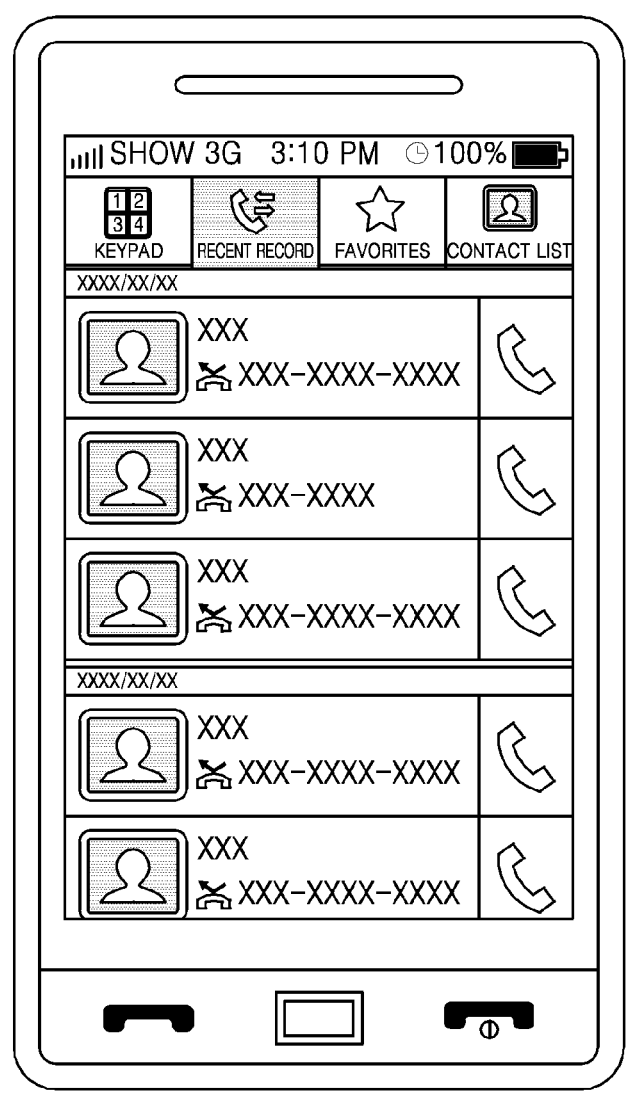
FIG. 39 illustrates an example of usage history information of FIG. 36.

FIG. 39 illustrates an example of usage history information UI2 of FIG. 36.

Referring to FIG. 39, the usage history information UI2 may correspond to the missed call list. For example, a user may unintentionally not answer a call due to the user's situation. Alternatively, for example, the user may intentionally not answer a call if the user does not want to talk to a transmitter.

Figure 40:
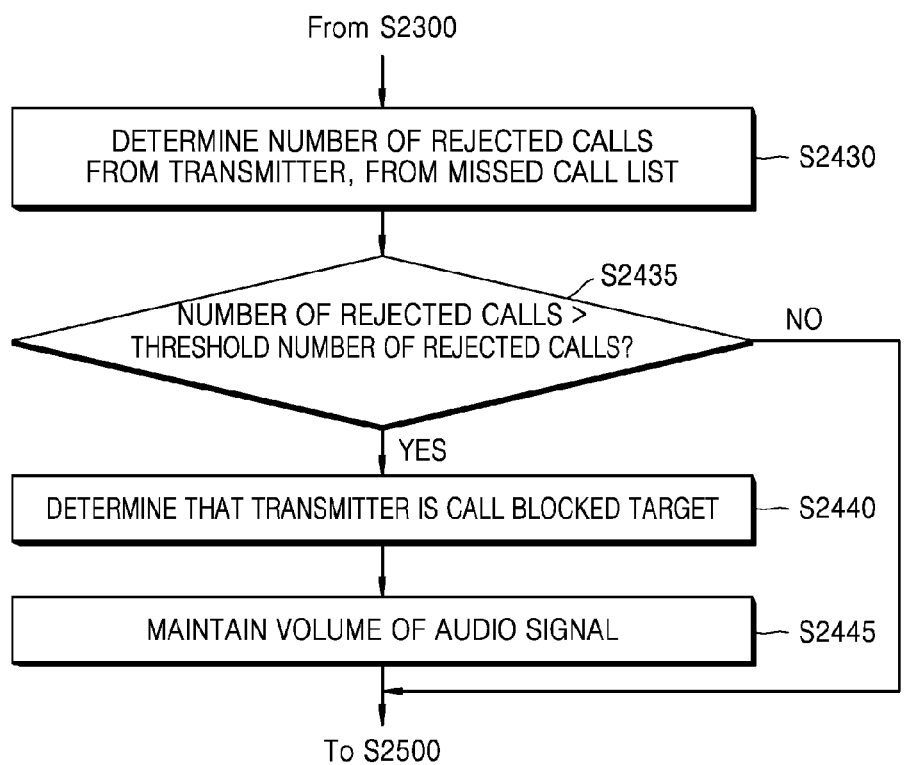
FIG. 40 is a flowchart illustrating in detail the determining of the volume adjusting operation based on the usage history information of FIG. 39.

FIG. 40 is a flowchart illustrating in detail the determining of the volume adjusting operation based on the usage history information UI2 of FIG. 39.

Referring to FIG. 40, in operation S2430, the electronic device 200 determines a number of rejected calls from a transmitter, from the missed call list. In operation S2435, the electronic device 200 determines whether the number of rejected calls is equal to or higher than a threshold number of rejected calls. When the number of rejected calls is equal to or higher than the threshold number of rejected calls, operation S2440 is performed. When the number of rejected calls is lower than the threshold number of rejected calls, the determining is ended and the electronic device 200 may determine whether to perform the automatic volume adjusting function based on different setting information.

In operation S2440, the electronic device 200 determines that the transmitter is a call blocked target. In operation S2445, the electronic device 200 maintains the volume of the audio signal. As such, according to the exemplary embodiment, when the transmitter is a call blocked target, the electronic device 200 may maintain the volume of the audio signal without separate adjustment, thereby promoting user convenience.

Figure 41:
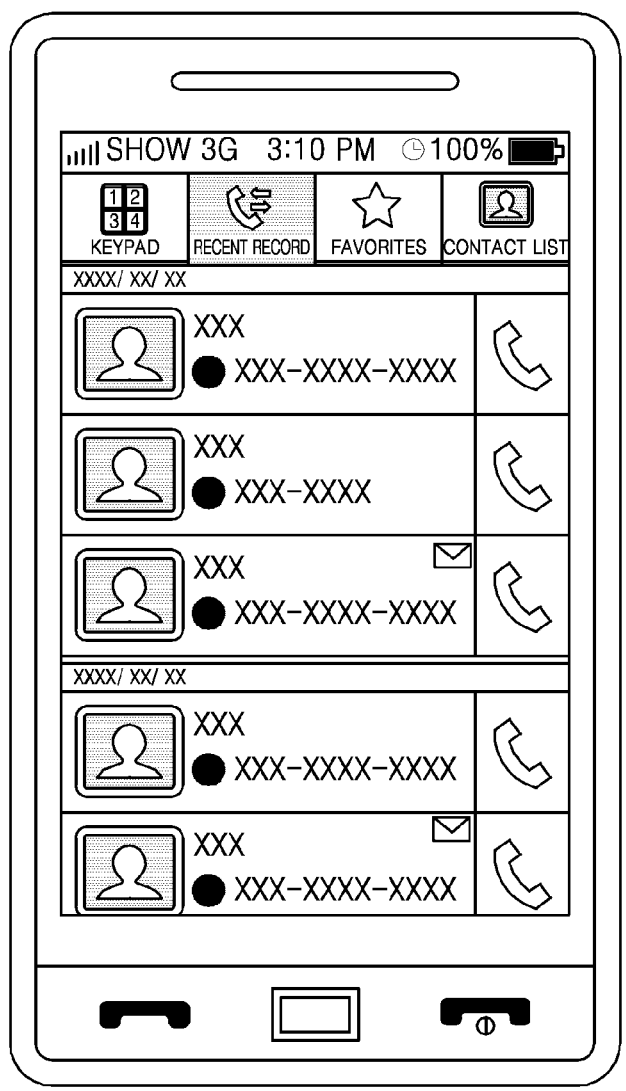
FIG. 41 illustrates an example of usage history information of FIG. 36.

FIG. 41 illustrates an example of usage history information UI3 of FIG. 36.

Referring to FIG. 41, the usage history information UI3 may correspond to the blocked call list. A user may add a phone number of a transmitter the user does not want to talk to the blocked call list, and set the mobile terminal 100 not to display a call from the transmitter.

Figure 42:
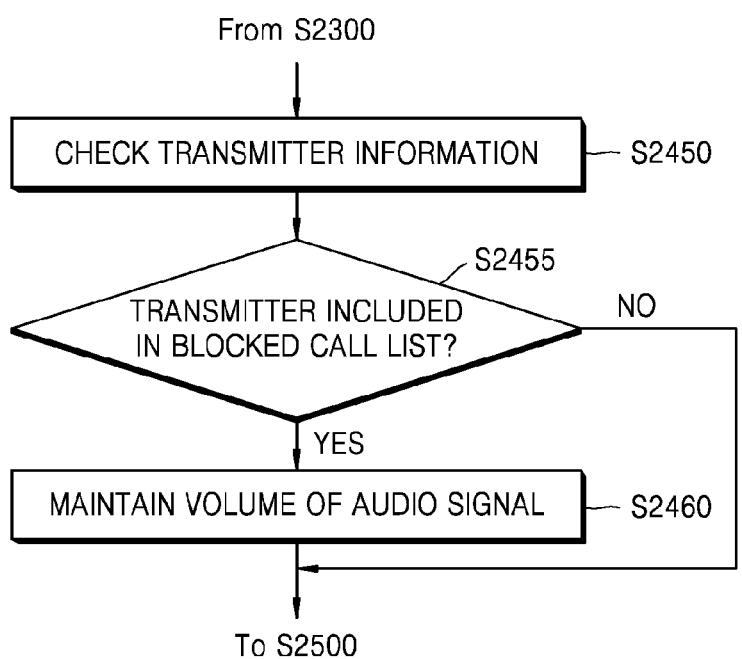
FIG. 42 is a flowchart illustrating in detail the determining of the volume adjusting operation based on the usage history information of FIG. 41.

FIG. 42 is a flowchart illustrating in detail the determining of the volume adjusting operation based on the usage history information UI3 of FIG. 41.

Referring to FIG. 42, in operation S2450, the electronic device 200 checks the transmitter information. In operation S2455, the electronic device 200 determines whether the transmitter is included in the blocked call list. In operation S2460, the electronic device 200 maintains the volume of the audio signal. As such, according to the exemplary embodiment, when the transmitter is the call blocked target, the electronic device 200 may maintain the volume of the audio signal without separate adjustment, thereby promoting user convenience.

Figure 43:
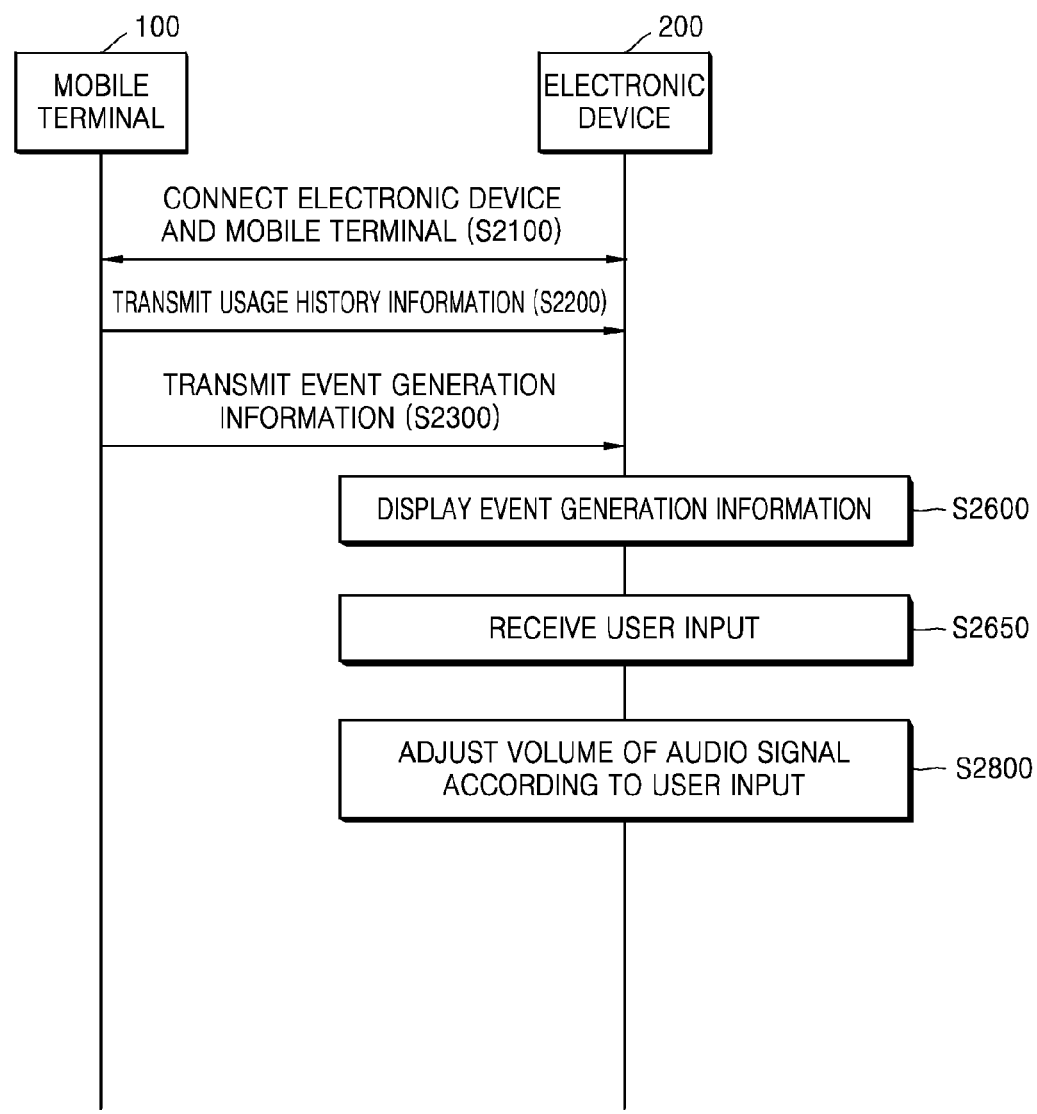
FIG. 43 is a flowchart illustrating a modified example of the operations of the system of FIG. 36.

FIG. 43 is a flowchart illustrating a modified example of the operations of the system of FIG. 36.

Referring to FIG. 43, the operations according to the exemplary embodiment correspond to a method of adjusting volume of an audio signal based on the usage history information, and include displaying of the event generation information instead of operations S2400 and S2500 compared to the operations of FIG. 36.

In operation S2100, the mobile terminal 100 and the electronic device 200 are connected to each other. That is, the mobile terminal 100 and the electronic device establish connection (e.g., communication connection) between each other. In operation S2200, the mobile terminal 100 transmits the usage history information to the electronic device 200. In operation S2300, the mobile terminal 100 transmits the event generation information to the electronic device 200.

In operation S2600, the electronic device 200 displays the event generation information based on the usage history information. In operation S2650, the electronic device 200 receives the user input. In operation S2800, the electronic device 200 adjusts the volume of the audio signal according to the user input.

Figure 44:
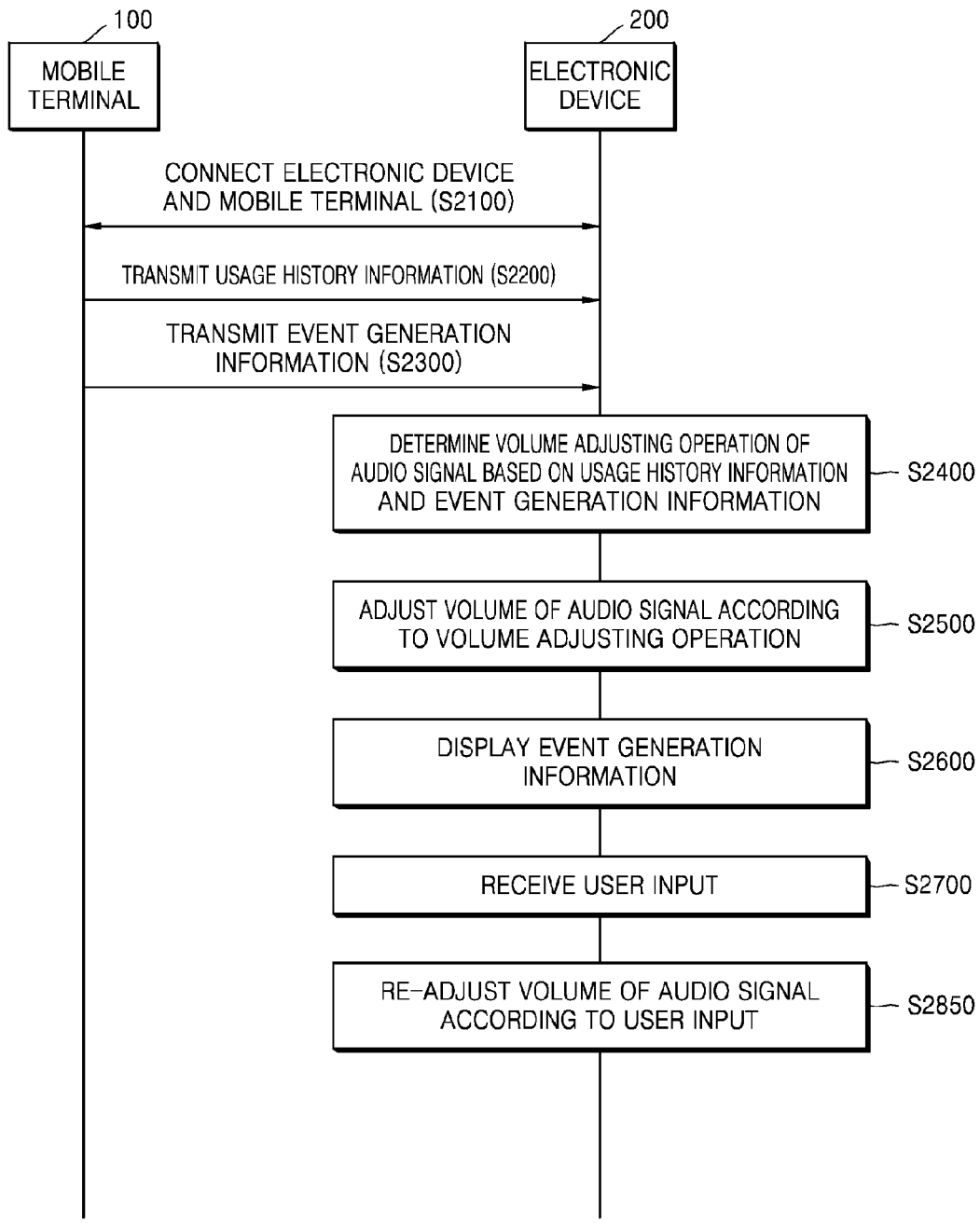
FIG. 44 is a flowchart illustrating an modified example of the operations of the system of FIG. 36.

FIG. 44 is a flowchart illustrating a modified example of the operations of the system of FIG. 36.

Referring to FIG. 44, the operations according to the exemplary embodiment correspond to a method of adjusting volume of an audio signal based on the usage history information, and further include displaying of the event generation information compared to the operations of FIG. 36.

In operation S2100, the mobile terminal 100 and the electronic device 200 are connected to each other. In operation S2200, the mobile terminal 100 transmits the usage history information to the electronic device 200. In operation S2300, the mobile terminal 100 transmits the event generation information to the electronic device 200. In operation S2400, the electronic device 200 determines the volume adjusting operation based on the usage history information and the event generation information. In operation S2500, the electronic device 200 adjusts the volume of the audio signal according to the volume adjusting operation.

In operation S2600, the electronic device 200 displays the event generation information. In operation S2700, the electronic device 200 receives the user input. In operation S2850, the electronic device 200 re-adjusts the volume of the audio signal according to the user input.

Figure 45:
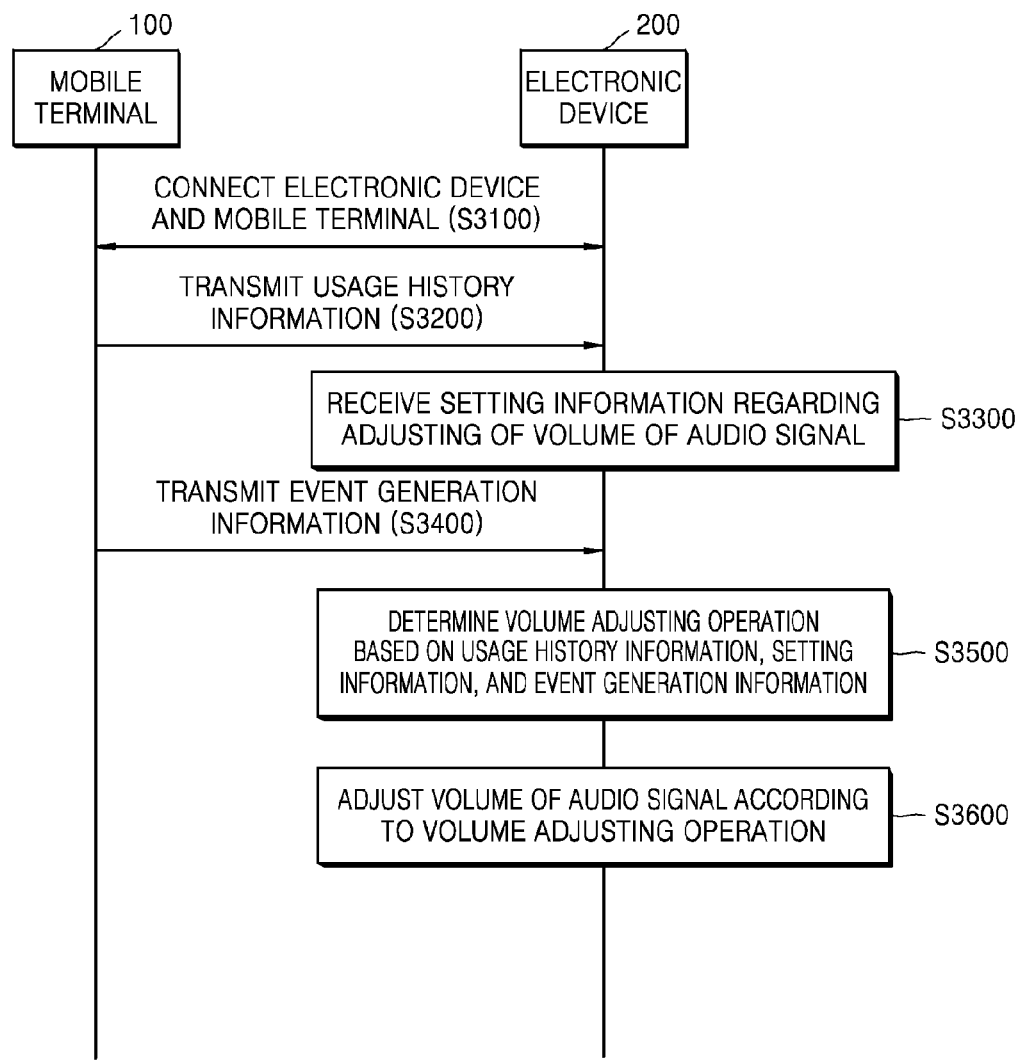
FIG. 45 is a flowchart illustrating an example of the operations of the system according to the method of FIG. 3.

FIG. 45 is a flowchart illustrating an example of the operations of the system according to the method of FIG. 3.

Referring to FIG. 45, the operations according to the exemplary embodiment correspond to a method of adjusting volume of an audio signal based on the usage history information and the setting information, and include operations that are processed in time-series by the mobile terminal 100 and the electronic device 200 of the system 10 of FIG. 1. Accordingly, details described above with reference to the system 10 of FIG. 1 are applied to the operations according to the exemplary embodiment even if omitted.

In operation S3100, the mobile terminal 100 and the electronic device 200 are connected to each other. That is, the mobile terminal 100 and the electronic device establish connection (e.g., communication connection) between each other. In operation S3200, the mobile terminal 100 transmits the usage history information to the electronic device 200. In operation S3300, the electronic device 200 receives the setting information regarding adjusting of the volume of the audio signal. In operation S3400, the mobile terminal 100 transmits the event generation information to the electronic device 200.

In operation S3500, the electronic device 200 adjusts the volume adjusting operation based on the usage history information, the setting information, and the event generation information. In operation S3600, the electronic device 200 adjusts the volume of the audio signal according to the volume adjusting operation.

Figure 46:
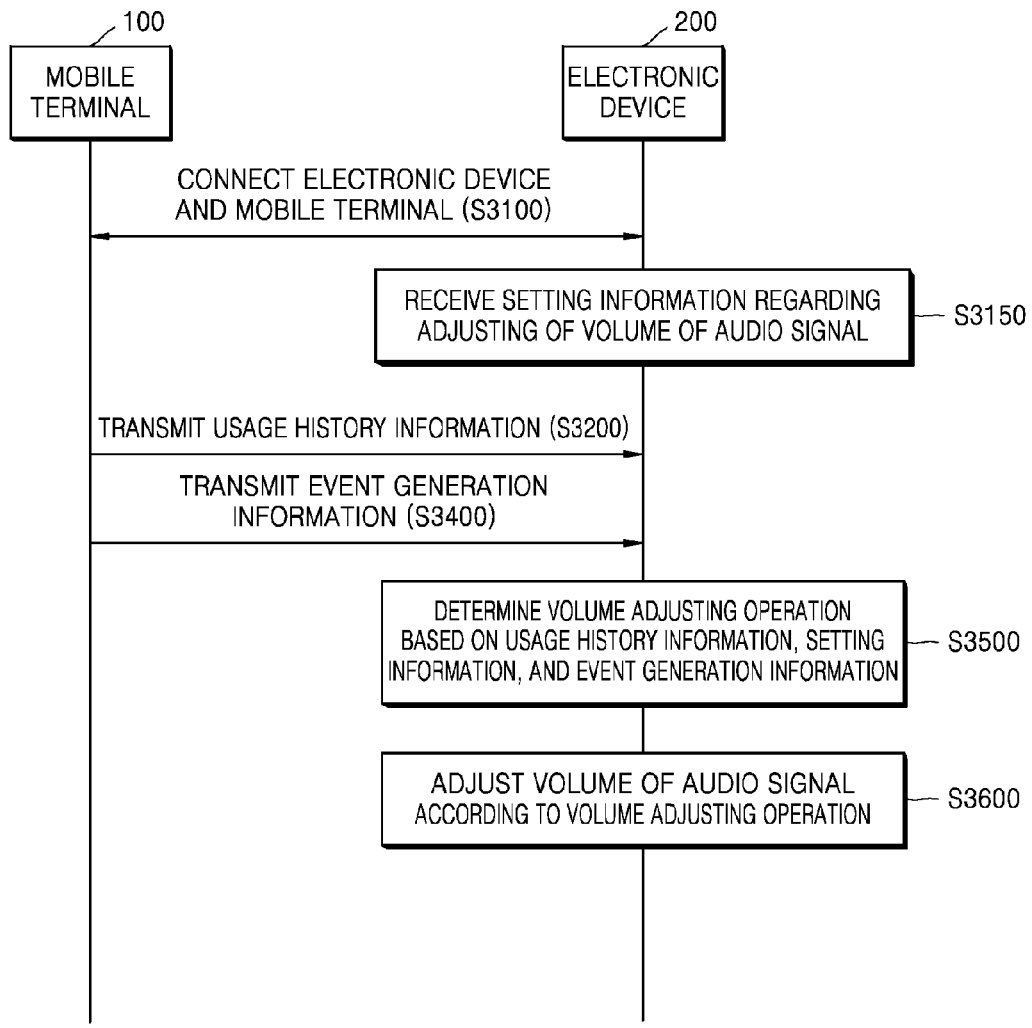
FIG. 46 is a flowchart illustrating a modified example of the operations of the system of FIG. 45.

FIG. 46 is a flowchart illustrating a modified example of the operations of the system of FIG. 45.

Referring to FIG. 46, unlike the operations of FIG. 45, in the operations according to the exemplary embodiment, the electronic device 200 receives the setting information first, and then the mobile terminal 100 transmits the usage history information to the electronic device 200.

In operation S3100, the mobile terminal 100 and the electronic device 200 are connected to each other. That is, the mobile terminal 100 and the electronic device establish connection (e.g., communication connection) between each other. In operation S3150, the electronic device 200 receives the setting information regarding adjusting of the volume of the audio signal. In operation S3200, the mobile terminal 100 transmits the usage history information to the electronic device 200. In operation S3400, the mobile terminal 100 transmits the event generation information to the electronic device 200. According to an exemplary embodiment, an order of performing operations S3400 and S3200 may be changed, and according to an exemplary embodiment, operations S3400 and S3200 may be simultaneously performed.

In operation S3500, the electronic device 200 determines the volume adjusting operation based on the usage history information, the setting information, and the event generation information. In operation S3600, the electronic device 200 adjusts the volume of the audio signal according to the volume adjusting operation.

Figure 47:
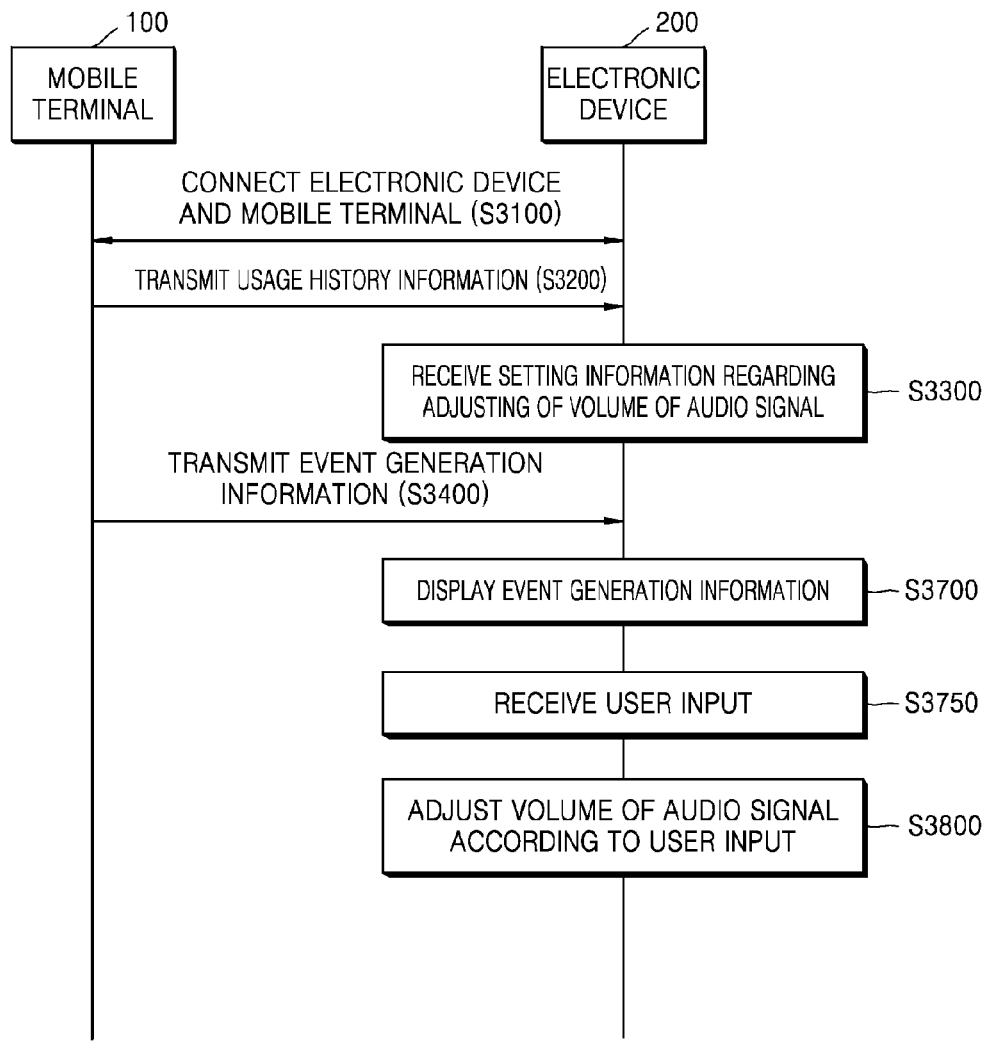
FIG. 47 is a flowchart illustrating an modified example of the operations of the system of FIG. 45.

FIG. 47 is a flowchart illustrating an modified example of the operations of the system of FIG. 45.

Referring to FIG. 47, the operations according to the exemplary embodiment includes displaying of the event generation information and receiving of the user input instead of operations S3500 and S3600 compared to the operations of FIG. 45.

In operation S3100, the mobile terminal 100 and the electronic device 200 are connected to each other. That is, the mobile terminal 100 and the electronic device establish connection (e.g., communication connection) between each other. In operation S3200, the mobile terminal 100 transmits the usage history information to the electronic device 200. In operation S3300, the electronic device 200 receives the setting information regarding adjusting of the volume of the audio signal. In operation S3400, the mobile terminal 100 transmits the event generation information to the electronic device 200.

In operation S3700, the electronic device 200 displays the event generation information based on the usage history information and the setting information. In operation S3750, the electronic device 200 receives the user input. In operation S3800, the electronic device 200 adjusts the volume of the audio signal according to the user input.

Figure 48:
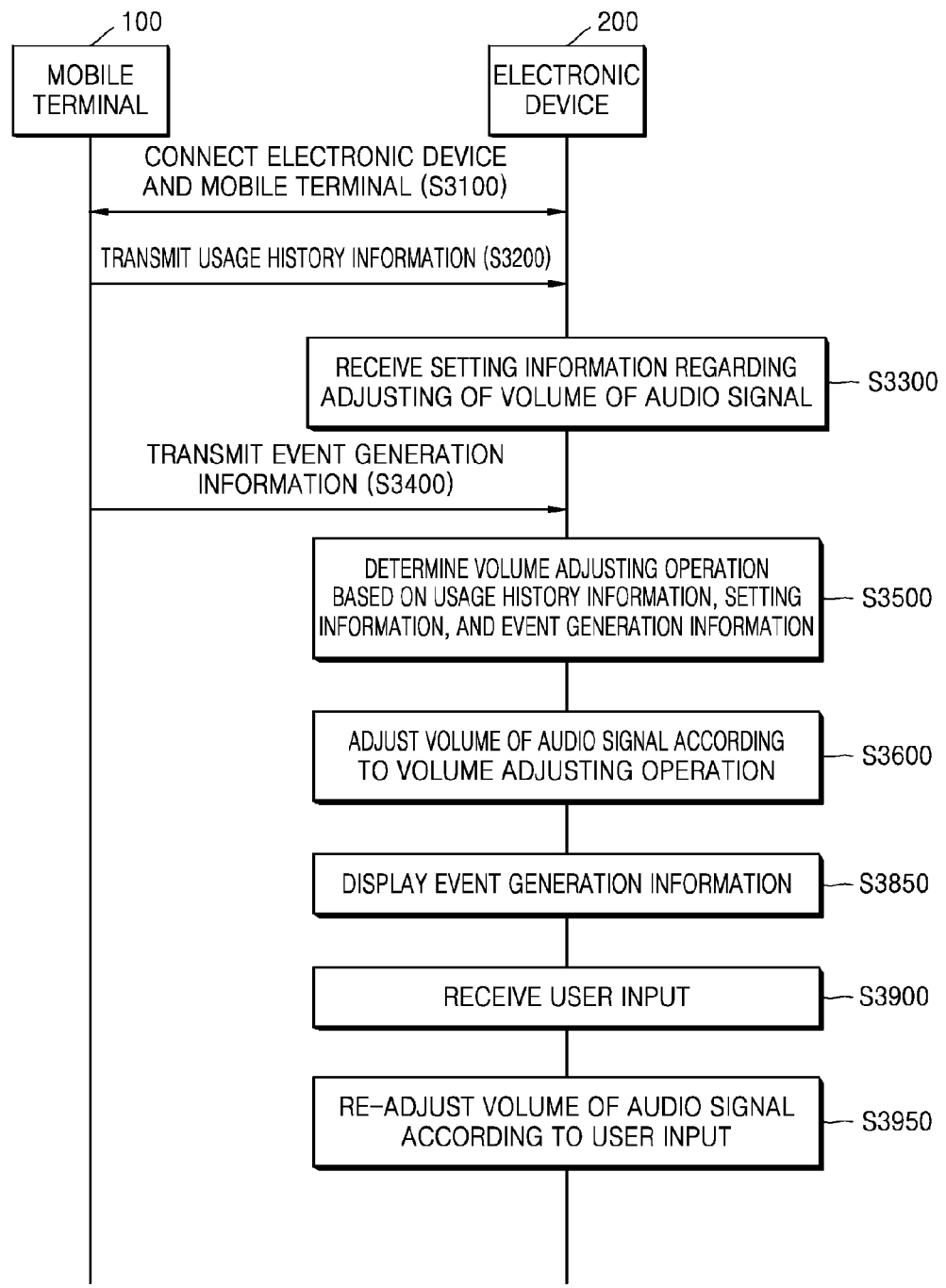
FIG. 48 is a flowchart illustrating an modified example of the operations of the system of FIG. 45.

FIG. 48 is a flowchart illustrating an modified example of the operations of the system of FIG. 45.

Referring to FIG. 48, the operations according to the exemplary embodiment further includes displaying of the event generation information and receiving of the user input compared to the operations of FIG. 45.

In operation S3100, the mobile terminal 100 and the electronic device 200 are connected to each other. That is, the mobile terminal 100 and the electronic device establish connection (e.g., communication connection) between each other. In operation S3200, the mobile terminal 100 transmits the usage history information to the electronic device 200. In operation S3300, the electronic device 200 receives the setting information regarding adjusting of the volume of the audio signal. In operation S3400, the mobile terminal 100 transmits the event generation information to the electronic device 200.

In operation S3500, the electronic device 200 determines the volume adjusting operation based on the usage history information, the setting information, and the event generation information. In operation S3600, the electronic device 200 adjusts the volume of the audio signal according to the volume adjusting operation.

In operation S3850, the electronic device 200 displays the event generation information. In operation S3900, the electronic device 200 receives the user input. In operation S3950, the electronic device 200 re-adjusts the volume of the audio signal according to the user input.

Figure 49:
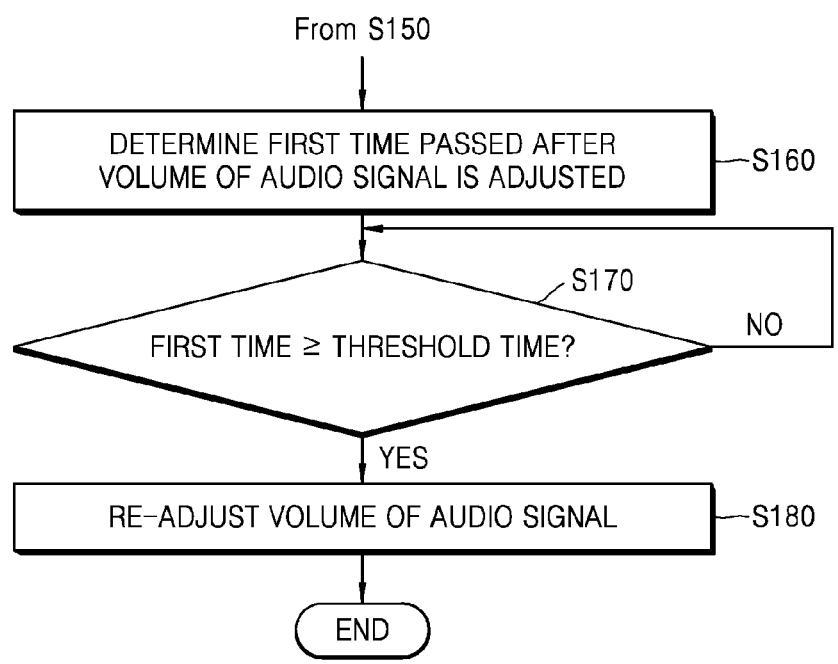
FIG. 49 is a flowchart illustrating an modified example of the method of FIG. 3.

FIG. 49 is a flowchart illustrating a modified example of the method of FIG. 3.

Referring to FIG. 49, in operation S160, a first time (i.e., a first time duration) passed after the volume of the audio signal is adjusted is determined. In operation S170, it is determined whether the first time (i.e., the first time duration) is equal to or greater than a threshold time. In operation S180, the volume of the audio signal is re-adjusted after determining that the first time duration is greater than or equal to the threshold time.

According to the exemplary embodiment, when the event generation information is received from the mobile terminal 100, the electronic device 200 may determine the volume adjusting operation based on at least one of the setting information and the usage history information, and adjust the volume of the audio signal according to the volume adjusting operation. However, when the user of the mobile terminal 100 that generated the event generation information is not around the electronic device 200 or the user intentionally ignores the event generation information, the volume of the audio signal needs to be restored to the original volume. Thus, when the first time passed after the volume of the audio signal is adjusted is equal to or higher than the threshold time, the electronic device 200 may restore the volume of the audio signal to the original volume by automatically re-adjusting the volume despite that there is no separate control operation from the user.

Figure 50:
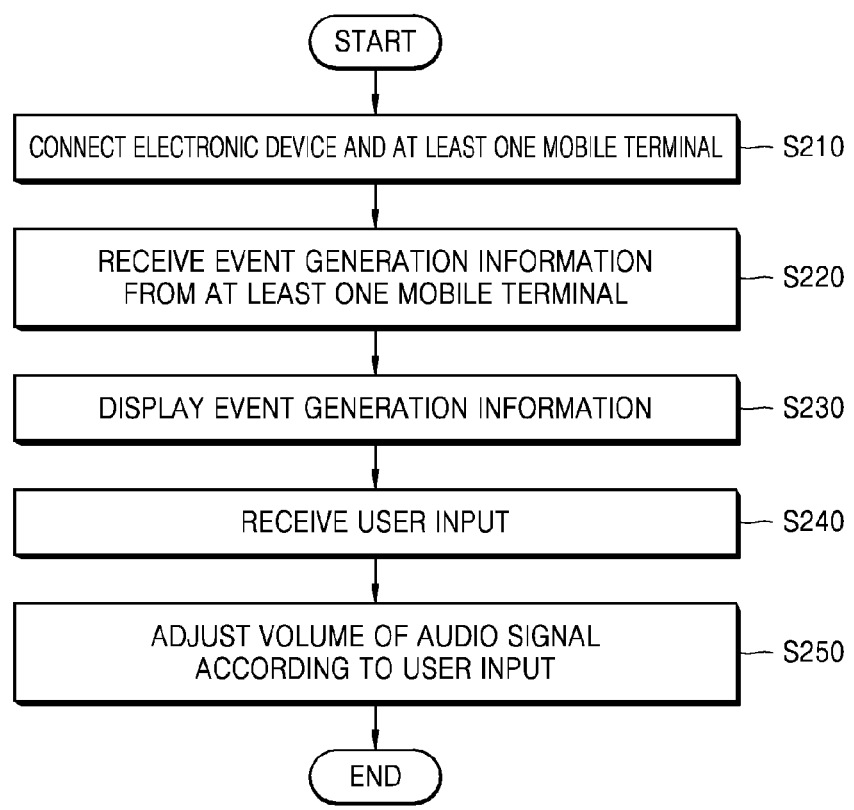
FIG. 50 is a flowchart of a method of adjusting volume, according to an exemplary embodiment.

FIG. 50 is a flowchart of a method of adjusting volume according to an exemplary embodiment.

Referring to FIG. 50, the method according to the exemplary embodiment is a method of adjusting volume of an audio signal output from an electronic device, and includes following operations performed by the electronic device. For example, the method according to the exemplary embodiment may include operations that are processed in time-series by the electronic device 200 of the system 10 of FIG. 1.

In operation S210, an electronic device 200 and at least one mobile terminal 100 are connected to each other. That is, the mobile terminal 100 and the electronic device establish connection (e.g., communication connection) between each other. In operation S220, the electronic device 200 receives event generation information from the at least one mobile terminal 100. In operation S230, the event generation information is displayed. In operation S240, a user input is received. In operation S250, volume of an audio signal is adjusted according to the user input.

Figure 51:
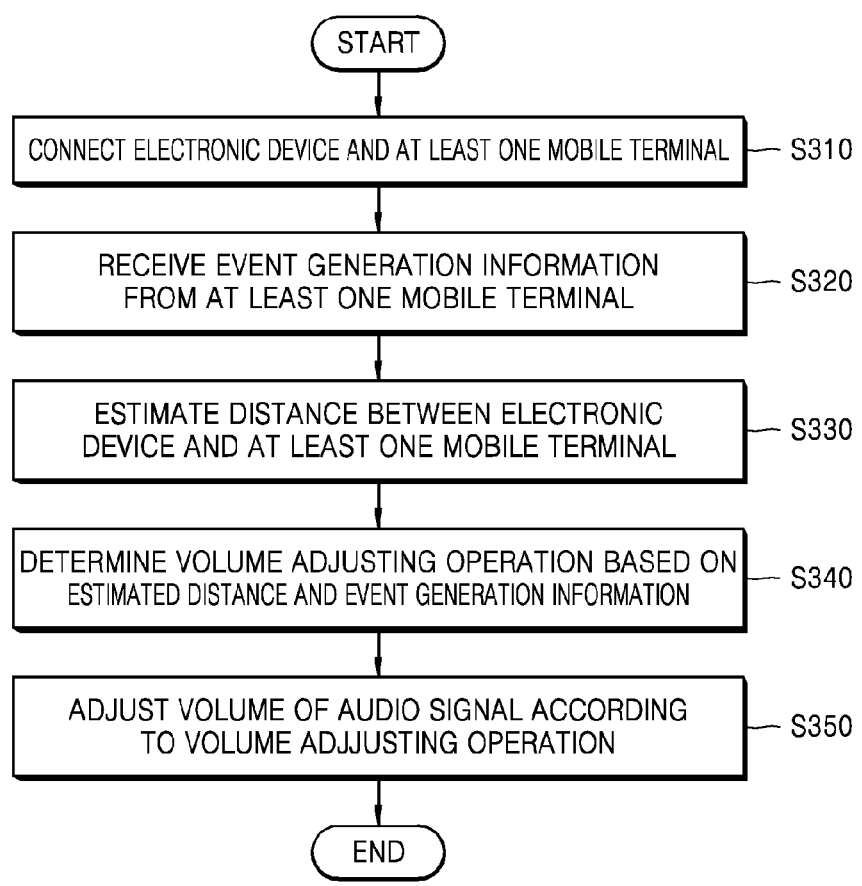
FIG. 51 is a flowchart of a method of adjusting volume, according to an exemplary embodiment.

FIG. 51 is a flowchart of a method of adjusting volume according to an exemplary embodiment.

Referring to FIG. 51, the method according to the exemplary embodiment is a method of adjusting volume of an audio signal output from an electronic device 200, and includes following operations performed by the electronic device 200. For example, the method according to the exemplary embodiment may include operations processed in time-series by the electronic device 200 of the system 10 of FIG. 1.

In operation S310, the electronic device 200 and the at least one mobile terminal 100 are connected to each other. That is, the at least one mobile terminal 100 and the electronic device establish connection (e.g., communication connection) between each other. In operation S320, the event generation information is received from the at least one mobile terminal 100. In operation S330, a distance between the electronic device 200 and the at least one mobile terminal 100 is estimated. In operation S340, the volume adjusting operation is determined based on the estimated distance and the event generation information. In operation S350, the volume of the audio signal is adjusted according to the volume adjusting operation.

For example, when the estimated distance is shorter than a threshold distance, the user easily hears the reception sound of the mobile terminal 100, and thus the electronic device 200 may determine to maintain the volume of the audio signal without adjusting the volume of the audio signal. Alternatively, for example, when the estimated distance is longer than the threshold distance, the user may be difficult to hear the reception sound from the mobile terminal 100, and thus, for example, the electronic device 200 may determine to mute the volume of the audio signal.

Figure 52:
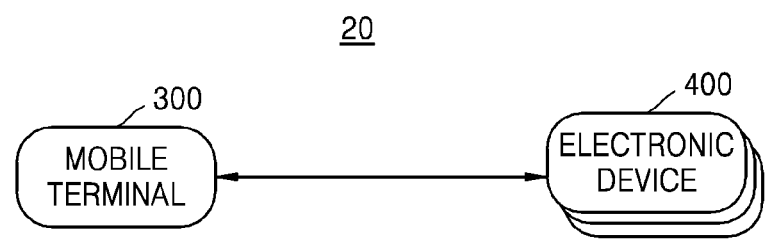
FIG. 52 is a diagram of a system for adjusting volume, according to an exemplary embodiment.

FIG. 52 is a diagram of a system 20 for adjusting volume according to an exemplary embodiment.

Referring to FIG. 52, the system 20 may include a mobile terminal 300 and at least one electronic device 400. Although not shown in FIG. 52, according to an exemplary embodiment, the system 20 may further include a server.

The mobile terminal 300 may be connected to the at least one electronic device 400 via a wireless communication. In the exemplary embodiment, the mobile terminal 300 may be connected to the at least one electronic device 400 via Bluetooth or Wi-Fi. However, the exemplary embodiment is not limited thereto, and according to an exemplary embodiment, the mobile terminal 400 may be connected to the at least one electronic device 400 via a wireless communication, such as home RF, HR WPAN, UWB, LR WPAN, or IEEE 1394.

The at least one electronic device 400 may output an audio signal. For example, the at least one electronic device 400 may reproduce various types of content including an audio signal, and may be referred to as a media reproducing apparatus. For example, the at least one electronic device 400 may reproduce video content (such as a TV program image or VOD), a personal image (such as UCC, a music video, or YouTube image), still image content (such as a photo or a drawing), music content (such as music, a musical program, or a radio broadcast), an application (such as a game or a video call), or text content (such as a map, an electronic book, a letter, a business file, or a webpage).

According to the exemplary embodiment, the mobile terminal 300 may determine a volume adjusting operation when an event, such as a phone call, is generated, and transmit information about the volume adjusting operation to the at least one electronic device 400. According to an exemplary embodiment, the mobile terminal 300 may determine the volume adjusting operation based on setting information regarding adjusting of the volume of the audio signal. According to an exemplary embodiment, the mobile terminal 300 may determine the volume adjusting operation based on usage history information of the mobile terminal 300.

Figure 53:
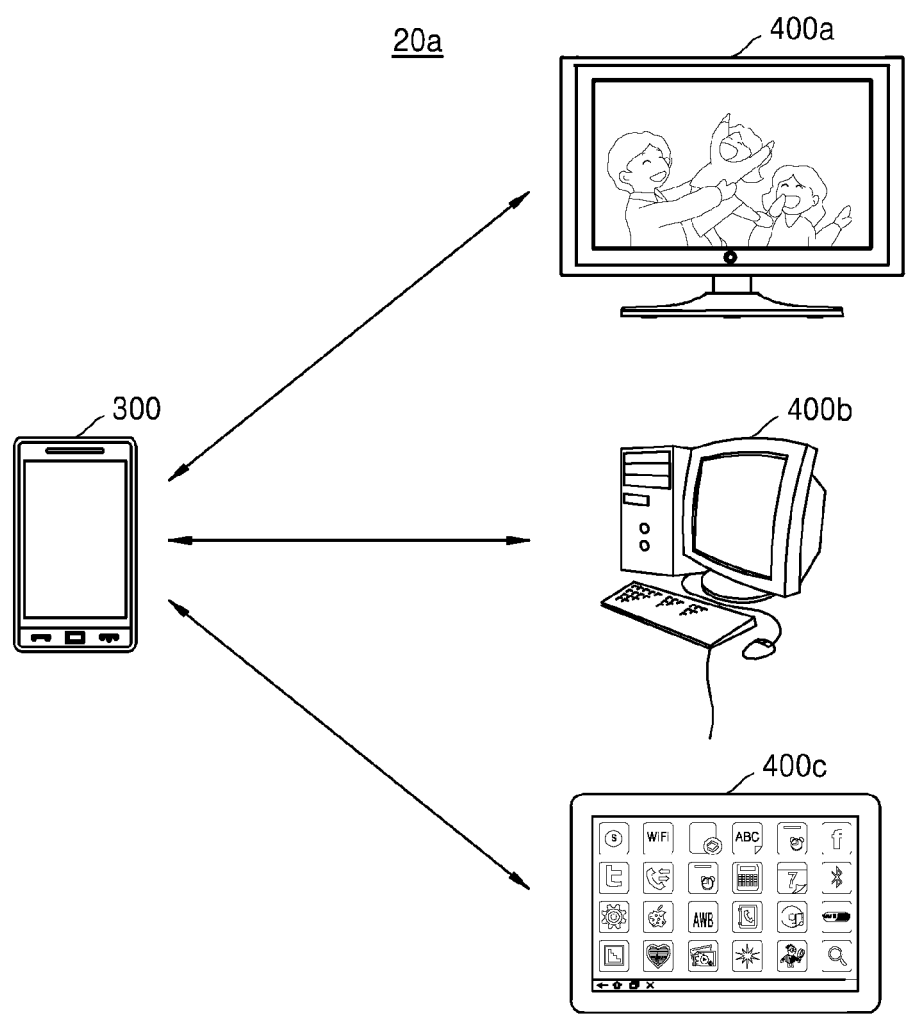
FIG. 53 is a diagram of a system for adjusting volume, as an example of the system of FIG. 52.

FIG. 53 is a diagram of a system 20*a* for adjusting volume as an example of the system 20 of FIG. 52.

Referring to FIG. 53, the system 20*a* may include the mobile terminal 300 and first, second and third electronic devices 400*a*, 400*b* and 400*c*.

The mobile terminal 300 may be a smart phone or a tablet PC. However, a type of the mobile terminal 300 is not limited thereto and according to an exemplary embodiment, the mobile terminal 300 may be an arbitrary terminal capable of providing event generation information (e.g., receiving a phone call).

The first electronic device 400*a* may be a smart TV, the second electronic device 400*b* may be a computer, and the third electronic device 400 may be a tablet PC. However, the exemplary embodiment is not limited thereto, and according to an exemplary embodiment, the electronic device 400 may be an IPTV, a DTV, a digital broadcasting terminal, an audio reproducing apparatus, or a navigation. However, the type of the electronic device 400 is not limited thereto, and according to an exemplary embodiment, the electronic device 400 may be an arbitrary device capable of outputting an audio signal. Also, a number of the electronic devices 400 is not limited to three (3), and according to an exemplary embodiment, the system 20*a* may include one or more electronic devices.

Figure 54:
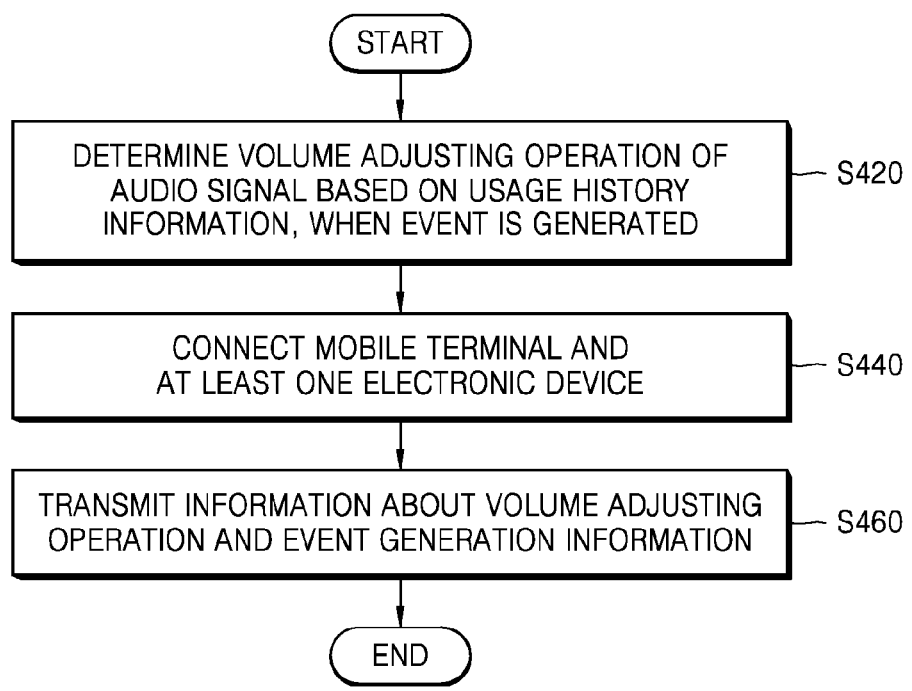
FIG. 54 is a flowchart of a method of adjusting volume, according to an exemplary embodiment.

FIG. 54 is a flowchart of a method of adjusting volume, according to an exemplary embodiment.

Referring to FIG. 54, the method according to the exemplary embodiment is a method of adjusting volume of an audio signal output from an electronic device 400, and includes following operations performed by a mobile terminal 300. For example, the method according to the exemplary embodiment may include operations that are processed in time-series by the mobile terminal 300 of the system 20 of FIG. 52. Hereinafter, unless stated otherwise, the electronic device 400 may be one of the first, second and third electronic devices 400*a*, 400*b* and 400*c*.

In operation S420, when an event is generated, a volume adjusting operation of an audio signal is determined based on usage history information of a mobile terminal. In the exemplary embodiment, the usage history information may include a call history list, a missed call list, a blocked call list, a contact list, or a favorites list.

In operation S440, the mobile terminal and at least one electronic device 400 is connected to each other. That is, the mobile terminal 300 and the at least one electronic device 400 establish connection (e.g., communication connection) between each other. For example, the mobile terminal 300 may be connected to the at least one electronic device 400 via a wireless communication, such as Bluetooth or Wi-Fi.

In operation S460, the mobile terminal transmits information about the volume adjusting operation and event generation information to the at least one electronic device. For example, the mobile terminal 300 may transmit the event generation information including a call reception notification, a message reception notification, or a notification from an application installed in the mobile terminal 300, to the at least one electronic device 400.

According to an exemplary embodiment, the mobile terminal 300 may further transmit at least one of ID information of the mobile terminal 300 and transmitter information to the at least one electronic device 400. In the exemplary embodiment, the ID information may include at least one of a phone number of the mobile terminal 300, an address assigned to the mobile terminal 300, a name of a user using the mobile terminal 300, and a nickname of the user.

Figure 55:
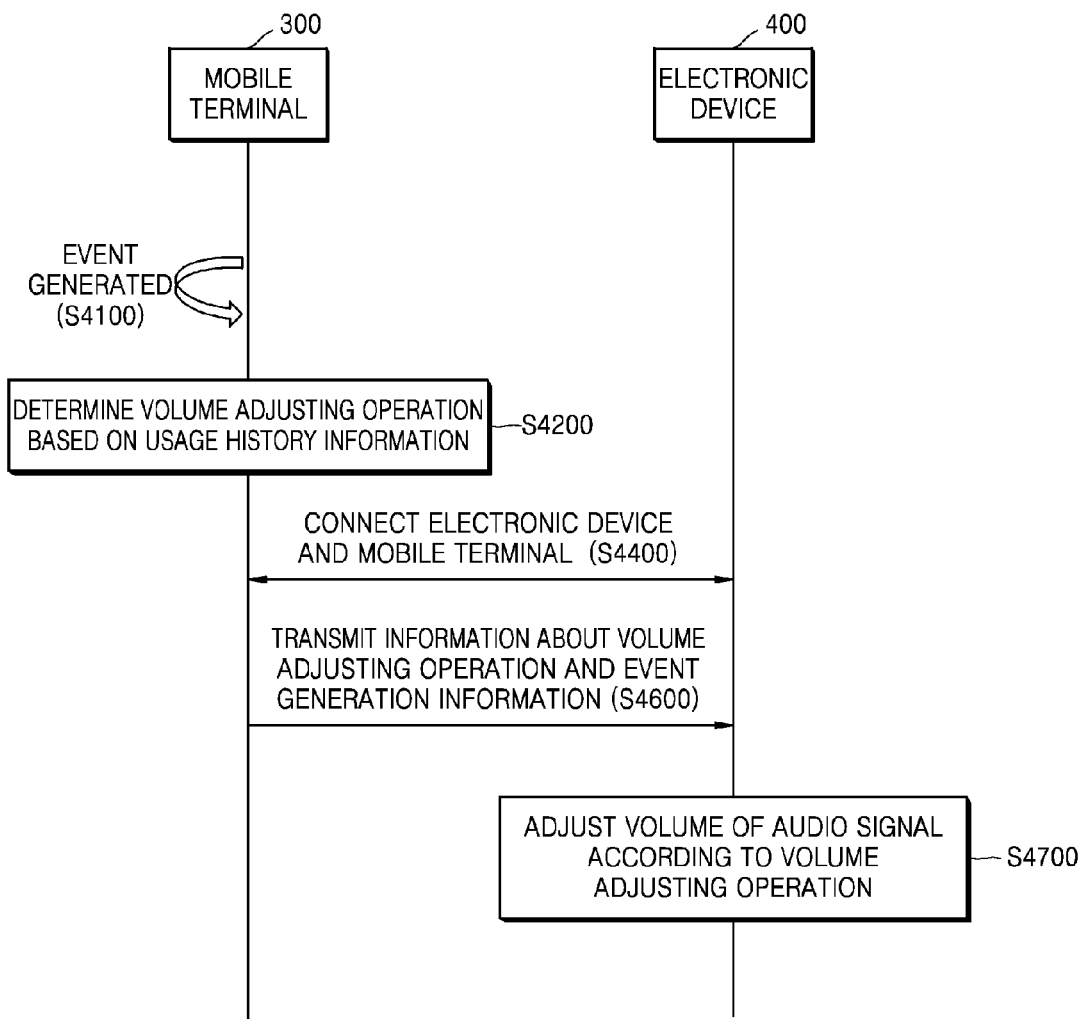
FIG. 55 is a flowchart illustrating an example of operations of a system for adjusting volume according to the method of FIG. 54.

FIG. 55 is a flowchart illustrating an example of operations of a system 20 for adjusting volume according to the method of FIG. 54.

Referring to FIG. 55, the operations according to the exemplary embodiment correspond to a method of adjusting volume of an audio signal based on the usage history information, and include operations that are processed in time-series by the mobile terminal 300 and the at least one electronic device 400 of the system 20 of FIG. 52. Thus, details described above with reference to the system 20 of FIG. 52 are applied to the method of the exemplary embodiment even if omitted.

In operation S4100, the event is generated in the mobile terminal 300. In operation S4200, the mobile terminal 300 determines the volume adjusting operation based on the usage history information. In operation S4400, the mobile terminal 300 and the electronic device 400 are connected to each other. That is, the mobile terminal 300 and the electronic device 400 establish connection (e.g., communication connection) between each other. In operation S4600, the mobile terminal 300 transmits information about the volume adjusting operation and the event generation information to the electronic device 400. In operation S4700, the electronic device 400 adjusts the volume of the audio signal according to the volume adjusting operation.

Figure 56:
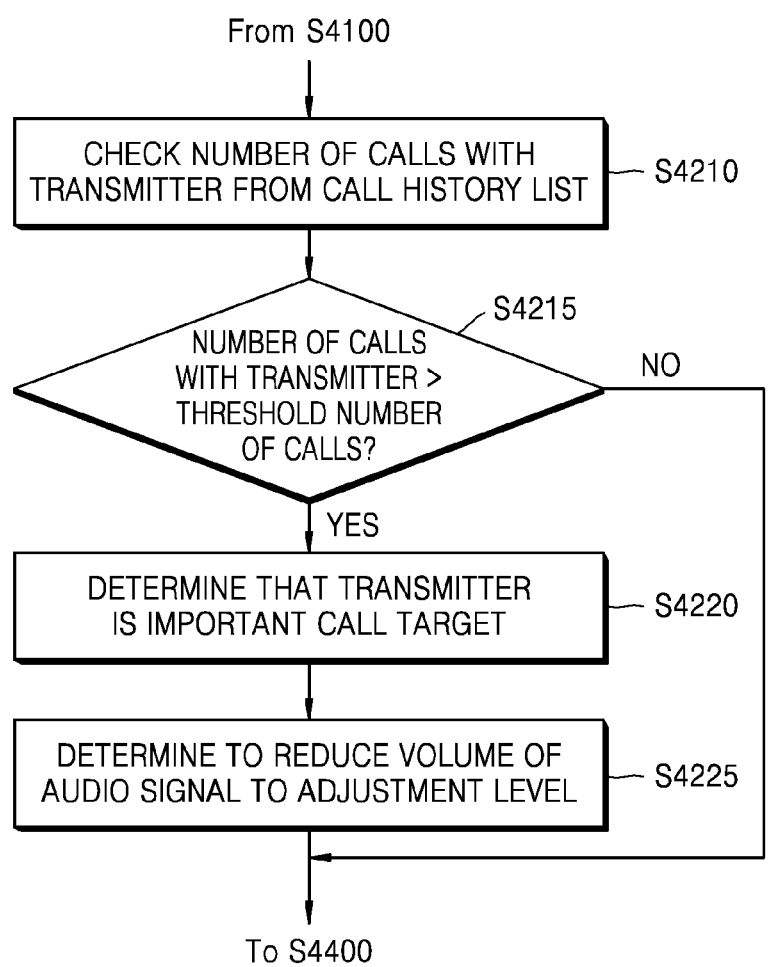
FIG. 56 is a flowchart illustrating in detail an example of determining of a volume adjusting operation of FIG. 55.

FIG. 56 is a flowchart illustrating in detail an example of the determining of the volume adjusting operation of FIG. 55.

Referring to FIG. 56, in operation S4210, the mobile terminal 300 checks or determines a number of calls with a transmitter from the call history list.

In operation S4215, the mobile terminal 300 determines whether the number of calls with the transmitter is equal to or higher than a threshold number of calls. When the number of calls with the transmitter is determined to be equal to or higher than the threshold number of calls, operation S4220 is performed. When the number of calls with the transmitter is determined to be lower than the threshold number of calls, the determining is ended and the mobile terminal 300 may determine whether to perform an automatic volume adjusting function based on different setting information.

In operation S4220, the mobile terminal 300 determines that the transmitter is an important call target based on the number of calls with the transmitter being determined to be equal to or higher than the threshold number of calls. In operation S4225, the mobile terminal 300 determines to reduce the volume of the audio signal to an adjustment level.

Figure 57:
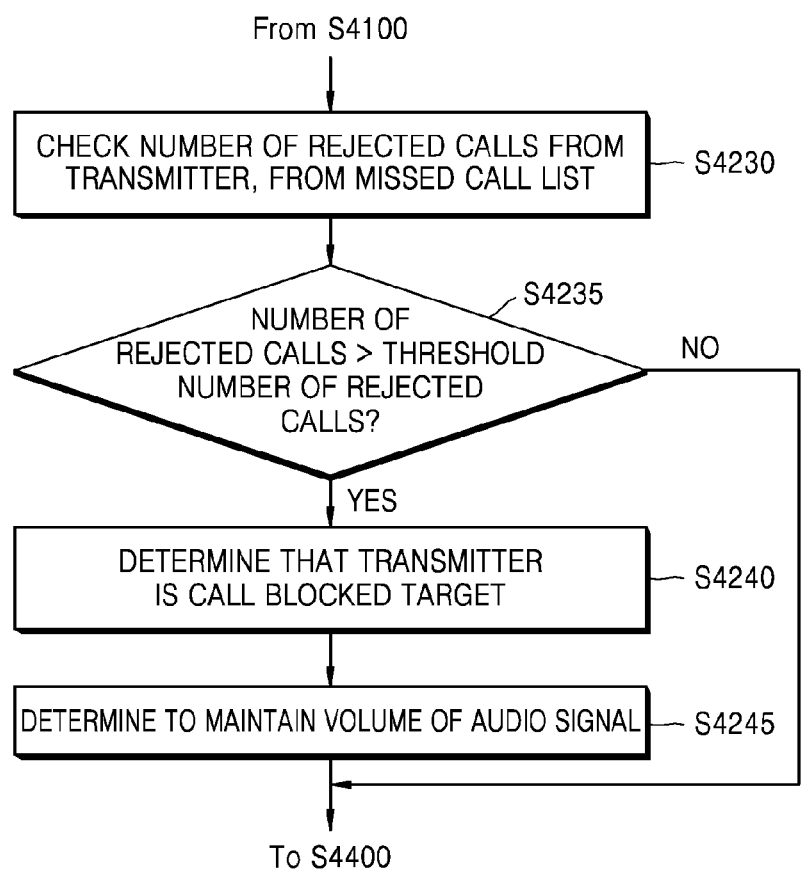
FIG. 57 is a flowchart illustrating in detail an example of the determining of the volume adjusting operation of FIG. 55.

FIG. 57 is a flowchart illustrating in detail an example of the determining of the volume adjusting operation of FIG. 55.

Referring to FIG. 57, in operation S4230, the mobile terminal 300 checks a number of rejected calls from a transmitter, from the missed call list.

In operation S4235, the mobile terminal 300 determines whether the number of rejected calls is equal to or higher than a threshold number of rejected calls. When the number of rejected calls is determined to be equal to or higher than the threshold number of rejected calls, operation S4240 is performed. When the number of rejected calls is determined to be lower than the threshold number of rejected calls, the determining is ended and the mobile terminal 300 may determine whether to perform an automatic volume adjusting function based on different setting information.

In operation S4240, the mobile terminal 300 determines that the transmitter is a call blocked target based on the determination of the number of rejected calls being determined to be equal to or higher than the threshold number of rejected calls. In operation S4245, the mobile terminal 300 determines to maintain the volume of the audio signal.

Figure 58:
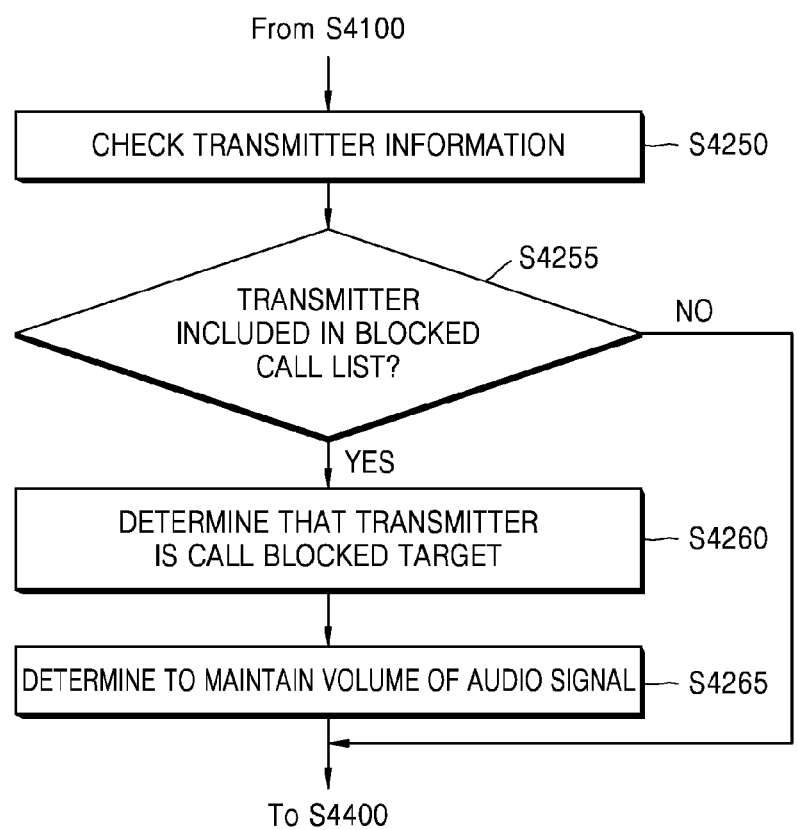
FIG. 58 is a flowchart illustrating in detail an example of the determining of the volume adjusting operation of FIG. 55.

FIG. 58 is a flowchart illustrating in detail an example of the determining of the volume adjusting operation of FIG. 55

Referring to FIG. 58, in operation S4250, the mobile terminal 300 checks the transmitter information. In operation S4255, the mobile terminal 300 determines whether the transmitter is included in the blocked call list. When the transmitter is determined to be included in the blocked call list, operation S4260 is performed. When the transmitter is determined to be not included in the blocked call list, the determining is ended and the mobile terminal 300 may determine whether to perform an automatic volume adjusting function based on different setting function. In operation S4260, the mobile terminal 300 determines that the transmitter is a call blocked target based on the determining that the transmitter is included in the blocked call list. In operation S4265, the mobile terminal 300 determines to maintain the volume of the audio signal.

Figure 59:
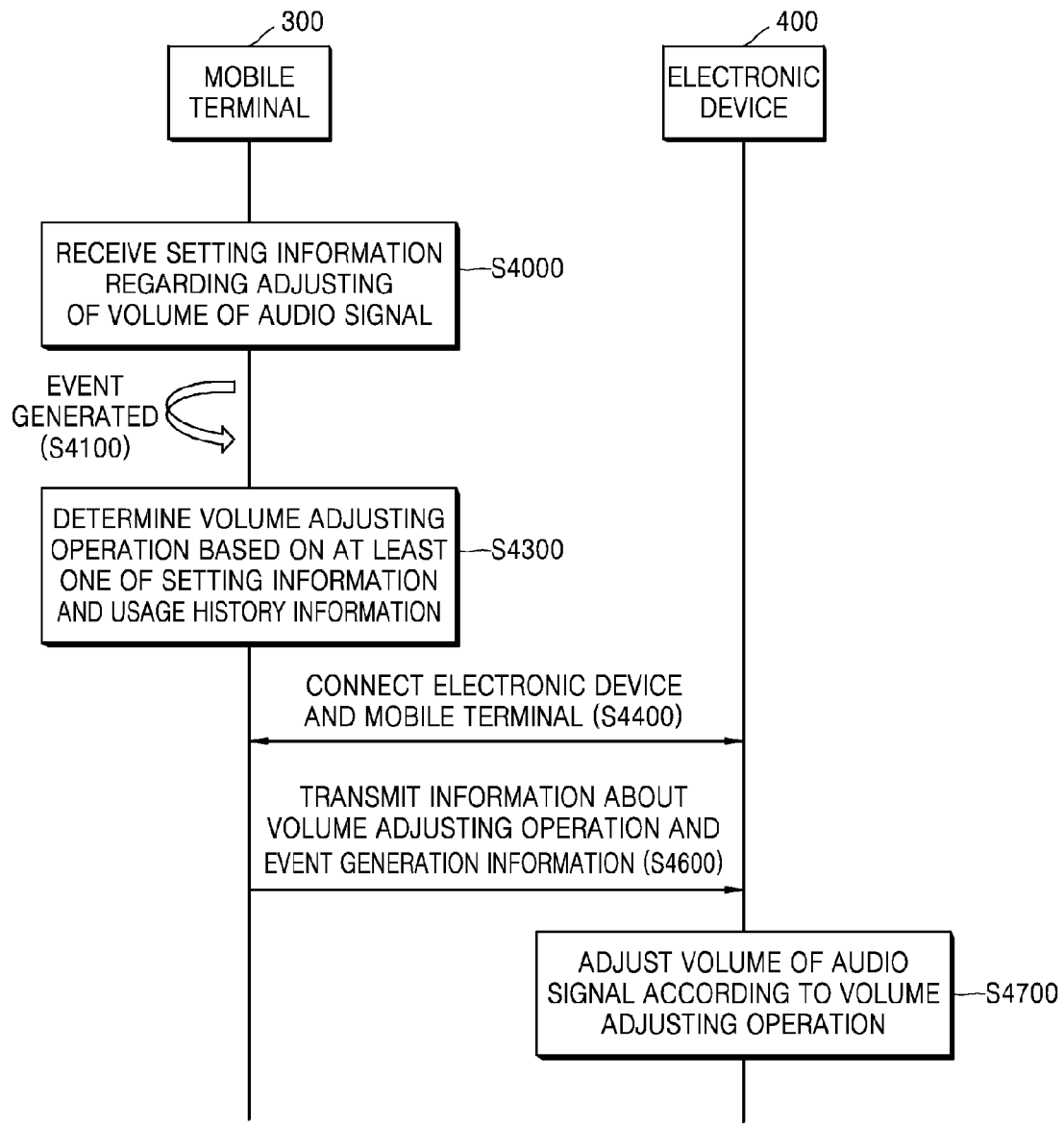
FIG. 59 is a flowchart illustrating an example of the operations of the system according to the method of FIG. 54.

FIG. 59 is a flowchart illustrating an example of the operations of the system according to the method of FIG. 54.

Referring to FIG. 59, the operations according to the exemplary embodiment correspond to a method of adjusting volume of an audio signal based on at least one of setting information and the usage history information, and include operations processed in time-series by the mobile terminal 300 and the electronic device 400 of the system 20 of FIG. 52. Thus, details described above with reference to the system 20 of FIG. 52 are applied to the method of the exemplary embodiment even if omitted.

In operation S4000, the mobile terminal 300 receives setting information regarding adjusting of the volume of the audio signal. In the exemplary embodiment, the setting information may include at least one of general volume adjusting information and individual volume adjusting information. In the exemplary embodiment, the setting information may be the setting information SI1 of FIG. 8, the setting information S12 of FIG. 10, the setting information S13 of FIG. 12, the setting information S14 of FIG. 14, the setting information S15 of FIG. 16, or the setting information S16 of FIG. 18.

In operation S4100, the event is generated in the mobile terminal 300. In operation S4300, the mobile terminal 300 determines the volume adjusting operation based on at least one of the setting information and the usage history information. In operation S4400, the mobile terminal 300 and the electronic device 400 are connected to each other. That is, the mobile terminal 300 and the electronic device 400 establish connection (e.g., communication connection) between each other. In operation S4600, the mobile terminal 300 transmits the information about the volume adjusting operation and the event generation information to the electronic device 400. In operation S4700, the electronic device 400 adjusts the volume of the audio signal according to the volume adjusting operation.

Figure 60:
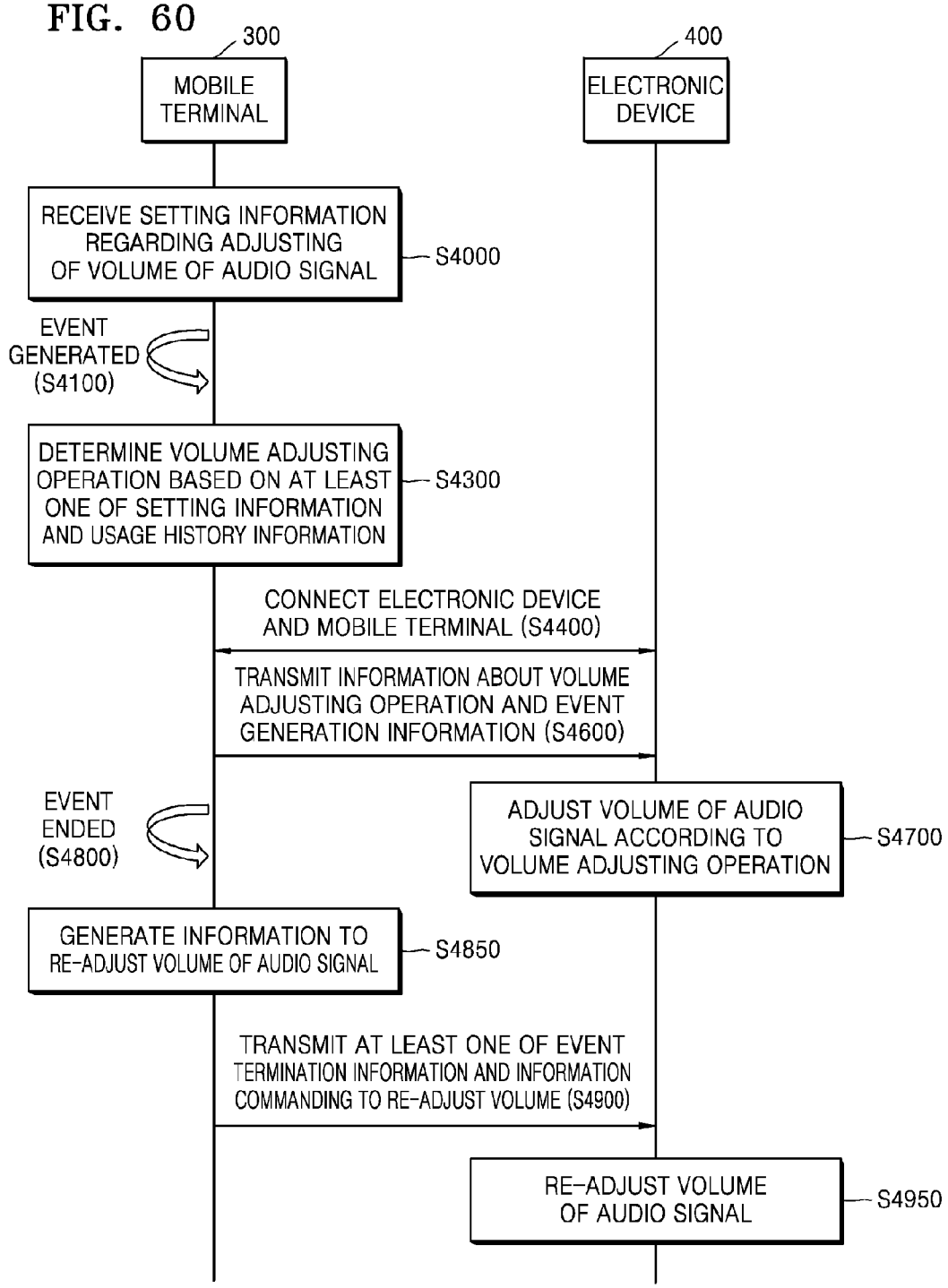
FIG. 60 is a flowchart illustrating a modified example of the operations of the system according to the method of FIG. 59.

FIG. 60 is a flowchart illustrating a modified example of the operations of the system 20 according to the method of FIG. 59.

Referring to FIG. 60, the operations of the exemplary embodiment further include operations S4800 through S4950 compared to the operations of FIG. 59.

In operation S4000, the mobile terminal 300 receives the setting information regarding adjusting of the volume of the audio signal. In operation S4100, the event is generated in the mobile terminal 300. In operation S4300, the mobile terminal 300 determines the volume adjusting operation based on at least one of the setting information and the usage history information. In operation S4400, the mobile terminal 300 and the electronic device 400 are connected to each other. In operation S4600, the mobile terminal 300 transmits the information about the volume adjusting operation and the event generation information to the electronic device 400. In operation S4700, the electronic device 400 adjusts the volume of the audio signal according to the volume adjusting operation.

In operation S4800, the event is ended in the mobile terminal 300. For example, a call reception sound may not ring anymore in the mobile terminal 300 because the user does not answer a call. Alternatively, for example, the user may end the call and the mobile terminal 300 may be in a standby state.

In operation S4850, the mobile terminal 300 generates information commanding to re-adjust the volume of the audio signal. For example, the mobile terminal 300 may generate information commanding to restore the volume of the audio signal to an original volume. Although not illustrated, the electronic device 400 may transmit the volume of the audio signal at a point of time when the event generation information to the mobile terminal 300 was received, as the original volume.

In operation S4900, the mobile terminal 300 transmits at least one of event termination information and the information commanding to re-adjust the volume to the electronic device 400. In operation S4950, the electronic device 400 re-adjusts the volume of the audio signal. Accordingly, the volume of the audio signal may be automatically restored without the user having to personally control the electronic device 400, and thus user convenience increases. For example, when there are a plurality of the electronic devices 400, the user does not have to perform individual control operations, and thus user convenience may further increase.

Figure 61:
FIG. 61 is a diagram of a system for adjusting volume, according to an exemplary embodiment.

FIG. 61 is a diagram of a system 30 for adjusting volume according to an exemplary embodiment.

Referring to FIG. 61, the system 30 may include a plurality of mobile terminals 500 and a plurality of electronic devices 600. Although not illustrated, according to an exemplary embodiment, the system 30 may further include a server.

Each of the plurality of mobile terminals 500 may be connected to the plurality of electronic devices 600 via a wireless communication. Each of the plurality of electronic devices 600 may output an audio signal. For example, each of the plurality of electronic devices 600 may reproduce various types of content including an audio signal, and may be referred to as a media reproducing apparatus.

According to the exemplary embodiment, each of the plurality of mobile terminals 500 may determine a volume adjusting operation of an audio signal when an event, such as a phone call, is generated, and transmit information about the volume adjusting operation to the plurality of electronic devices 600. According to an exemplary embodiment, each of the plurality of mobile terminals 500 may determine the volume adjusting operation based on setting information regarding adjusting of volume of the audio signal. According to an exemplary embodiment, each of the plurality of mobile terminals 500 may determine the volume adjusting operation based on usage history information.

Also, according to the exemplary embodiment, each of the plurality of electronic devices 600 may automatically adjust the volume of the audio signal when event generation information, such as a call reception notification, is received from at least one of the plurality of mobile terminals 500. According to an exemplary embodiment, each of the plurality of electronic devices 600 may automatically adjust the volume of the audio signal based on the setting information regarding adjusting of the volume of the audio signal. According to an exemplary embodiment, each of the plurality of electronic devices 600 may automatically adjust the volume of the audio signal based on the usage history information of at least one of the plurality of mobile terminals 500. According to an exemplary embodiment, each of the plurality of electronic devices 600 may display the event generation information, and automatically adjust the volume of the audio signal based on a user input according to the event generation information.

Figure 62:
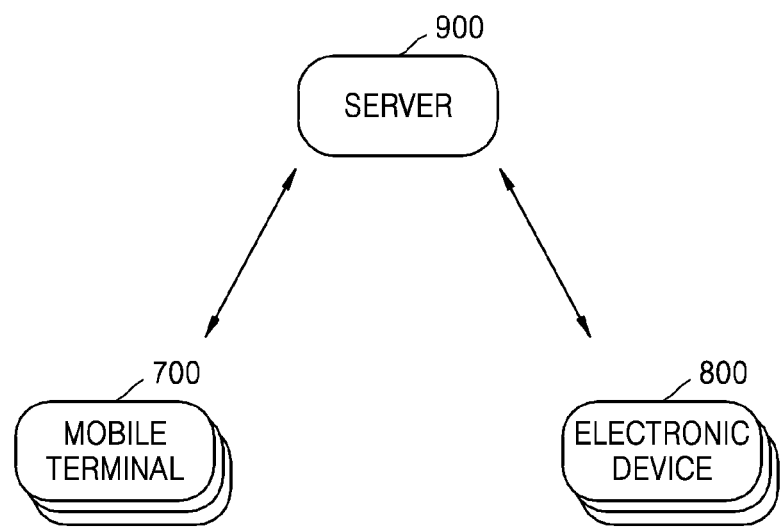
FIG. 62 is a diagram of a system for adjusting volume, according to an exemplary embodiment.

FIG. 62 is a diagram of a system 40 for adjusting volume according to an exemplary embodiment.

Referring to FIG. 62, the system 40 may include a plurality of mobile terminals 700, a plurality of electronic devices 800, and a server 900.

Each of the plurality of mobile terminals 700 may be connected to the server 900. Each of the plurality of electronic devices 800 may output an audio signal and may be connected to the server 900. For example, each of the plurality of electronic devices 600 may reproduce various types of content including an audio signal, and may be referred to as a medial reproducing apparatus.

The server 900 may determine a volume adjusting operation of an audio signal of each of the plurality of electronic devices 600 based on setting information regarding adjusting of volume of the audio signal and usage history information of at least one of the plurality of mobile terminals 700.

Figure 63:
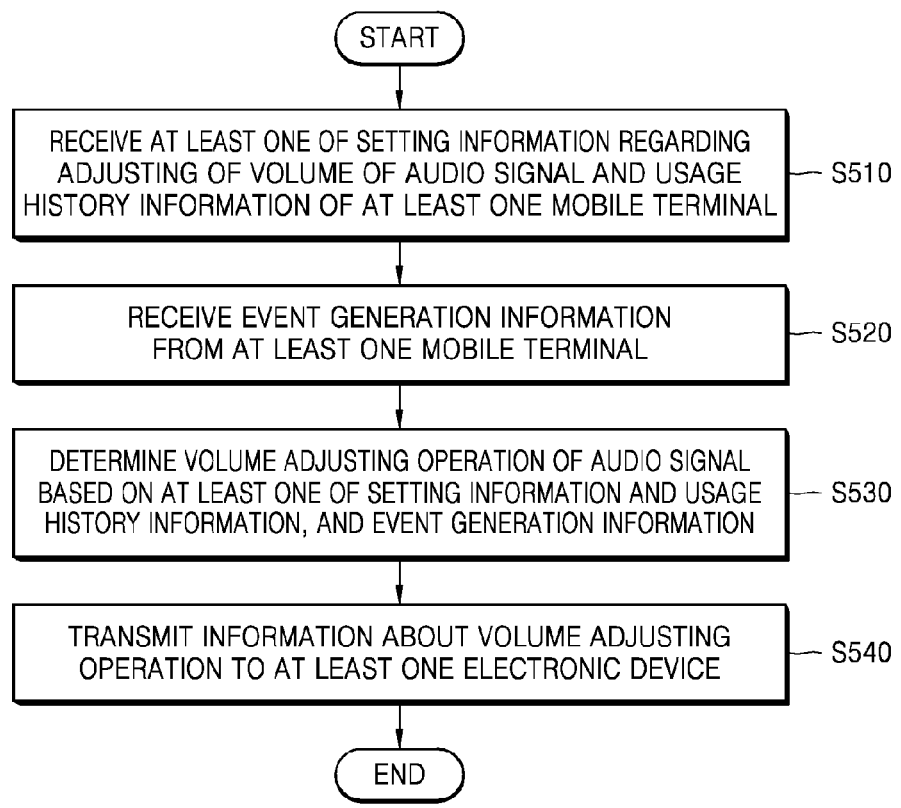
FIG. 63 is a flowchart of a method of adjusting volume, according to an exemplary embodiment.

FIG. 63 is a flowchart of a method of adjusting volume according to an exemplary embodiment.

Referring to FIG. 63, the method according to the exemplary embodiment is a method of adjusting volume of an audio signal output from an electronic device 800, and includes following operations performed by a server 900. For example, the method according to the exemplary embodiment may include operations that are processed in time-series by the server 900 of the system 40 of FIG. 62.

In operation S510, at least one of setting information regarding adjusting of volume of an audio signal and usage history information of at least one mobile terminal is received. In operation S520, event generation information is received from the at least one mobile terminal. In operation S530, a volume adjusting operation of the audio signal is determined based on at least one of the setting information and the usage history information, and the event generation information. In operation S540, information about the volume adjusting operation is transmitted to at least one electronic device.

Figure 64:
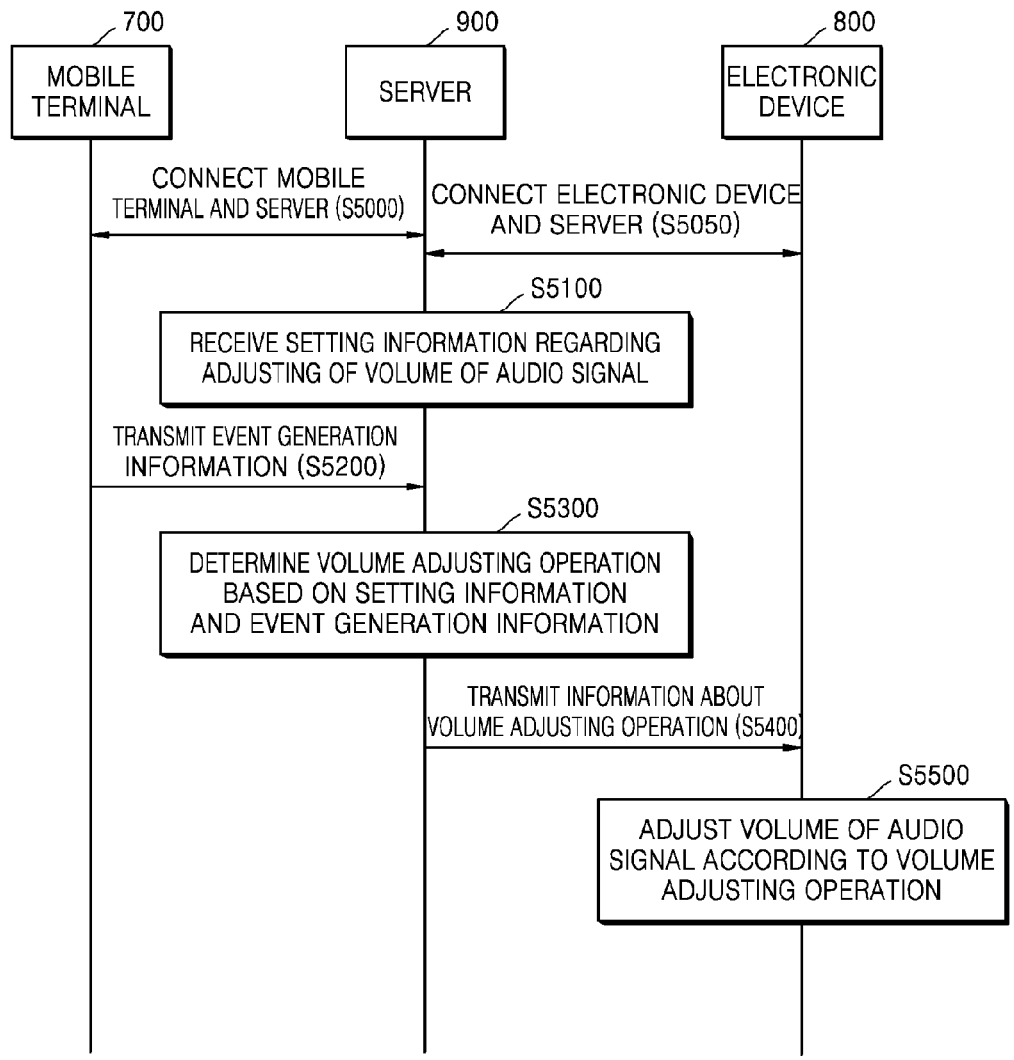
FIG. 64 is a flowchart illustrating an example of operations of a system for adjusting volume according to the method of FIG. 63.

FIG. 64 is a flowchart illustrating an example of operations of a system for adjusting volume according to the method of FIG. 63.

Referring to FIG. 64, the operations according to the exemplary embodiment correspond to a method of adjusting volume of an audio signal based on the setting information, and include operations that are processed in time-series by the mobile terminal 700, the electronic device 800, and the server 900 of the system 40 of FIG. 62. Accordingly, details described above with reference to the system 40 of FIG. 62 are applied to the method according to the exemplary embodiment even if omitted.

In operation S5000, the mobile terminal 700 and the server 900 are connected to each other. That is, the mobile terminal 700 and the server 900 establish connection (e.g., communication connection) between each other. In operation S5050, the electronic device 800 and the server 900 are connected to each other. That is, the electronic device 800 and the server 900 establish connection (e.g., communication connection) between each other.

In operation S5100, the server 900 receives the setting information regarding adjusting of the volume of the audio signal. For example, the setting information may be the setting information SI1 of FIG. 8, the setting information SI2 of FIG. 10, the setting information SI3 of FIG. 12, the setting information SI4 of FIG. 14, the setting information SI5 of FIG. 16, or the setting information SI6 of FIG. 18.

In operation S5200, the mobile terminal 700 transmits the event generation information to the server 900. For example, the mobile terminal 700 may transmit the event generation information including a call reception notification, a message reception notification, or a notification from an application installed in the mobile terminal 700 to the server 900.

In operation S5300, the server 900 determines the volume adjusting operation of the audio signal based on the setting information and the event generation information. In operation S5400, the server 900 transmits information about the volume adjusting operation to the electronic device 800. In operation S5500, the electronic device 800 adjusts the volume of the audio signal according to the volume adjusting operation.

Figure 65:
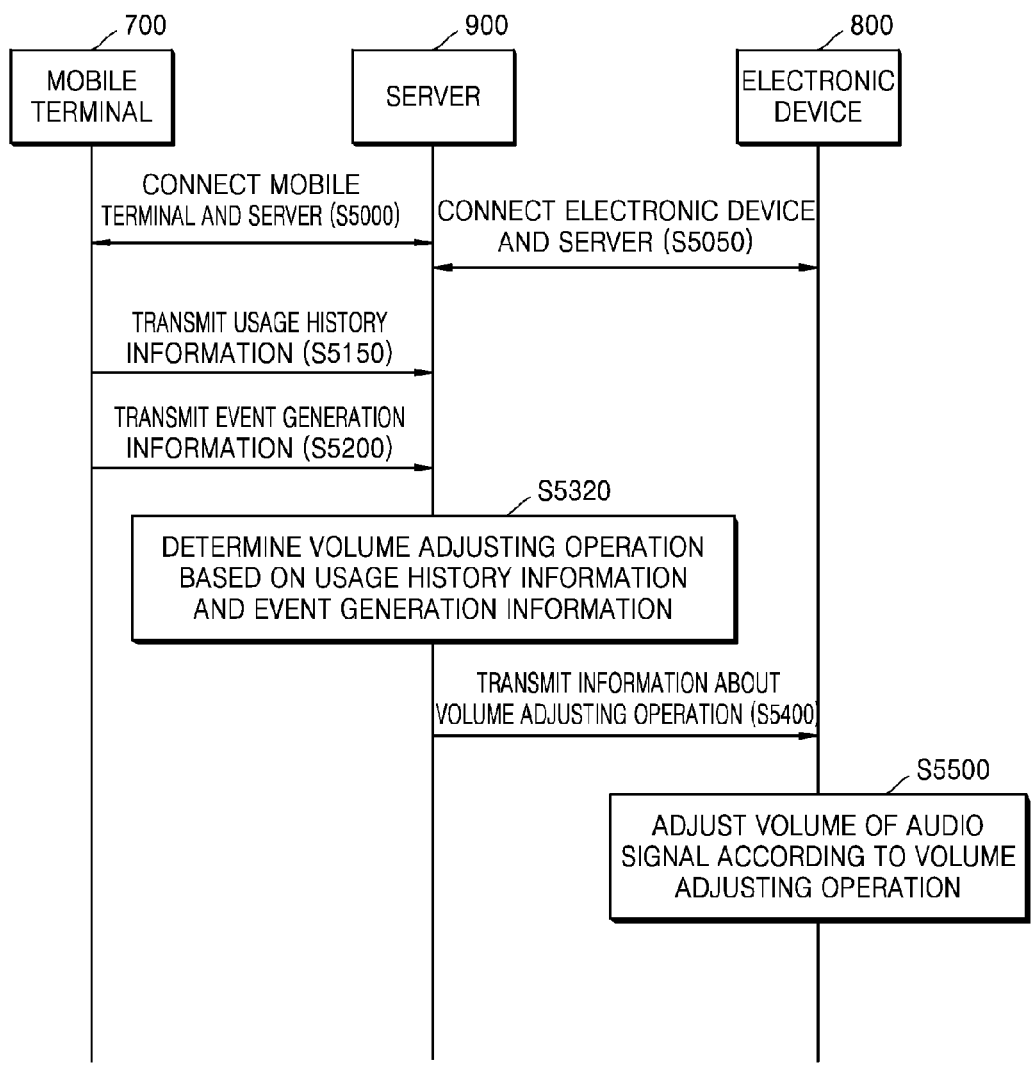
FIG. 65 is a flowchart illustrating an example of the operations of the system according to the method of FIG. 63.

FIG. 65 is a flowchart illustrating an example of the operations of the system according to the method of FIG. 63.

Referring to FIG. 65, the operations according to the exemplary embodiment correspond to a method of adjusting volume of an audio signal based on the usage history information, and include operations that are processed in time-series by the mobile terminal 700, the electronic device 800, and the server 900 of the system 40 of FIG. 62. Thus, details described above with reference to the system 40 of FIG. 62 are applied to the method according to the exemplary embodiment even if omitted.

In operation S5000, the mobile terminal 700 and the server 900 are connected to each other. That is, the mobile terminal 700 and the server 900 establish connection (e.g., communication connection) between each other. In operation S5050, the electronic device 800 and the server 900 are connected to each other. That is, the electronic device 800 and the server 900 establish connection (e.g., communication connection) between each other.

In operation S5150, the mobile terminal 700 transmits the usage history information to the server 900. For example, the usage history information may be the usage history information UI1 of FIG. 37, the usage history information UI2 of FIG. 39, or the usage history information UI3 of FIG. 41.

In operation S5200, the mobile terminal 700 transmits the event generation information to the server 900. For example, the mobile terminal 700 may transmit the event generation information including a call reception notification, a message reception notification, or a notification from an application installed in the mobile terminal 700 to the server 900.

In operation S5320, the server 900 determines the volume adjusting operation based on the setting information and the event generation information. In operation S5400, the server 900 transmits information about the volume adjusting operation to the electronic device 800. In operation S5500, the electronic device 800 adjusts the volume of the audio signal according to the volume adjusting operation.

Figure 66:
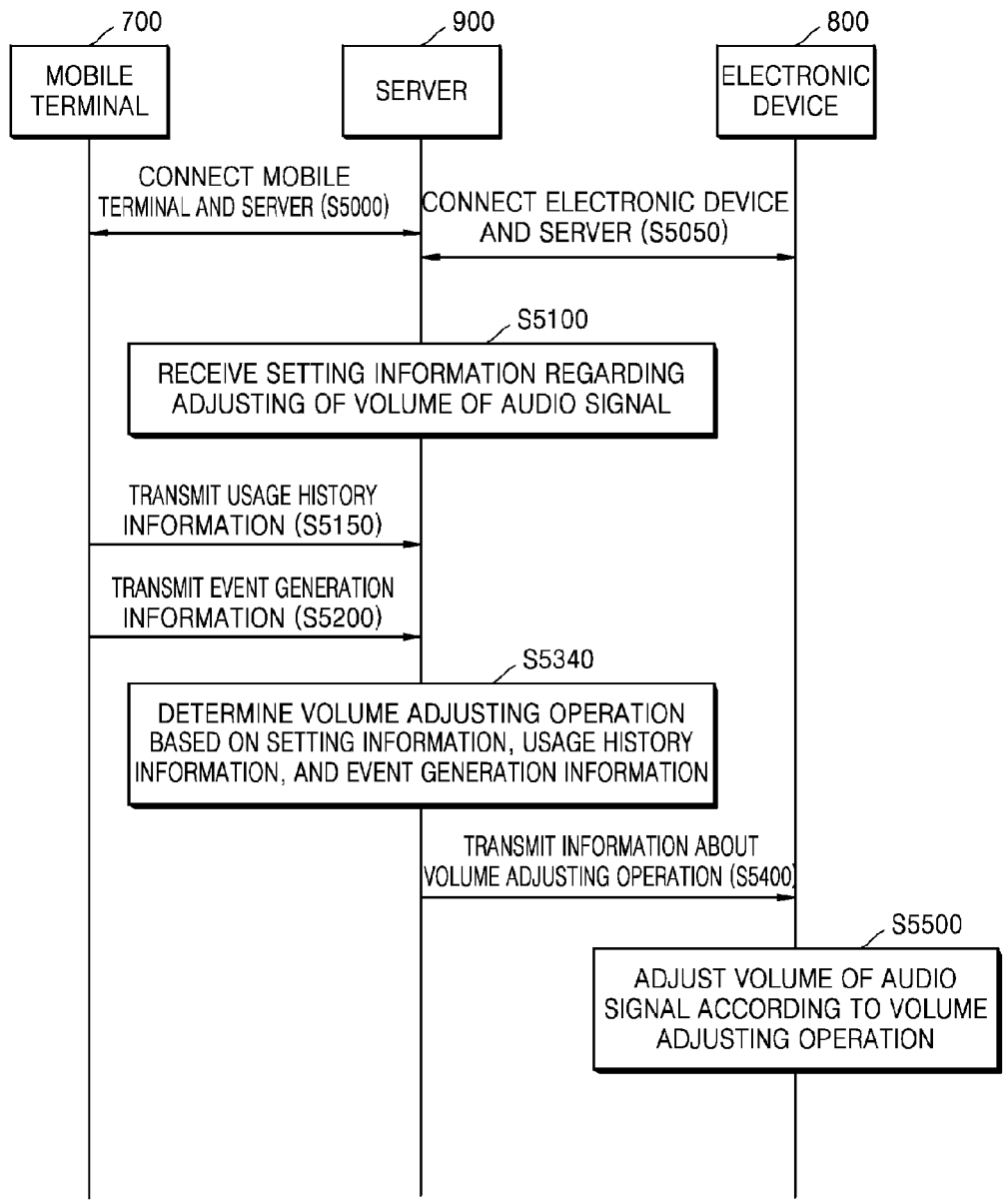
FIG. 66 is a flowchart illustrating an example of the operations of the system according to the method of FIG. 63.

FIG. 66 is a flowchart illustrating an example of the operations of the system 40 according to the method of FIG. 63.

Referring to FIG. 66, the operations according to the exemplary embodiment correspond to a method of adjusting volume of an audio signal based on the setting information and the usage history information, and include operations that are processed in time-series by the mobile terminal 700, the electronic device 800, and the server 900 of the system 40 of FIG. 62. Thus, details described above with reference to the system 40 of FIG. 62 are applied to the method according to the exemplary embodiment even if omitted.

In operation S5000, the mobile terminal 700 and the server 900 are connected to each other. That is, the mobile terminal 700 and the server 900 establish connection (e.g., communication connection) between each other. In operation S5050, the electronic device 800 and the server 900 are connected to each other. That is, the electronic device 800 and the server 900 establish connection (e.g., communication connection) between each other.

In operation S5100, the server 900 receives the setting information regarding adjusting of the volume of the audio signal. For example, the setting information may be the setting information SI1 of FIG. 8, the setting information SI2 of FIG. 10, the setting information SI3 of FIG. 12, the setting information SI4 of FIG. 14, the setting information SI5 of FIG. 16, or the setting information SI6 of FIG. 18.

In operation S5150, the mobile terminal 700 transmits the usage history information to the server 900. For example, the usage history information may be the usage history information UI1 of FIG. 37, the usage history information UI2 of FIG. 39, or the usage history information UI3 of FIG. 41.

In operation S5200, the mobile terminal 700 transmits the event generation information to the server 900. For example, the mobile terminal 700 may transmit the event generation information including a call reception notification, a message reception notification, or a notification from an application installed in the mobile terminal 700 to the server 900.

In operation S5340, the server 900 determines the volume adjusting operation based on the setting information, the usage history information, and the event generation information. In operation S5400, the server 900 transmits information about the volume adjusting operation to the electronic device 800. In operation S5500, the electronic device 800 adjusts the volume of the audio signal according to the volume adjusting operation.

Figure 67:
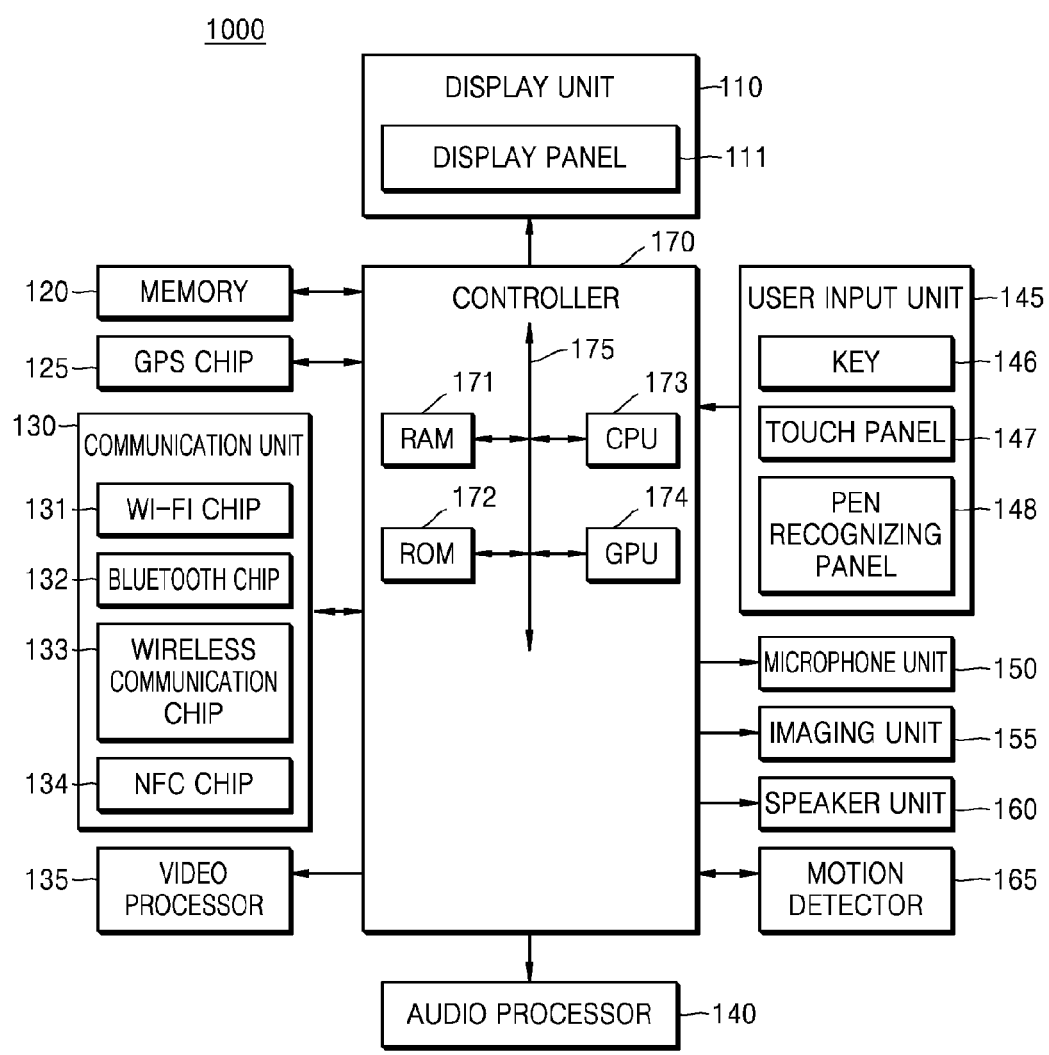
FIG. 67 is a block diagram of a mobile terminal according to an exemplary embodiment.

FIG. 67 is a block diagram of a mobile terminal 1000 according to an exemplary embodiment.

Referring to FIG. 67, a structure of the mobile terminal 1000 according to the exemplary embodiment may be applied to all of the mobile terminal 100 of FIG. 1, the mobile terminal 300 of FIG. 52, the mobile terminal 500 of FIG. 61, and the mobile terminal 700 of FIG. 62. The structure of the mobile terminal 1000 may be applied to various types of apparatuses, such as wearable devices, for example, a mobile phone, a tablet PC, a PDA, an MP3 player, a kiosk, an electronic picture frame, a navigation apparatus, a digital TV, a wrist watch, and a head-mounted display (HMD).

Referring to FIG. 67, the mobile terminal 1000 may include at least one of a display unit 110, a controller 170, a memory 120, a global positioning system (GPS) chip 125, a communication unit 130, a video processor 135, an audio processor 140, a user input unit 145, a microphone unit 150, an imaging unit 155, a speaker unit 160, and a motion detector 165.

The display unit 110 may include a display panel 111 and a controller (not shown) that controls the display panel 111. The display panel 111 may be realized as any type of display, such as a liquid crystal display (LCD), an organic light-emitting diode (OLED) display, an active-matrix OLED (AM-OLED) display, or a plasma display panel (PDP). The display panel 111 may be flexible, transparent, or wearable. The display unit 110 may be combined with a touch panel 147 of the user input unit 145 to be provided as a touch screen (not shown). For example, the touch screen may include an integrated module in which the display panel 111 and the touch panel 147 are combined in a stacked structure.

The memory 120 may include at least one of an internal memory (not shown) and an external memory (not shown).

The internal memory may include, for example, at least one of a volatile memory (such as a dynamic random access memory (DRAM), a static RAM (SRAM), or a synchronous DRAM (SDRAM)), a nonvolatile memory (such as a one-time programmable read-only memory (OTPROM), a programmable ROM (PROM), an erasable and programmable ROM (EPROM), an electrically erasable and programmable ROM (EEPROM), a mask ROM, or a flash ROM), a hard disk drive (HDD), and a solid state drive (SSD). According to an exemplary embodiment, the controller 170 may process a command or data received from the nonvolatile memory or at least one of other components by loading the command or data on the volatile memory. Also, the controller 170 may store data received or generated from or by the other components in the nonvolatile memory.

The external memory may include, for example, at least one of a compact flash (CF) card, a secure digital (SD) card, a micro-SD card, a mini-SD card, an extreme digital (xD) card, and a memory stick.

The memory 120 may store various programs and data used to operate the mobile terminal 1000. For example, the memory 120 may temporarily or semi-permanently store at least a part of a key generation program and an encryption program for content encryption, and a key restoration program and a decryption program for content decryption. Alternatively, for example, the memory 120 may temporarily or semi-permanently store at least a part of encrypted content and decrypted content.

According to the exemplary embodiment, when an event is generated, the controller 170 may determine a volume adjusting operation of an audio signal output from an electronic device based on usage history information of the mobile terminal 1000. According to an exemplary embodiment, when an event is generated, the controller 170 may determine the volume adjusting operation based on at least one of the usage history information and setting information.

For example, the controller 170 may control the display unit 110 such that a part of content stored in the memory 120 is displayed on the display unit 110. In other words, the controller 170 may display the part of the content stored in the memory 120 on the display unit 110. Alternatively, when a user gesture is received on one region of the display unit 110, the controller 170 may perform a control operation corresponding to the user gesture.

The controller 170 may include at leas tone of an RAM 171, an ROM 172, a central processing unit (CPU) 173, a graphical processing unit (GPU) 174, and a bus 175. The RAM 171, the ROM 172, the CPU 173, and the GPU 174 may be connected to each other via the bus 175.

The CPU 173 accesses the memory 120 and performs booting by using an operating system (OS) stored in the memory 120. Also, the CPU 173 performs various operations by using various programs, contents, and data stored in the memory 120.

The ROM 172 stores a command set for system booting. For example, when a turn-on command is input and power is supplied to the mobile terminal 1000, the CPU 173 may copy an OS stored in the memory 120 to the ROM 171 according to a command stored in the ROM 172, and boot a system by executing the OS. When the system is booted, the CPU 173 copies various programs stored in the memory 120 to the RAM 171, and executes the various programs copied to the RAM 171 to perform various operations. When the mobile terminal 1000 is booted, the GPU 174 displays a UI screen on a region of the display unit 110. For example, the GPU 174 may generate a screen displaying an electronic document including various objects, such as content, an icon, and a menu. The GPU 174 calculates attribute values, such as coordinate values, shapes, sizes, and colors, of the objects according to a layout of the screen. Then, the GPU 174 may generate the screen having various layouts including the objects based on the attribute values. The screen generated by the GPU 174 may be provided to the display unit 110 and displayed on a region of the display unit 110.

The GPU 125 may receive a GPS signal from a GPS satellite and calculate a current position of the mobile terminal 1000. The controller 170 may use the GPS chip 125 to calculate user's location when a navigation program is used or a current location of the user is required.

The communication unit 130 may communicate with any type of external device according to any type of communication method. According to the exemplary embodiment, the communication unit 130 may transmit information about the volume adjusting operation determined by the controller 170 and event generation information to at least one electronic device. Also, the communication unit 130 may further transmit at least one of ID information, usage history information, and event termination information of the mobile terminal 1000. For example, the communication unit 130 may include at least one of a Wi-Fi chip 131, a Bluetooth chip 132, a wireless communication chip 133, and a near-field communication (NFC) chip 134. The controller 170 may communicate with various external devices by using the communication unit 130.

The Wi-Fi chip 131 and the Bluetooth chip 132 may respectively perform communication by using a Wi-Fi method and a Bluetooth method. When the Wi-Fi chip 131 or the Bluetooth chip 132 is used, various types of connection information, such as subsystem identification (SSID) and a session key, are first transferred, and then information may be transferred through connection made by using the connection information. The wireless communication chip 133 is a chip that performs communication according to any one of various communication standards, such as IEEE, Zigbee, third generation (3G), third generation partnership project (3GPP), and long term evolution (LTE). The NFC chip 134 is a chip that operates in an NFC method using 13.56 MHz band from among various RFID frequency bands, such as 135 kHz, 13.56 MHz, 433 MHz, 860 to 960 MHz, and 2.45 GHz.

The video processor 135 may process video data included in content received through the communication unit 130 or in content stored in the memory 120. The video processor 135 may perform various image processes, such as decoding, scaling, noise filtering, frame rate converting, and resolution converting, on the video data.

The audio processor 140 may process audio data included in content received through the communication unit 130 or in content stored in the memory 120. The audio processor 140 may perform various processes, such ad decoding, amplifying, and noise filtering, on the audio data.

When a reproduction program is executed for multimedia content, the controller 170 may reproduce the multimedia content by driving the video processor 135 and the audio processor 140. The speaker unit 160 may output audio data generated by the audio processor 140.

The user input unit 145 may receive various commands from the user. According to the exemplary embodiment, the user input unit 145 may receive the setting information regarding adjusting of the volume of the audio signal. For example, the user input unit 145 may include at least one of a key 146, the touch panel 147, and a pen recognizing panel 148.

The key 146 may include various types of keys, such as mechanical buttons and wheels, which are formed on various regions, such as a front portion, a side portion, and a rear portion, of an outer body of the mobile terminal 1000.

The touch panel 147 may detect a touch input of the user and output a touch event value corresponding to the touch input. When the touch screen is configured as the touch panel 147 and the display panel 111 are combined with each other, the touch screen may include any type of touch sensor, such as an electrostatic type, a pressure type, and a piezoelectric type. In the electrostatic type, a dielectric material coated on a surface of the touch screen is used to detect micro-electricity induced by the user when a body of the user touches the screen, and a touched coordinate is calculated. In the pressure type, the touch screen includes two electrode plates, and when the user touches the touch screen, a touched coordinate is calculated by detecting a current flowing through the two electrode plates as the two electrode plates touch each other at a touched point. A touch event generated on the touch screen may be mainly generated by a finger of the user, but may alternatively generated by a conductive object that may apply capacitance change to the touch screen.

The pen recognizing panel 148 may detect a proximity input or a touch input of a touch pen, such as a stylus pen or a digitizer pen, and output a pen proximity event or a pen touch event. The pen recognizing panel 148 may use, for example, an electromagnetic resonance (EMR) method, and may detect a touch input or a proximity input according to a change of intensity of an electromagnetic field, which is caused as the pen approaches or touches the user input unit 145. For example, the pen recognizing panel 148 may include an electron inducing coil sensor (not shown) having a grid structure, and an electron signal processor (not shown) providing an alternating signal having a certain frequency sequentially to each loop coil of the electron inducing coil sensor. When a pen including a resonance circuit is located near the loop coil of the pen recognizing panel 148, a magnetic field transmitted from the loop coil generates a current based on mutual electron induction in the resonance circuit. An induction magnetic field is generated from a coil forming the resonance circuit based on the current, and the pen recognizing panel 148 detects a proximity or touch location of the pen by detecting the induction magnetic field from the loop coil in a signal receiving state. The pen recognizing panel 148 may have a certain area below the display panel 111, for example, an area capable of covering a display region of the display panel 111.

The microphone unit 150 may receive user's voice or other sound and convert the user's voice or other sound to audio data. The controller 170 may use the user's voice for a phone call operation, or convert the user's voice to audio data and store the audio data in the memory 120.

The imaging unit 155 may capture a still image or a moving image according to control of the user. A plurality of the imaging unit 155 may be used, such as a front camera and a rear camera.

When the imaging unit 155 and the microphone unit 150 are provided, the controller 170 may perform a control operation according to user's voice input through the microphone unit 150 or user's motion recognized by the imaging unit 155. For example, the mobile terminal 1000 may operate in a motion control mode or a voice control mode. In the motion control mode, the controller 170 activates the imaging unit 155 to capture the user, and performs a control operation corresponding to a motion change of the user. In the voice control mode, the controller 170 may analyze the user's voice input through the microphone unit 150, and perform a control operation according to the analyzed user's voice.

The motion detector 165 may detect movement of the body of the mobile terminal 1000. The mobile terminal 1000 may be rotated or tilted in any direction. At this time, the motion detector 165 may use at least one of various sensors, such as a geomagnetic sensor, a gyro sensor, and an acceleration sensor, to detect characteristics of the movement, such as a rotation direction, an angle, and a tilted angle.

Although not shown in FIG. 67, according to an exemplary embodiment, the mobile terminal 1000 may further include a universal serial bus (USB) port to which a USB connector is connected, various external input ports to which various external terminals, such as a headset, a mouse, an LAN are connected, a digital multimedia broadcasting (DMB) chip that receives and processes a DMB signal, and various sensors.

Names of the components of the mobile terminal 1000 described above may be changed. Also, the mobile terminal 1000 according to an exemplary embodiment may include at least one of the components, may not include some of the components, or may include components other than the above components.

Figure 68:
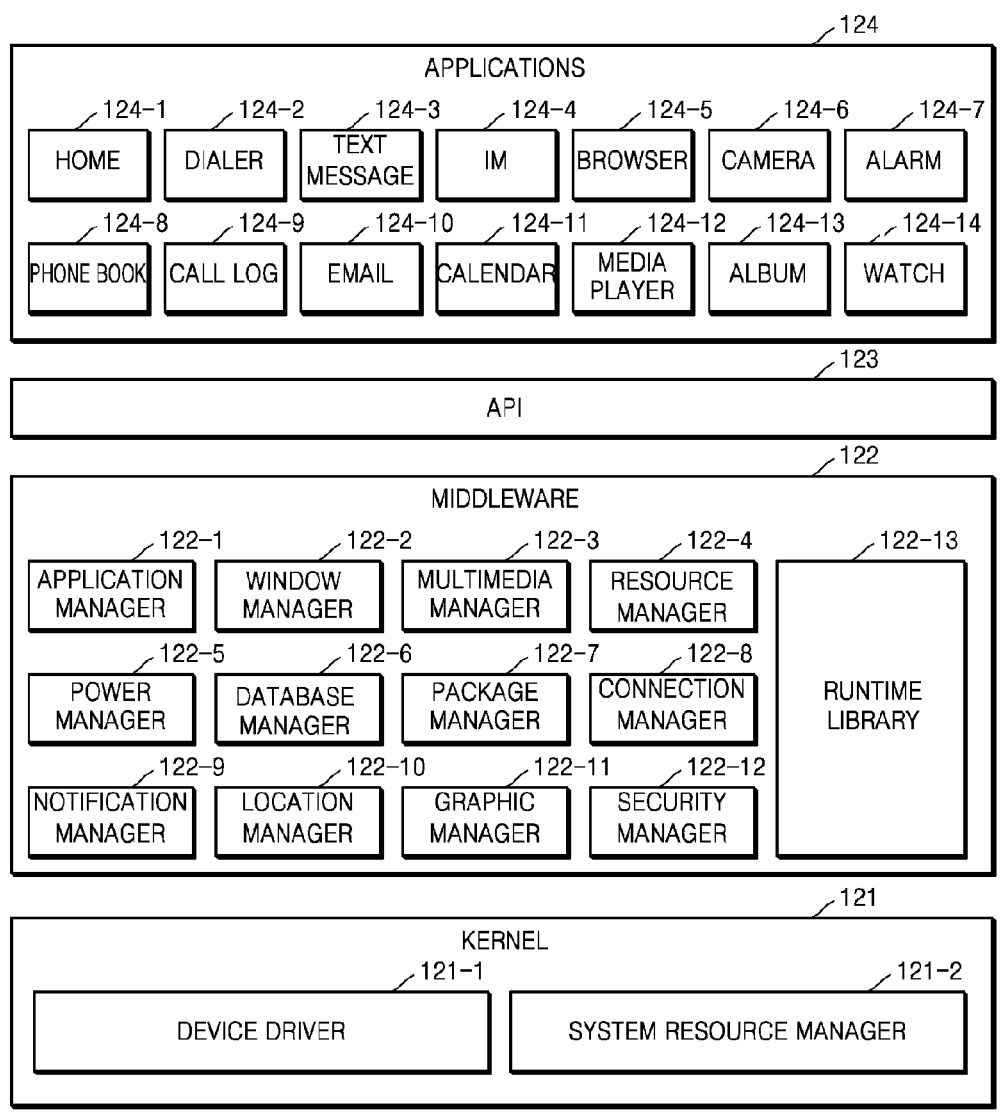
FIG. 68 is a block diagram of a software structure of a mobile terminal, according to an exemplary embodiment.

FIG. 68 is a block diagram of a software structure of the mobile terminal 1000, according to an exemplary embodiment.

Referring to FIG. 68, the memory 120 of FIG. 67 may store an OS that controls resources of the mobile terminal 1000 and application programs for operating applications. The OS may include kernel 121, middleware 122, and application program interface (API) 123. Examples of the OS include Android, iOS, Windows, Symbian, Tizen, and Bada.

The kernel 121 may include at least one of a device driver 121-1 or a system resource manager 121-2, which manage resources. The device driver 121-1 may access and control hardware components of the mobile terminal 1000 in a software way. Accordingly, the device driver 121-1 may be classified into an interface and an individual driver module provided by each hardware company. Examples of the device driver 121-1 include a display driver, a camera driver, a Bluetooth driver, a shared memory driver, a USB driver, a keypad driver, a W-Fi driver, an audio driver, and an inter-process communication (IPC) driver. The system resource manager 121-2 may include at least one of a process manager, a memory manager, and a file system manager. The system resource manager 121-2 may perform functions, such as controlling, assigning, or recovering system resources.

The middleware 122 may include a plurality of modules that are pre-realized to provide functions commonly required by various applications. Functions of the middleware 122 may be provided through the API 123 such that applications 124 efficiently use resources in the mobile terminal 1000. The middleware 122 may include at least one of a plurality of modules, such as an application manager 122-1, a window manager 122-2, a multimedia manager 122-3, a resource manager 122-4, a power manager 122-5, a database manager 122-6, a package manager 122-7, a connection manager 122-8, a notification manager 122-9, a location manager 122-10, a graphic manager 122-11, and a security manager 122-12.

The application manager 122-1 may manage a life cycle of at least one of the applications 124. The window manager 122-2 may manage GUI resources used on a screen. The multimedia manager 122-3 may determine formats required to reproduce various media files, and encode or decode the various media files by using codec matching the formats. The resource manager 122-4 may manage a resource, such as a source code, a memory, or a storage space, of at least one of the applications 124. The power manager 122-5 may operate together with BIOS to manage a battery or power supply, and provide power supply information required for operating the mobile terminal 1000. The database manager 122-6 may manage a database to be used for at least one of the applications 124, for example, generate, search, or change the database. The package manager 122-7 may manage installing or updating of an application that is distributed in a form of a package file. The connection manager 122-8 may manage a wireless connection, such as Wi-Fi or Bluetooth. The notification manager 122-9 may display or notify an event, such as a message arrival, a plan, or a proximity notification, such that a user is not interfered. The location manager 122-10 may manage location information of the mobile terminal 1000. The graphic manager 122-11 may manage a graphic effect to be provided to the user and a UI related to the graphic effect. The security manager 122-12 may provide various security functions required for system security or user authentication. When the mobile terminal 1000 includes a phone function, the middleware 122 may further include a call manager (not shown) for managing user's voice or a video call function.

The middleware 122 may further include a runtime library 122-13 or other library modules (not shown). The runtime library 122-13 is a library module used by a compiler to add a new function through a programming language while an application is executed. For example, the runtime library 122-13 may perform functions regarding input and output, memory management, or arithmetic functions. The middleware 122 may generate and use a new middleware module by combining various functions of internal component modules described above. The middleware 122 may provide a specialized module according to types of an OS to provide a differentiated function. The middleware 122 may dynamically delete some of the components or add new components. According to one or more exemplary embodiments, some of the components may be omitted, other components may be added, or the component may be replaced by another component having a different name but performing a similar function.

The API 123 is a group of API programming functions, and may have different structures according to OS. For example, in Android or iOS, one API set may be provided according to platforms, and in Tizen, at least two API sets may be provided.

The applications 124 may include a preloaded application installed as a default or a third party application installable by the user. The applications 124 may include, for example, at least one of a home application 124-1 for returning to a home screen, a dialer application 124-2 for talking to another person on the phone, a text message application 124-3 for receiving a message from another person identified by a phone number, an instant message (IM) application 124-4, a browser application 124-5, a camera application 124-6, an alarm application 124-7, a phone book application 124-8 for managing phone numbers or addresses of other people, a call log application 124-9 for managing a call log of the user, a reception/transmission log of a text message, or a missed call log, an email application 124-10 for receiving a message identified as an email from another person, a calendar application 124-11, a media player application 124-12, an album application 124-13, and a watch application 124-14. Names of the components described above may vary according to types of an OS. Also, the software structure may include at least one of the components, may not include some of the components, or may further include an additional component.

Figure 69:
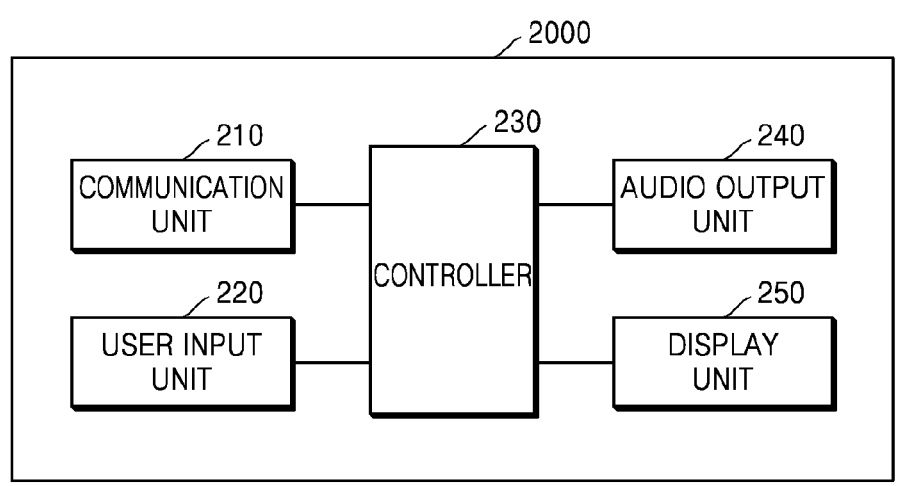
FIG. 69 is a block diagram of an electronic device according to an exemplary embodiment.

FIG. 69 is a block diagram of an electronic device 2000 according to an exemplary embodiment.

Referring to FIG. 69, a structure of the electronic device 2000 according to the exemplary embodiment may be applied to all of the electronic device 200 of FIG. 1, the electronic device 400 of FIG. 52, the electronic device 600 of FIG. 61, and the electronic device 800 of FIG. 62. According to an exemplary embodiment, the electronic device 2000 may include a communication unit 210, a user input unit 220, a controller 230, and an audio output unit 240. According to an exemplary embodiment, the electronic device 2000 may further include a display unit 250.

The communication unit 210 may communicate with at least one mobile terminal to receive event generation information from the at least one mobile terminal. Also, the communication unit 210 may further receive usage history information from the at least one mobile terminal. Also, the communication unit 210 may receive ID information from the at least one mobile terminal and store the ID information to register the at least one mobile terminal in a connection terminal list.

According to an exemplary embodiment, the user input unit 220 may receive setting information regarding adjusting of volume of an audio signal. According to an exemplary embodiment, the user input unit 220 may further receive a user input of commanding whether to perform a volume adjusting operation according to the event generation information.

According to an exemplary embodiment, when the event generation information is received, the controller 230 may determine the volume adjusting operation based on the setting information. For example, when the event generation information is received, the controller 230 may store the volume of the audio signal at a point of time when the event generation information is received as a first level, and determine to adjust the volume of the audio signal to a second level according to the setting information.

According to an exemplary embodiment, when the event generation information is received, the controller 230 may determine the volume adjusting operation based on the setting information and the usage history information. For example, when the event generation information is received, the controller 230 may store the volume of the audio signal at the point of time when the event generation information is received as the first level, and determine to adjust the volume of the audio signal to the second level according to the setting information and the usage history information.

According to an exemplary embodiment, when the event generation information is received, the controller 230 may determine the volume adjusting operation based on the setting information and a user input. For example, when the event generation information is received, the controller 230 may store the volume of the audio signal at the point of time when the event generation information is received as the first level, and determine to adjust the volume of the audio signal to the second level according to the setting information and the user input.

According to an exemplary embodiment, when event termination information is received from the at least one mobile terminal or forced termination information is received from the user, the controller 230 may re-adjust the volume of the audio signal to the first level. According to an exemplary embodiment, when a first time (i.e., a first time duration) passed after the volume of the audio signal is adjusted to the second level is equal to or higher than a threshold time, the controller 230 may re-adjust the volume of the audio signal to the first level.

According to an exemplary embodiment, when event generation information is received from a mobile terminal that is not registered in the connection terminal list, the controller 230 may adjust the volume of the audio signal to a standard level.

The audio output unit 240 may output the audio signal according to the volume adjusting operation. The display unit 250 may display the event generation information.

Figure 70:
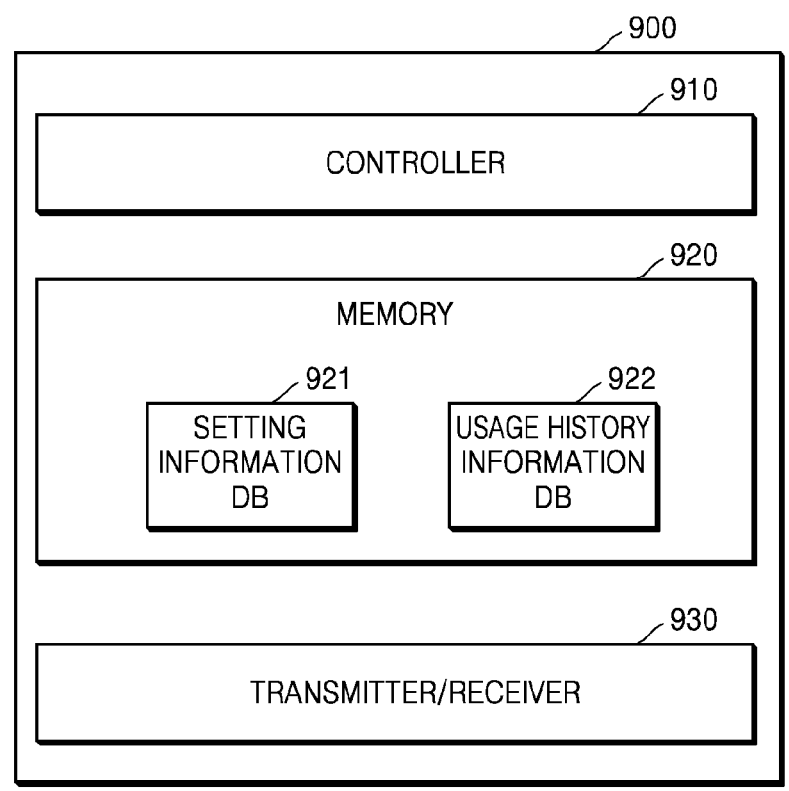
FIG. 70 is a block diagram of a server according to an exemplary embodiment.

FIG. 70 is a block diagram of the server 900 according to an exemplary embodiment.

Referring to FIG. 70, the server 900 may include a controller 910, a memory 920, and a transmitter/receiver 930. However, not all the components shown in FIG. 70 are essential. The server 900 may include more or less components than those shown in FIG. 70. The components will now be described in detail.

The controller 910 may control overall operations of the server 900. For example, the controller 910 may execute programs (or modules) stored in the memory 920 to determine a volume adjusting operation of an audio signal output from an electronic device. For example, the controller 910 may determine the volume adjusting operation based on setting information regarding adjusting of volume of the audio signal or usage history information of a mobile terminal.

The memory 920 may store programs for processes or controls of the controller 910, and store input/output data, such as the usage history information received from the mobile terminal and the setting information regarding adjusting of the volume of the audio signal. The programs stored in the memory 920 may be classified into a plurality of modules based on functions.

The transmitter/receiver 930 may include at least one component to communicate with the mobile terminal or the electronic device. For example, the transmitter/receiver 930 may receive the usage history information from the mobile terminal and transmit information about the volume adjusting operation to the electronic device.

The methods described above may be recorded on a computer-readable recording medium by being realized in computer programs executed by using various computers. The computer-readable recording medium may include at least one of a program command, a data file, and a data structure. The program commands recorded in the computer-readable recording medium may be specially designed or well known to one of ordinary skill in the computer software field. Examples of the computer-readable recording medium include read-only memory (ROM), random-access memory (RAM), CD-ROMs, magnetic tapes, floppy disks, optical data storage devices, etc. Examples of the computer command include mechanical codes prepared by a compiler, and high-level languages executable by a computer by using an interpreter.

While exemplary embodiments have been described and particularly shown above, it will be understood by those of ordinary skill in the art that various changes in form and details may be made therein without departing from the spirit and scope as defined by the following claims.

What is claimed is:

1. A method of adjusting volume of an audio signal output from an electronic device, the method comprising:
   connecting the electronic device and a mobile terminal;
   receiving, by the electronic device, at least one of setting information regarding adjusting of the volume of the audio signal and usage history information of the mobile terminal;
   receiving, by the electronic device, event generation information from the mobile terminal;
   determining, by the electronic device, a volume adjusting operation to be performed on the audio signal based on the at least one of the setting information and the usage history information, and the event generation information; and
   adjusting the volume of the audio signal according to the volume adjusting operation,
   wherein the adjusting the volume comprises:
   storing, by the electronic device, a first volume level of the audio signal at a time point when the event generation information is received;
   changing the volume of the audio signal from the first volume level to a second volume level which is lower than the first volume level; and
   outputting, by the electronic device, the audio signal according to the second volume level.

2. The method of claim 1, wherein the event generation information comprises at least one of a call reception notification, a message reception notification, and a notification from an application installed in the mobile terminal.

3. The method of claim 1, wherein the setting information comprises at least one of general volume adjusting information and individual volume adjusting information.

4. The method of claim 3, wherein the general volume adjusting information comprises information regarding an adjustment level of the volume of the audio signal in response to the electronic device receiving the event generation information regardless of a type of the mobile terminal.

5. The method of claim 3, wherein the individual volume adjusting information comprises at least one of information about whether to apply the volume adjusting operation and a situational adjustment level to be applied in the volume adjusting operation.

6. The method of claim 3, wherein the individual volume adjusting information comprises at least one of adjusting information per user of the mobile device, adjusting information per program of the electronic device, adjusting information per channel of the electronic device, adjusting information per program genre of the electronic device, adjusting information per timeslot, and adjusting information per transmitter.

7. The method of claim 6, wherein the mobile terminal comprises a plurality of mobile terminals, and the adjusting information per user comprises priority information with respect to a plurality of users respectively using the plurality of mobile terminals and the volume adjusting operation based on the priority information.

8. The method of claim 7, wherein the determining the volume adjusting operation comprises, in response to the event generation information being received, determining priority amongst the plurality of users based on the priority information of the adjusting information per user and adjusting the volume of the audio signal to a first user level corresponding to an adjustment level for a first user having a higher priority than remaining users of the plurality of users.

9. The method of claim 1, wherein the usage history information comprises at least one of a call history list, a missed call list, a blocked call list, a contact list, and a favorites list of the mobile terminal.

10. The method of claim 1, further comprising:
receiving event termination information from the mobile terminal; and
re-adjusting the volume of the audio signal to the first level in response to receiving the event termination information.

11. The method of claim 1, further comprising:
receiving forced termination information commanding to terminate the volume adjusting operation; and
re-adjusting the volume of the audio signal to the first level in response to receiving the forced termination information.

12. The method of claim 1, further comprising, in response to a duration of time that has passed after the volume of the audio signal is adjusted to the second level from the first level being greater than or equal to a threshold time, re-adjusting the volume of the audio signal to the first level.

13. The method of claim 1, further comprising displaying the event generation information, by the electronic device, based on at least one of the setting information and the usage history information.

14. The method of claim 13, further comprising receiving, by the electronic device, a user input commanding to perform the volume adjusting operation based on the displayed event generation information,
wherein the determining the volume adjusting operation comprises determining the volume adjusting operation according to the received user input.

15. The method of claim 13, wherein the receiving the event generation information comprises receiving the event generation information and at least one of identification (ID) information of the mobile terminal and transmitter information from the mobile terminal, and
wherein the displaying the event generation information further comprises displaying, by the electronic device, the at least one of the ID information and the transmitter information.

16. The method of claim 15, wherein the ID information comprises at least one of a phone number of the mobile terminal, an address assigned to the mobile terminal, a name of a user using the mobile terminal, and a nickname of the user, and
wherein the transmitter information comprises at least one of a phone number of the transmitter, a photo, a name, and a nickname of the transmitter, which are stored in the mobile terminal.

17. The method of claim 13, further comprising:
receiving a user input commanding to perform the volume adjusting operation according to the displayed event generation information; and
adjusting the volume of the audio signal according to the received user input.

18. The method of claim 1, wherein the connecting comprises:
receiving, by the electronic device, ID information from the mobile terminal; and
registering, by the electronic device, the mobile terminal in a connection terminal list by storing the received ID information.

19. The method of claim 18, wherein the ID information comprises at least one of a phone number of the mobile terminal, an address assigned to the mobile terminal, a name of a user using the mobile terminal, and a nickname of the user.

20. The method of claim 18, wherein the determining the volume adjusting operation comprises, in response to the event generation information being received from a mobile terminal that is not registered in the connection terminal list, determining to adjust the volume of the audio signal to a standard level.

21. The method of claim 20, wherein the adjusting of the volume comprises:
comparing a first level, which is the volume of the audio signal at a point of time when the event generation information is received by the electronic device, with the standard level;
in response to the first level being higher than the standard level, changing the volume of the audio signal from the first level to the standard level; and
in response to the first level being lower than or equal to the standard level, maintaining the volume of the audio signal at the first level.

22. The method of claim 1, further comprising estimating a distance between the electronic device and the mobile terminal,
wherein the determining the volume adjusting operation comprises determining the volume adjusting operation to be performed on the audio signal based on at least one of the setting information and the usage history, the event generation information, and the estimated distance.

23. The method of claim 1, wherein the connecting the electronic device and the mobile terminal comprises connecting the electronic device and the mobile terminal via Bluetooth or Wi-Fi.

24. A method of controlling, by a mobile terminal, an electronic device to adjust volume of an audio signal output from the electronic device, the method comprising:
in response to an event occurring in the mobile terminal, determining a volume adjusting operation to be performed on the audio signal of the electronic device based on usage history information of the mobile terminal;
connecting the mobile terminal and the electronic device; and
transmitting information about the volume adjusting operation and event generation information to the electronic device, wherein the information about the volume adjusting operation comprises an operation for changing the volume of the audio signal output from the electronic device from a first volume level to a second volume level, and wherein the second volume level is lower than the first volume level.

25. The method of claim 24, wherein the event generation information comprises at least one of a call reception notification in the mobile terminal, a message reception notification in the mobile terminal, and a notification from an application installed in the mobile terminal.

26. The method of claim 24, wherein the usage history information comprises at least one of a call history list, a missed call list, a blocked call list, a contact list, and a favorites list of the mobile terminal.

27. The method of claim 24, further comprising transmitting at least one of identification (ID) information of the mobile terminal and transmitter information to the electronic device.

28. The method of claim 27, wherein the ID information comprises at least one of a phone number of the mobile terminal, an address assigned to the mobile terminal, a name of a user using the mobile terminal, and a nickname of the user.

29. The method of claim 24, further comprising transmitting at least one of event termination information and information commanding to re-adjust the volume of the audio signal to the electronic device.

30. The method of claim 24, further comprising receiving setting information regarding adjusting of the volume of the audio signal,
wherein the determining the volume adjusting operation comprises determining the volume adjusting operation based on at least one of the usage history information and the setting information.

31. The method of claim 30, wherein the setting information comprises at least one of general volume adjusting information and individual volume adjusting information.

32. A method of controlling, by a server, an electronic device to adjust volume of an audio signal output from the electronic device, the method comprising:
receiving, by the server, at least one of setting information regarding adjusting of the volume of the audio signal and usage history information of a mobile terminal;
receiving, by the server, event generation information from the mobile terminal;
determining, by the server, a volume adjusting operation to be performed on the audio signal to be output from the electronic device based on at least one of the setting information and the usage history information, and the event generation information; and
transmitting, by the server, information about the volume adjusting operation to the electronic device,
wherein the information about the volume adjusting operation comprises an operation for changing the volume of the audio signal output from the electronic device from a first volume level to a second volume level, and
wherein the second volume level is lower than the first volume level.

33. An electronic device comprising:
a communicator configured to be in communication with a mobile terminal and to receive event generation information from the mobile terminal;
a memory configured to store at least one multimedia content;
a user input receiver configured to receive setting information regarding adjusting of volume of an audio signal of the at least one multimedia content; and
a controller configured to determine a volume adjusting operation to be performed on the audio signal based on the setting information and the event generation information; and
an audio outputter configured to output the audio signal according to the volume adjusting operation,
wherein the controller is further configured to store, in the memory, a first volume level of the audio signal at a time point when the event generation information is received and change the volume of the audio signal from the first volume level to a second volume level, and the audio outputter is further configured to output the audio signal according to the second volume level, and
wherein the second volume level is lower than the first volume level.

34. The electronic device of claim 33, wherein the communicator is further configured to receive usage history information from the mobile terminal, and
in response to the event generation information being received by the electronic device, the controller is configured to determine the volume adjusting operation based on the setting information and the usage history information.

35. The electronic device of claim 33, wherein the controller is configured to re-adjust the volume of the audio signal to the first level in response to event termination information being received by the electronic device from the mobile terminal or forced termination information is received by the electronic device from a user.

36. The electronic device of claim 33, wherein the controller is configured to re-adjust the volume of the audio signal to the first level in response to a time duration that has passed after the volume of the audio signal is adjusted to the second level being greater than or equal to a threshold time.

37. The electronic device of claim 33, further comprising a display configured to display the event generation information.

38. The electronic device of claim 37, wherein the user input receiver is further configured to receive a user input commanding to perform the volume adjusting operation according to the event generation information, and
wherein the controller is configured to determine the volume adjusting operation based on the setting information, the event generation information, and the user input.

39. The electronic device of claim 37, wherein the communicator is further configured to receive identification (ID) information of the mobile terminal and transmitter information from the mobile terminal, and
wherein the display is configured to display at least one of the ID information and the transmitter information, and the event generation information.

40. The electronic device of claim 33, wherein the communicator is configured to register the mobile terminal in a connection terminal list by receiving ID information from the mobile terminal and storing the received ID information.

41. The electronic device of claim 40, wherein, in response to the event generation information being received from a mobile terminal that is not registered in the connection terminal list, the controller is configured to adjust the volume of the audio signal to a standard level.

42. A mobile terminal which controls an electronic device to adjust volume of an audio signal output from the electronic device, the mobile terminal comprising:
- a controller configured to determine a volume adjusting operation to be performed on the audio signal based on usage history information of the mobile terminal in response to an event being generated; and
- a communicator configured to transmit information about the volume adjusting operation and event generation information to the electronic device,
- wherein the information about the volume adjusting operation comprises an operation for changing the volume of the audio signal output from the electronic device from a first volume level to a second volume level, and
- wherein the second volume level is lower than the first volume level.

43. The mobile terminal of claim 42, further comprising a user input receiver configured to receive setting information regarding adjusting of the volume of the audio signal,
- wherein, in response to the event being generated, the controller is configured to determine the volume adjusting operation based on at least one of the usage history information and the setting information.

44. The mobile terminal of claim 42, wherein the communicator is further configured to transmit at least one of identification (ID) information of the mobile terminal, the usage history information, and event termination information.

45. A non-transitory computer-readable recording medium having recorded thereon a program, which when executed by a computer, performs a method of adjusting volume of an audio signal output from an electronic device, the method comprising:
- connecting the electronic device and a mobile terminal;
- receiving, by the electronic device, at least one of setting information regarding adjusting of the volume of the audio signal and usage history information of the mobile terminal;
- receiving, by the electronic device, event generation information from the mobile terminal;
- determining, by the electronic device, a volume adjusting operation to be performed on the audio signal based on the at least one of the setting information and the usage history information, and the event generation information; and
- adjusting the volume of the audio signal according to the volume adjusting operation,
- wherein the adjusting the volume comprises:
  - storing, by the electronic device, a first volume level of the audio signal at a time point when the event generation information is received;
  - changing the volume of the audio signal from the first volume level to a second volume level which is lower than the first volume level; and
  - outputting, by the electronic device, the audio signal according to the second volume level.

46. A non-transitory computer-readable recording medium having recorded thereon a program, which when executed by a computer, performs a method of controlling, by a mobile terminal, at least one electronic device to adjust volume of an audio signal output from the at least one electronic device, the method comprising:
- in response to an event occurring in the mobile terminal, determining a volume adjusting operation to be performed on the audio signal of the electronic device based on usage history information of the mobile terminal;
- connecting the mobile terminal and the electronic device; and
- transmitting information about the volume adjusting operation and event generation information to the electronic device,
- wherein the information about the volume adjusting operation comprises an operation for changing the volume of the audio signal output from the electronic device from a first volume level to a second volume level, and
- wherein the second volume level is lower than the first volume level.

\* \* \* \* \*